US011195913B2

(12) United States Patent
Van Dal et al.

(10) Patent No.: US 11,195,913 B2
(45) Date of Patent: Dec. 7, 2021

(54) SEMICONDUCTOR DEVICE INCLUDING FIN STRUCTURE AND MANUFACTURING METHOD THEREOF

(71) Applicant: TAIWAN SEMICONDUCTOR MANUFACTURING CO., LTD., Hsinchu (TW)

(72) Inventors: Mark Van Dal, Linden (BE); Gerben Doornbos, Kessel-Lo (BE); Chung-Te Lin, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/826,913

(22) Filed: Mar. 23, 2020

(65) Prior Publication Data
US 2020/0219973 A1 Jul. 9, 2020

Related U.S. Application Data

(63) Continuation of application No. 15/613,339, filed on Jun. 5, 2017, now Pat. No. 10,756,174.
(Continued)

(51) Int. Cl.
*H01L 21/82* (2006.01)
*H01L 27/092* (2006.01)
(Continued)

(52) U.S. Cl.
CPC .......... *H01L 29/0673* (2013.01); *B82Y 10/00* (2013.01); *H01L 21/02236* (2013.01);
(Continued)

(58) Field of Classification Search
CPC ............ H01L 21/8221; H01L 27/0688; H01L 27/0924; H01L 29/0653; H01L 29/401;
(Continued)

(56) References Cited

U.S. PATENT DOCUMENTS 9,484,406 B1 11/2016 Sun et al.
9,653,289 B1 5/2017 Balakrishnan et al.
(Continued)

OTHER PUBLICATIONS

Kelin J. Kuhn, "Considerations for Ultimate CMOS Scaling", IEEE, vol. 59, No. 7, May 16, 2012.

*Primary Examiner* — Didarul A Mazumder
(74) *Attorney, Agent, or Firm* — Birch, Stewart, Kolasch & Birch, LLP

(57) ABSTRACT

Semiconductor structures and methods for forming the same are provided. The method includes forming a fin structure over a substrate, and the fin structure includes alternately stacked semiconductor material layers and sacrificial layers. The method further includes forming a dummy gate structure, recessing the fin structure to form an opening, forming first source/drain spacers on sidewalls of the sacrificial layers by performing a first atomic layer deposition (ALD) process, and forming source/drain structure in the opening. The method further includes removing the dummy gate structure and the sacrificial layers to expose the semiconductor material layers and forming a gate structure wrapping around the semiconductor material layers.

20 Claims, 73 Drawing Sheets

Related U.S. Application Data

(60) Provisional application No. 62/490,040, filed on Apr. 26, 2017.

(51) Int. Cl.

| | | |
|---|---|---|
| *H01L 29/78* | (2006.01) | |
| *H01L 29/06* | (2006.01) | |
| *H01L 29/10* | (2006.01) | |
| *H01L 29/66* | (2006.01) | |
| *H01L 29/423* | (2006.01) | |
| *H01L 29/417* | (2006.01) | |
| *H01L 27/06* | (2006.01) | |
| *H01L 21/8238* | (2006.01) | |
| *H01L 21/822* | (2006.01) | |
| *H01L 29/40* | (2006.01) | |
| *H01L 29/08* | (2006.01) | |
| *H01L 29/786* | (2006.01) | |
| *B82Y 10/00* | (2011.01) | |
| *H01L 29/775* | (2006.01) | |
| *H01L 21/02* | (2006.01) | |

(52) U.S. Cl.
CPC .. *H01L 21/8221* (2013.01); *H01L 21/823807* (2013.01); *H01L 21/823821* (2013.01); *H01L 27/0688* (2013.01); *H01L 27/0924* (2013.01); *H01L 29/0653* (2013.01); *H01L 29/0847* (2013.01); *H01L 29/1037* (2013.01); *H01L 29/401* (2013.01); *H01L 29/41725* (2013.01); *H01L 29/42376* (2013.01); *H01L 29/42392* (2013.01); *H01L 29/6681* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/785* (2013.01); *H01L 29/78618* (2013.01); *H01L 29/78654* (2013.01); *H01L 29/78684* (2013.01); *H01L 29/78696* (2013.01)

(58) Field of Classification Search
CPC ......... H01L 29/42392; H01L 29/66545; H01L 29/6681; H01L 29/785; H01L 29/78696
USPC .......................... 257/347; 438/149, 479, 517
See application file for complete search history.

(56) References Cited

U.S. PATENT DOCUMENTS

| | | | |
|---|---|---|---|
| 2013/0109148 A1* | 5/2013 | Oh | ......................... H01L 45/148 438/382 |
| 2014/0151639 A1* | 6/2014 | Chang | ................. H01L 27/1211 257/27 |
| 2014/0264604 A1 | 9/2014 | Tsai et al. | |
| 2015/0340457 A1 | 11/2015 | Xie et al. | |
| 2015/0372104 A1 | 12/2015 | Liu et al. | |
| 2016/0204277 A1 | 7/2016 | Yang et al. | |
| 2016/0240613 A1 | 8/2016 | Cheng et al. | |
| 2017/0005180 A1 | 1/2017 | Cheng et al. | |
| 2017/0110554 A1* | 4/2017 | Tak | ................... H01L 29/42392 |
| 2017/0200738 A1 | 7/2017 | Kim et al. | |
| 2017/0221708 A1* | 8/2017 | Bergendahl | ............. H01L 29/16 |
| 2017/0221992 A1* | 8/2017 | Chang | ................. H01L 27/1203 |
| 2018/0090624 A1 | 3/2018 | Cheng et al. | |
| 2018/0114834 A1 | 4/2018 | Cheng et al. | |
| 2018/0145176 A1 | 5/2018 | Wei et al. | |
| 2018/0175167 A1 | 6/2018 | Rehob et al. | |
| 2018/0190829 A1 | 7/2018 | Song et al. | |

* cited by examiner

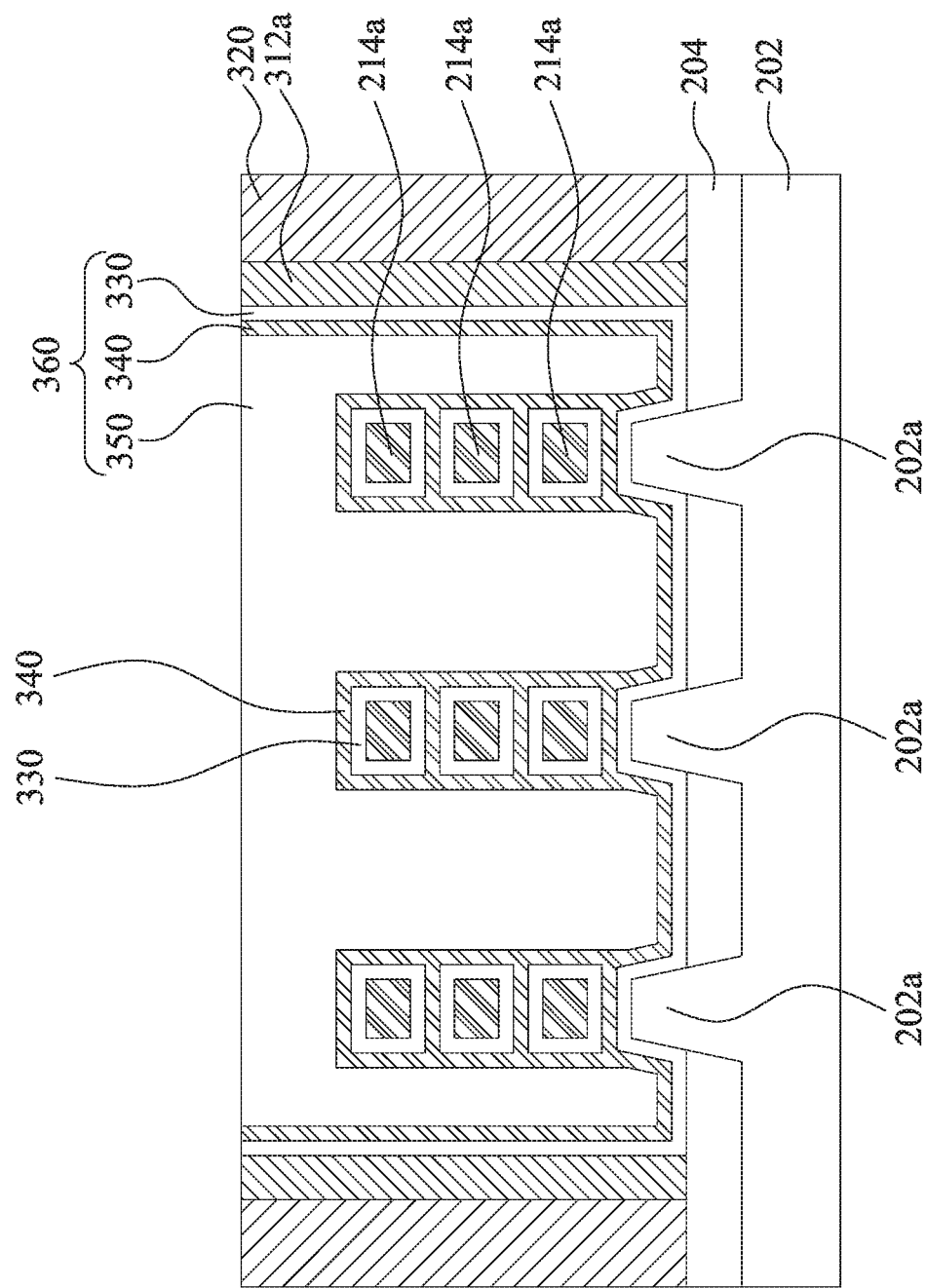

SEMICONDUCTOR DEVICE INCLUDING FIN STRUCTURE AND MANUFACTURING METHOD THEREOF

PRIORITY CLAIM AND CROSS-REFERENCE

This application is a Continuation application of U.S. patent application Ser. No. 15/613,339, filed on Jun. 5, 2017, the entire of which is incorporated by reference herein. The U.S. patent application Ser. No. 15/613,339 claims priority to U.S. Provisional Application Ser. No. 62/490,040, filed Apr. 26, 2017, which is herein incorporated by reference.

BACKGROUND

Semiconductor nanowires are becoming a research focus in nanotechnology. Various methods of forming metal-oxide-semiconductor field-effect transistors (MOSFETs) comprising nanowires have been explored, including the use of dual material nanowire, where different material nanowires are used for N-channel field-effect transistor (NFET) and P-channel field-effect transistor (PFET) devices. For example, silicon (Si) nanowires may be used as the channel material for the NFET devices, while silicon germanium (SiGe) nanowires may be used as the channel material for the PFET devices. As another example, multiple-stacked ("multi-stack") nanowires have been used in forming NFET and PFET devices, increasing the current carrying capability of these devices. One of the multi-stack candidates is the FET. A trigate FET device consists of a vertical standing Si body (fin) and the gate is wrapped around either side creating two channels on the sides and one on the top. High-aspect-ratio trigate FETs with aggressively scaled fin widths (30 nm and narrower) are of particular interest as they combine excellent short channel effect (SCE) immunity with high drivability per unit chip area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-15A are top views of a local semiconductor device at various stages of fabrication in accordance with some embodiments of the present disclosure;

FIGS. 1B-15B are cross-sectional views along sections A-A in FIGS. 1A-15A respectively;

FIGS. 1C-15C are cross-sectional views along sections B-B in FIGS. 1A-15A respectively;

FIGS. 16A-23A are top views of another local semiconductor device at various stages of fabrication in accordance with some embodiments of the present disclosure;

FIGS. 16B-23B are cross-sectional views along sections A-A in FIGS. 1A-23A respectively;

FIGS. 16C-23C are cross-sectional views along sections B-B in FIGS. 1A-23A respectively.

DETAILED DESCRIPTION

Figure 1A:
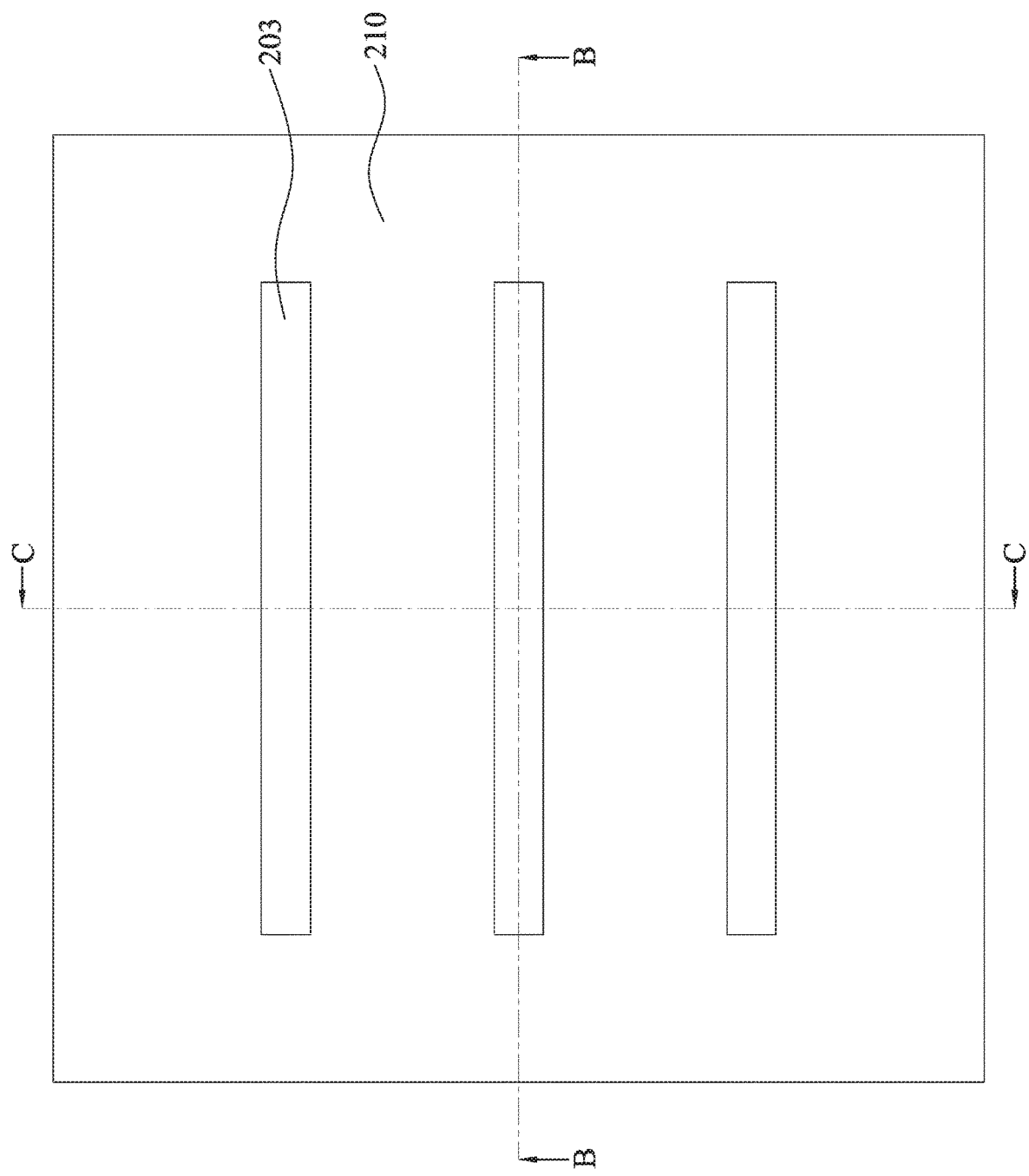

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the singular forms "a," "an" and "the" include plural referents unless the context clearly dictates otherwise. Therefore, reference to, for example, a gate stack includes aspects having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A multi-stack structure, such as Ge/SiGe or Si/SiGe may be used to generate multi-stack nanowire devices. Such multi-stack nanowire devices may include one or more PFET devices and one or more NFET devices, where the PFET devices include Ge nanowire and the NFET devices comprise Si nanowire. However, it is difficult to reduce parasitic capacitance between source/drain and gate under such multi-stack nanowire devices. Illustrative embodiments described herein utilize a dual nanowire release scheme for gate and source/drain region.

An illustrative embodiment for forming a multi-stack nanowire FET device will be described below with reference to FIGS. 1A-15E. The structures illustrate operations which may be used in the process of forming a multi-stack nanowire FET device. FIGS. 1A-15A are top views of a local semiconductor device 100 at various stages of fabrication in accordance with some embodiments of the present disclosure. FIGS. 1B-15B are cross-sectional views along lines A-A in FIGS. 1A-15A respectively. FIGS. 1C-15C are cross-sectional views along lines B-B in FIGS. 1A-15A respectively. FIGS. 15D and 15E are cross-sectional views along line D-D and line E-E in FIG. 15A respectively.

Figure 1B:
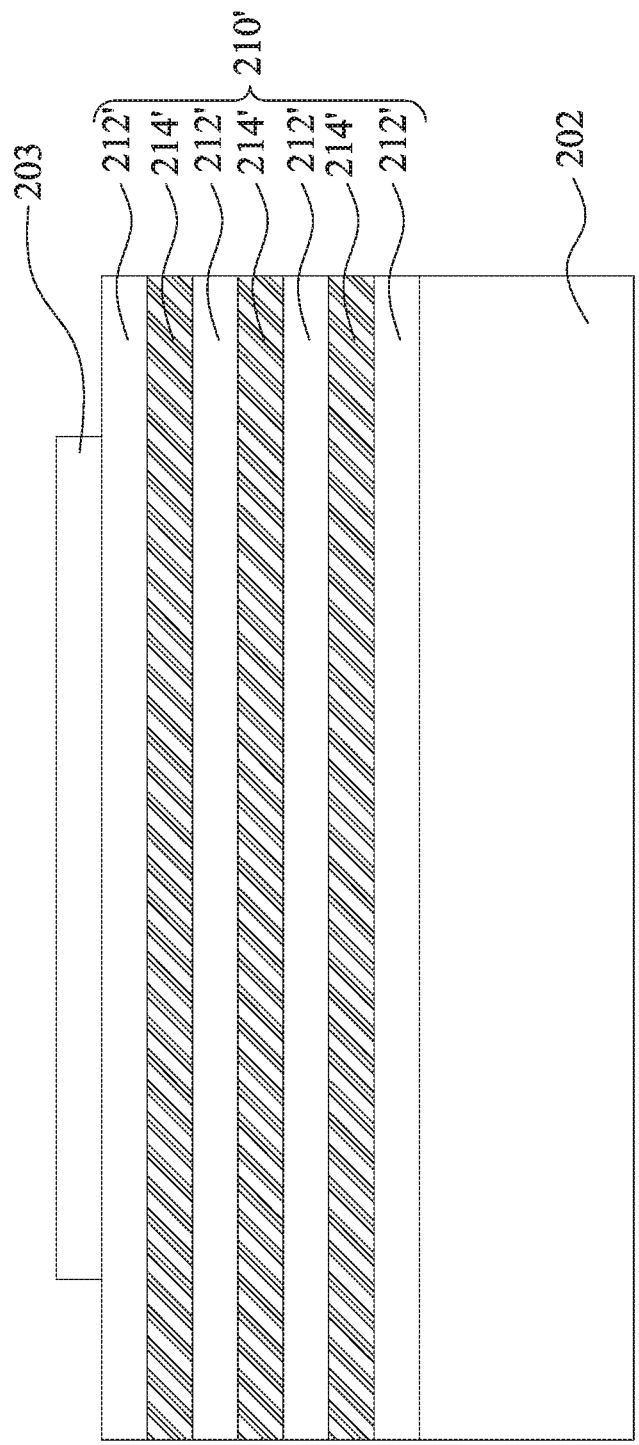
Figure 1C:
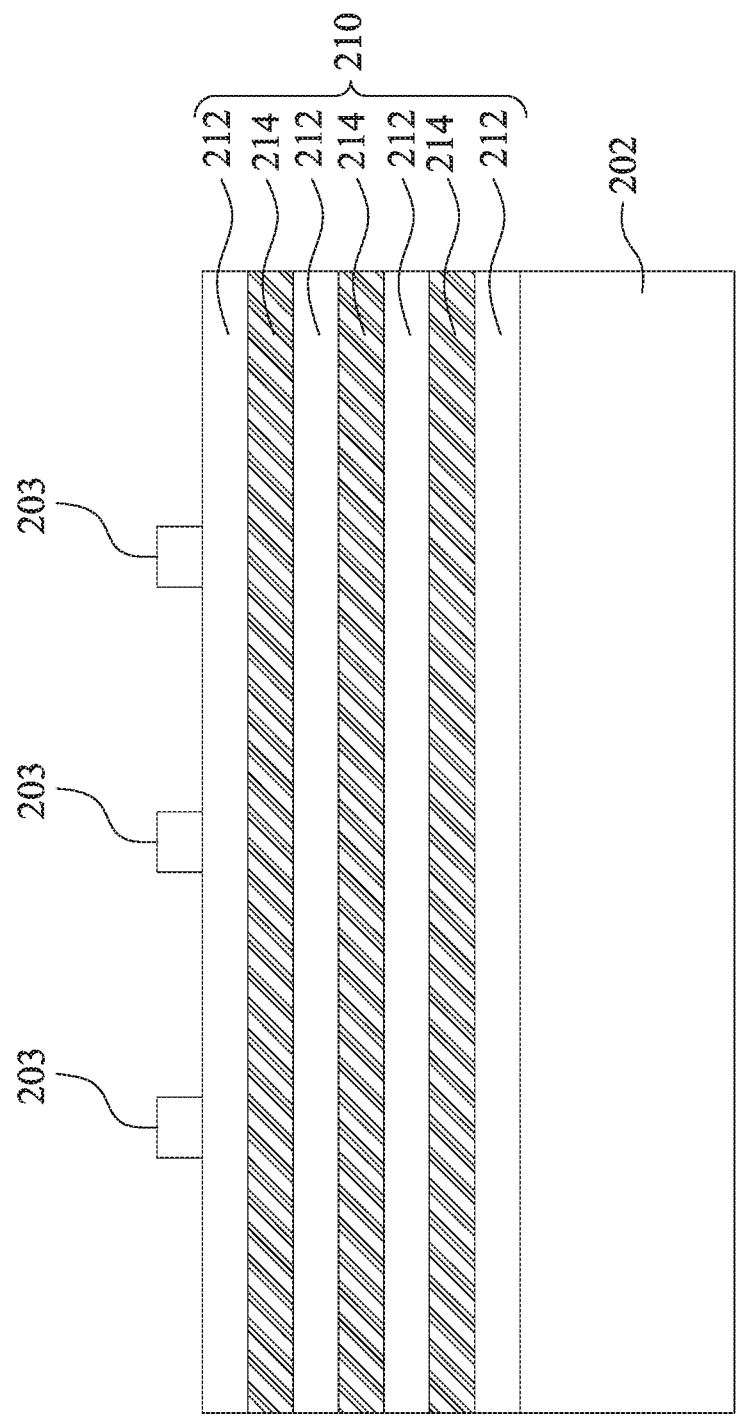

Reference is made to FIGS. 1A-1C. A semiconductor substrate 202 is provided, and a multilayer stack 210' and a hard mask 203 are formed on the semiconductor substrate 202. In some embodiments for NMOS, the semiconductor substrate 202 is made of a material, such as, Si, Ge, SiGe, In(Ga)As, or InSb. In some embodiments for PMOS, the semiconductor substrate 202 is made of a material, such as, Si, Ge, or (In)GaSb. The multilayer stack 210 includes sacrificial layers 212' and nanowire layers 214'. The sacrificial layers 212' and the nanowire layers 214' are stacked alternatively. For example, the nanowire 214' is interposed in between two sacrificial layers 212'. In some embodiments, the sacrificial layers 212' may include SiGe or Si, and the nanowires 214' may include Si, SiGe, Ge, GaAs, InAs, InSb, and GaSb, and the instant disclosure is not limited thereto. The nanowire layers 214' may use the same material as the semiconductor substrate 202. The number of layers (sacrificial layer 212' and nanowire layer 214') in the multilayer stack 210 determines the number of nanowires in a fin after patterning. FIGS. 1A-1C show a multilayer stack 210 having four sacrificial layers 212' and three nanowire layers 214'. In this case, three nanowires are formed later, and the instant disclosure is not limited thereto. The thickness of the sacrificial layers 212' also determines the pitch between the nanowires, and the thickness of the nanowire layers 214' determines the dimension of the nanowires. The hard mask 203 is formed over a portion of the topmost sacrificial layer 212', and may be selectively removed in the areas in which a FET stacked nanowire device is to be formed. Although the resulting hard mask 203 shown in FIGS. 1A-1C is patterned into three strips with equal spacing, embodiments are not so limited. The resulting hard mask 203 may be in four, five, six or more strips, and the spacing between the strips may be varied in other embodiments. The hard mask 203 may be an oxide or nitride, for example, $SiO_2$ and $Si_3N_4$, and the instant disclosure is not limited thereto.

Figure 2A:
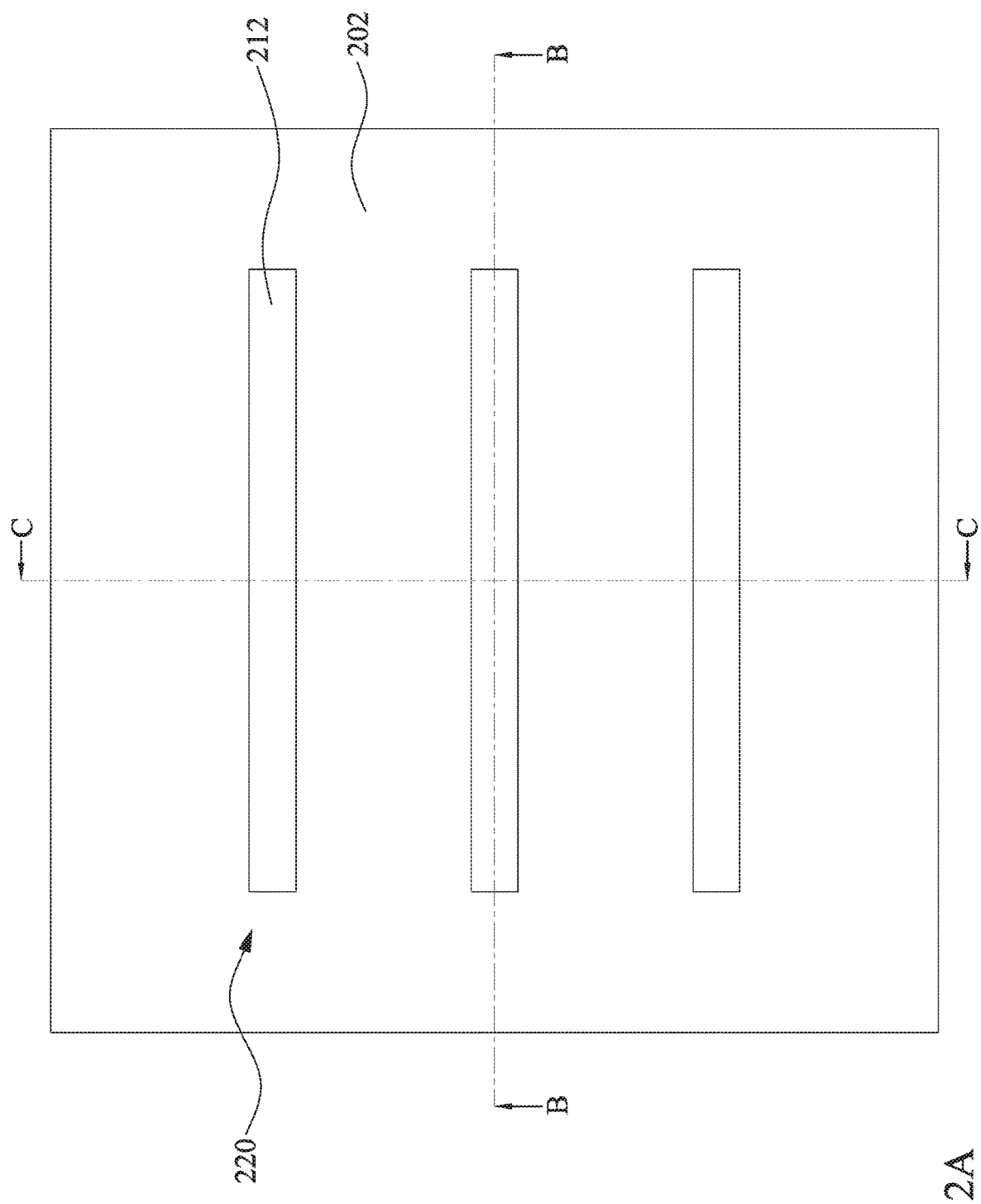
Figure 2B:
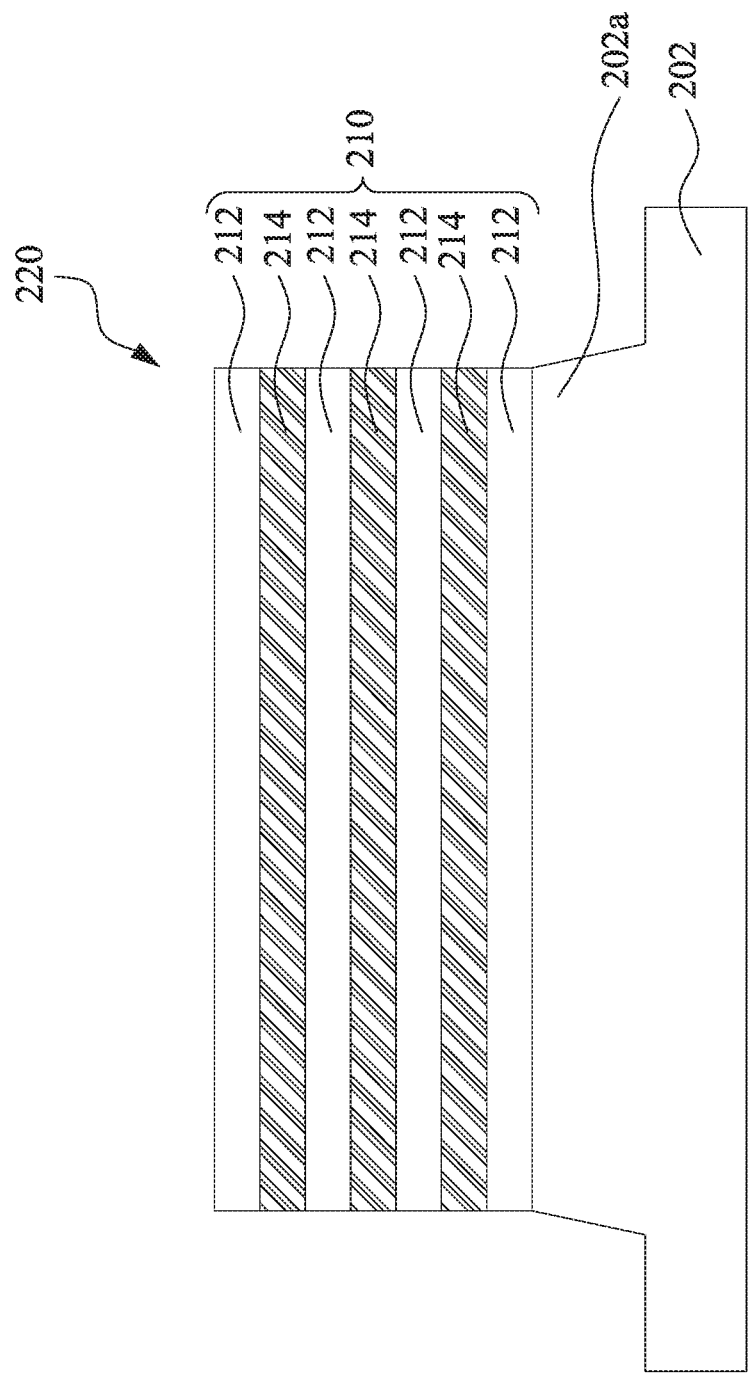
Figure 2C:
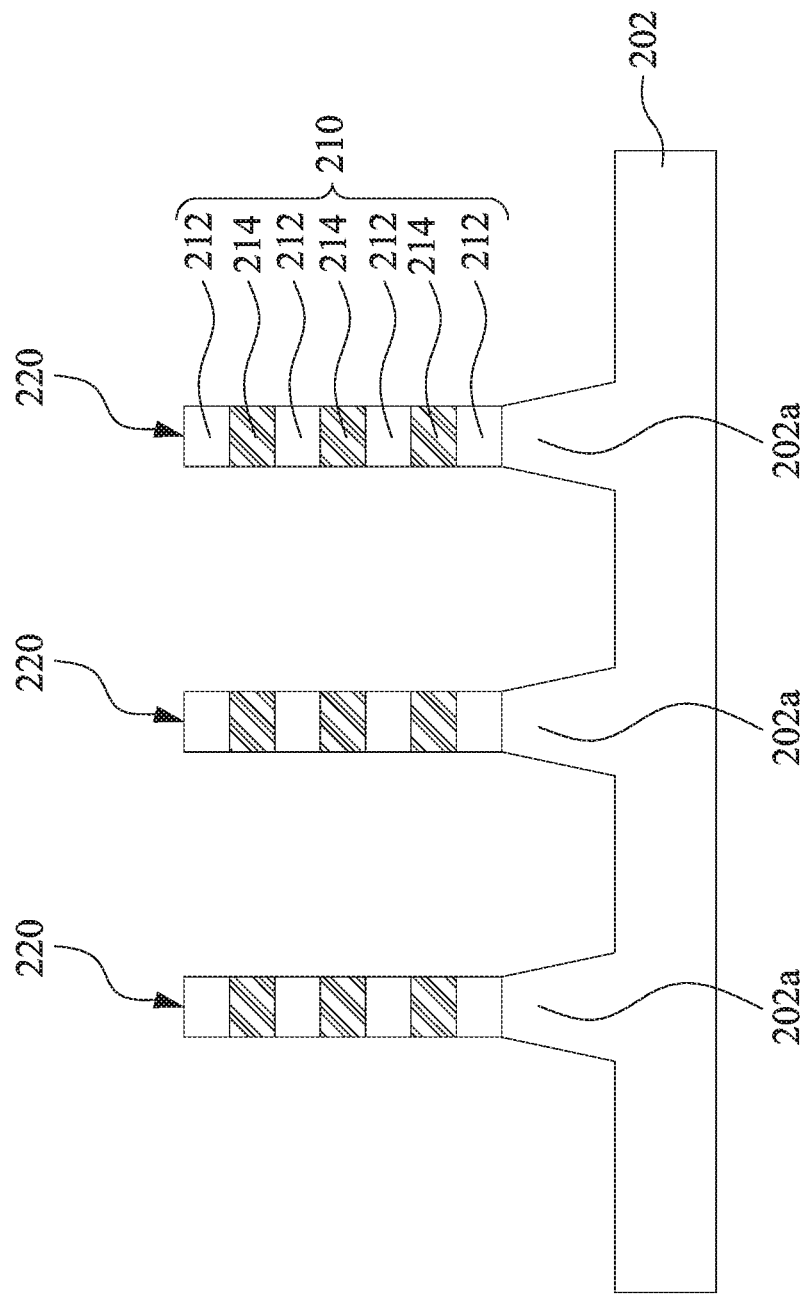

Reference is made to FIGS. 2A-2C. The multilayer stack 210' of FIG. 1 is patterned to form fins 220 (the multilayer stack 210). The fins 220 result from the hard mask 203 (shown in FIGS. 1A-1C) formed over a portion of the topmost sacrificial layer 212. The multilayer stack 210 includes a plurality of sacrificial layers 212 and a plurality of nanowires 214. When the multilayer stack 210 is patterned, a portion of the underlying semiconductor substrate 202 is also removed. The fins 220 include protruded portions 202a of the semiconductor substrate 202. Then, the hard mask 203 is removed from the top sacrificial layer 212 as shown in FIGS. 2A-2C.

Figure 3A:
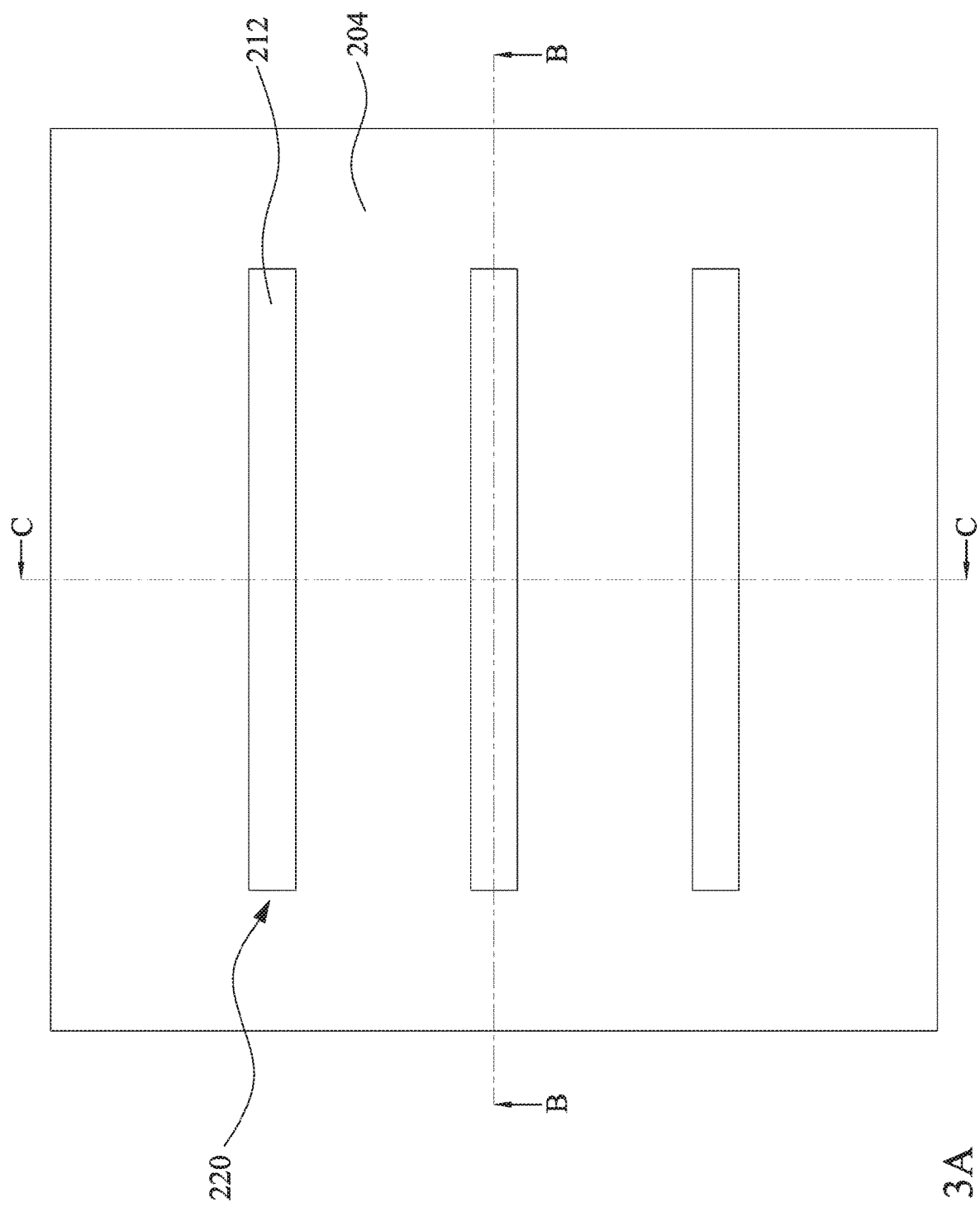
Figure 3B:
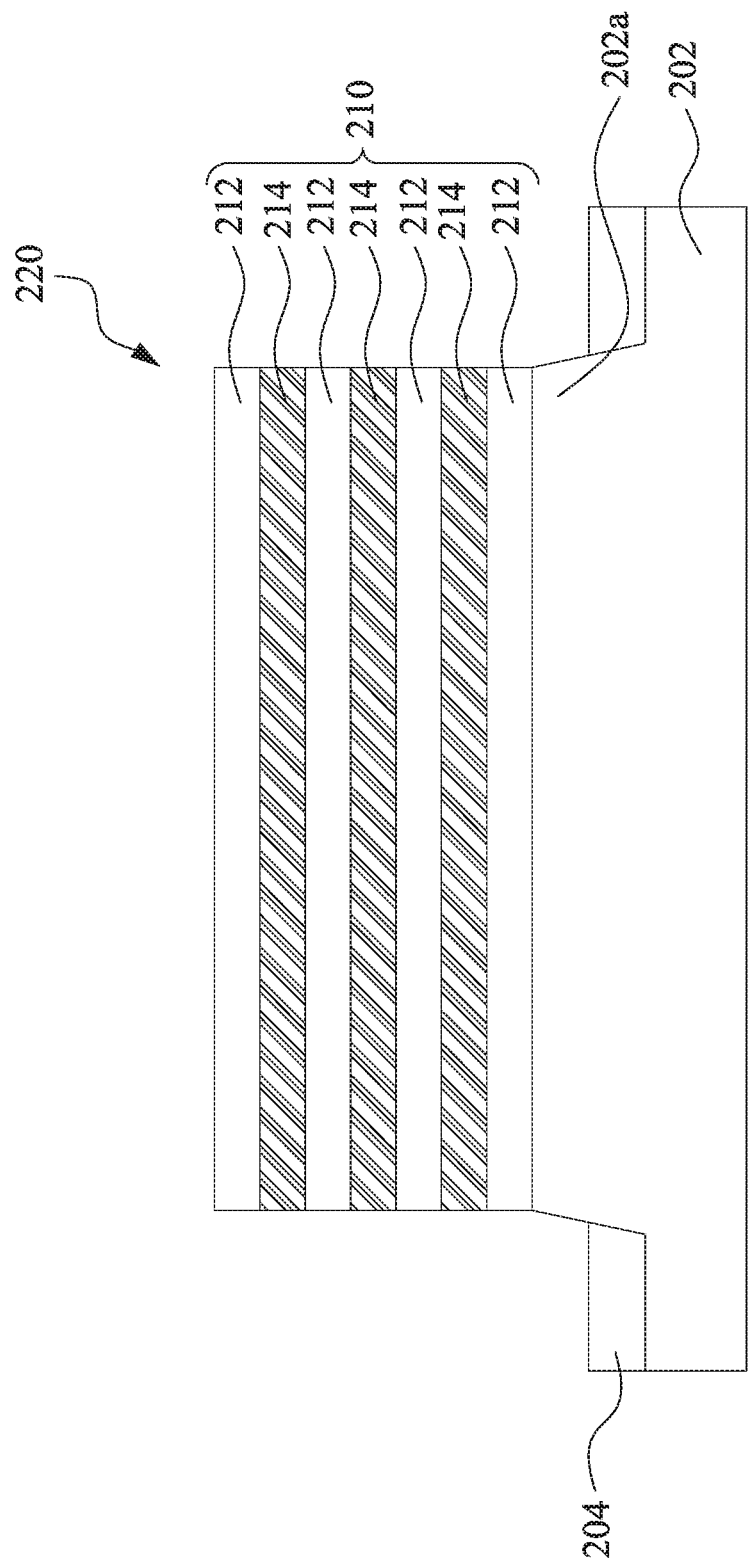
Figure 3C:
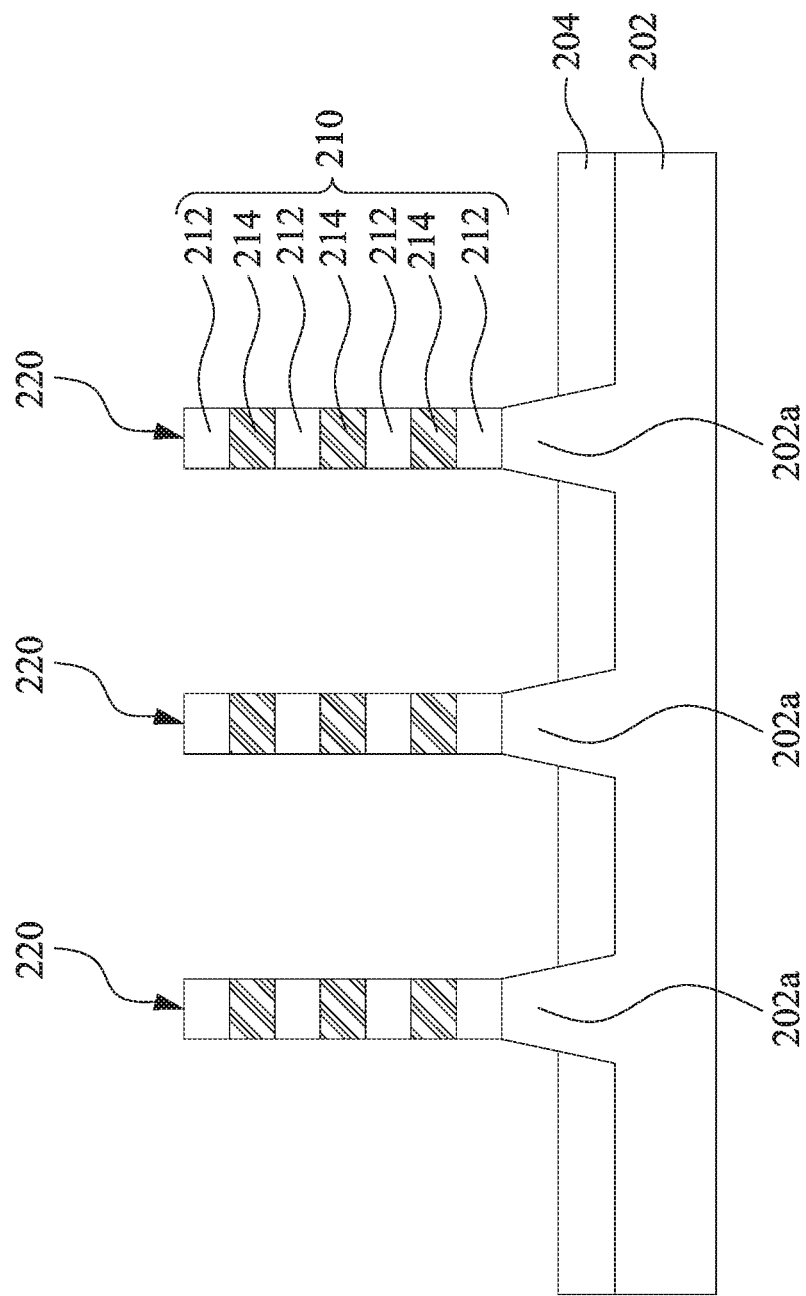

Reference is made to FIGS. 3A-3C. After the forming of the fins 220, an isolation material is deposited to form isolation structures 204 at least in the spaces between the fins 220. An anisotropic etch is used to recess the isolation material into the semiconductor substrate 202 at the base of the fins 220. The fins 220 are exposed above the isolation structures 204. A top portion of the protruded portion 202a of the semiconductor substrate 202 is not covered by the isolation structures 204. As shown in FIGS. 3B and 3C, from the top surface of the isolation structures 204, a total of four sacrificial layers 212 and three nanowires 214 are exposed. The sacrificial layer 212 now caps the fins 220.

Figure 4A:
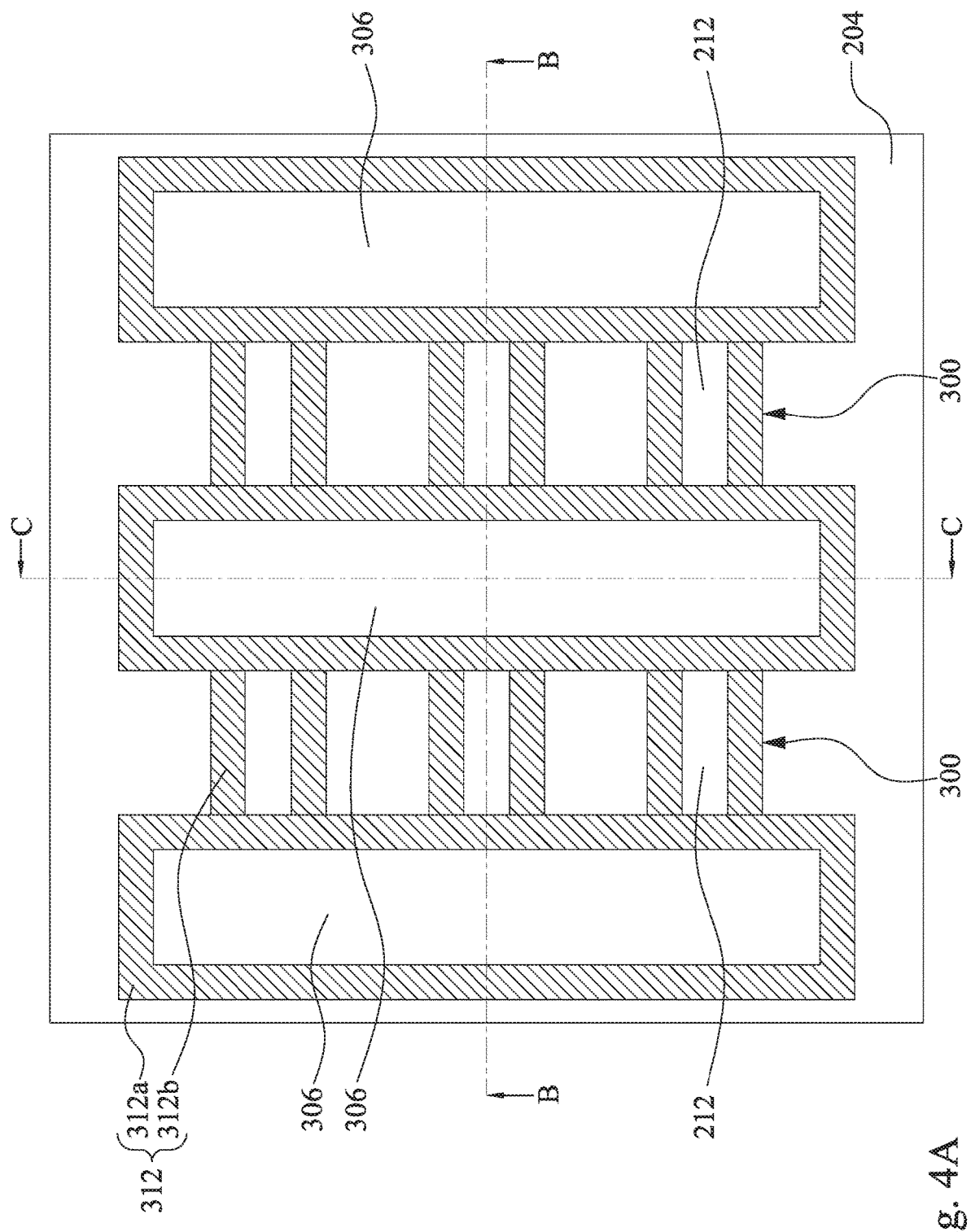
Figure 4B:
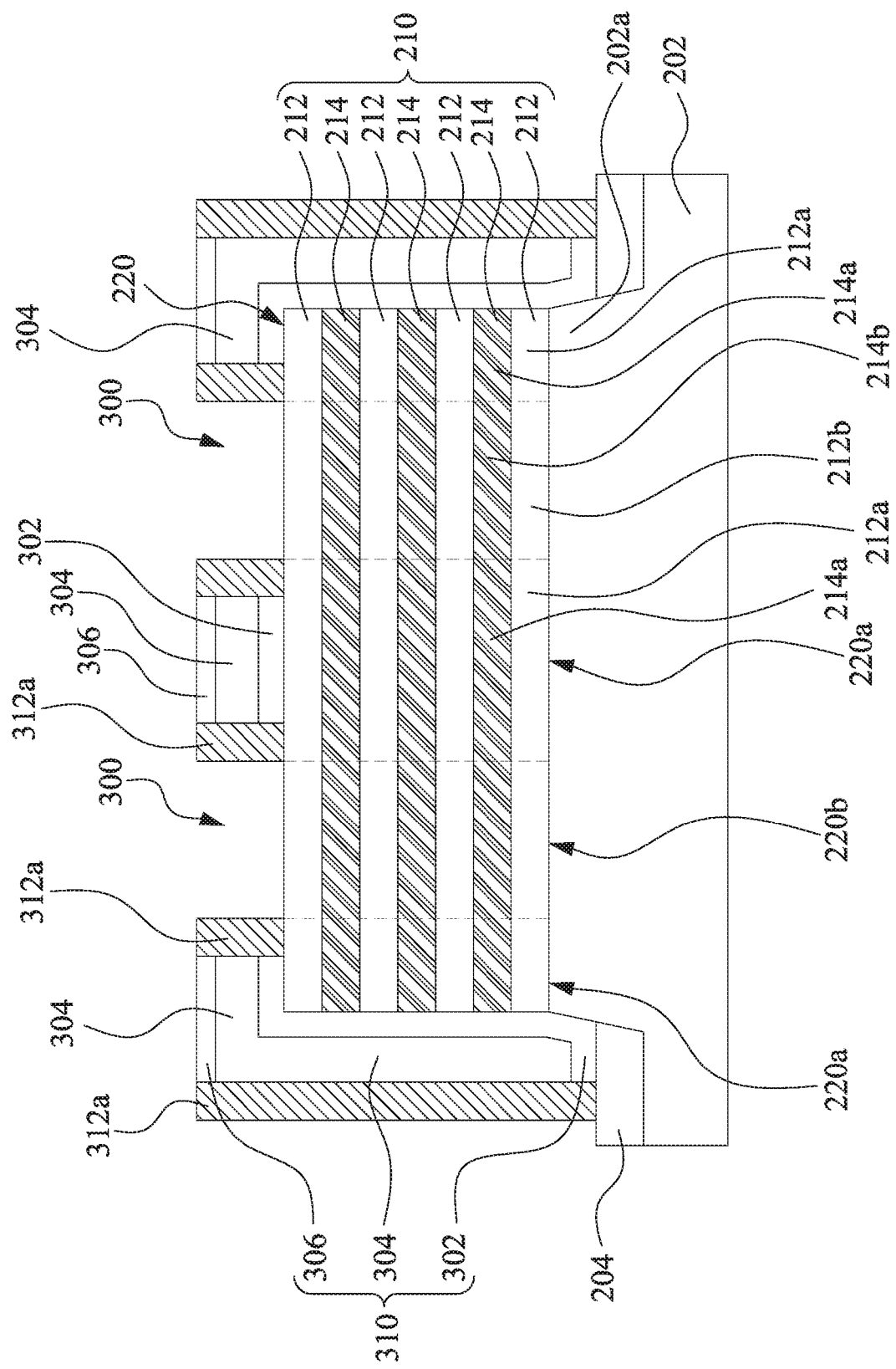
Figure 4C:
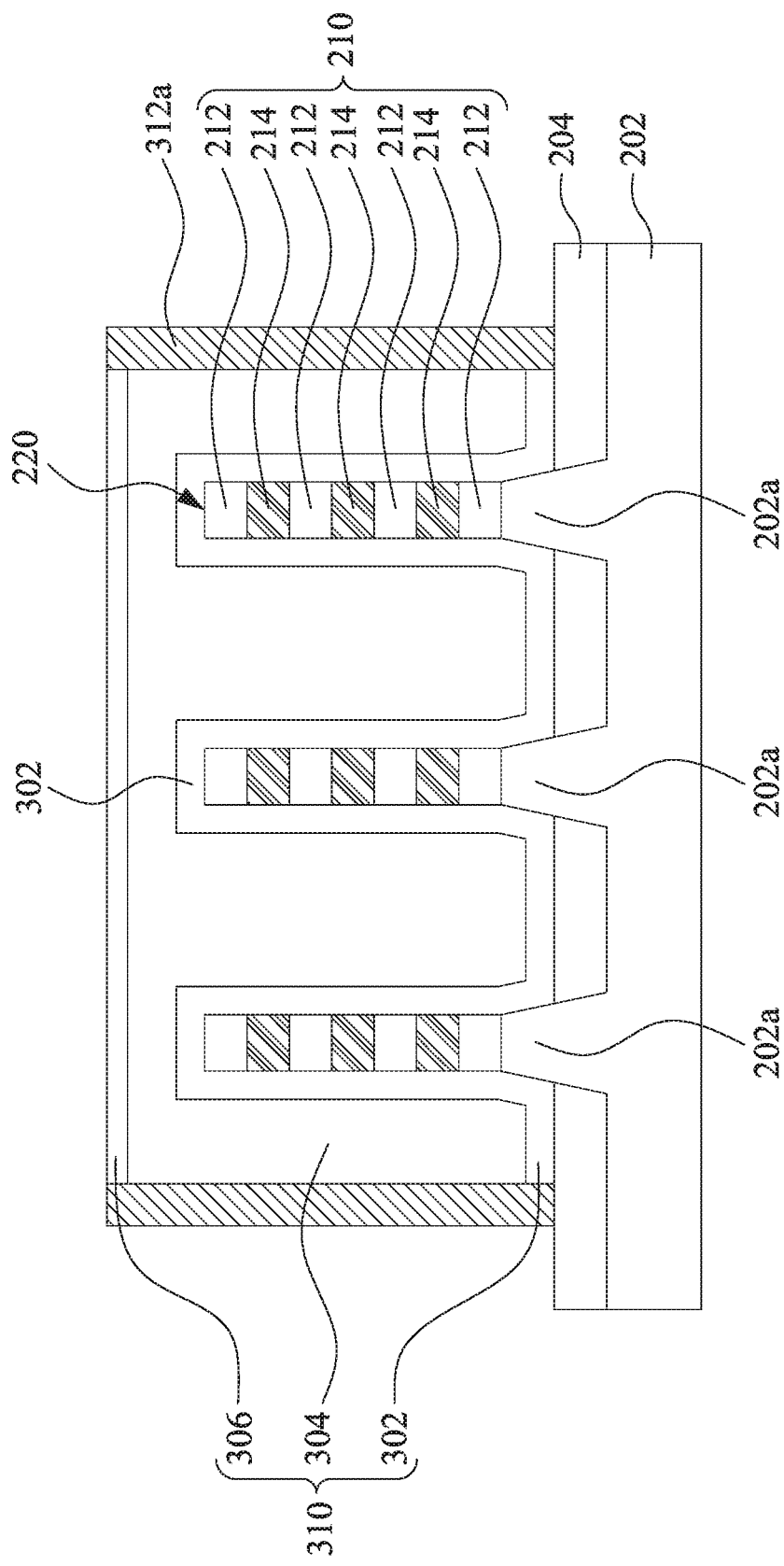

Reference is made to FIGS. 4A-4C. In FIGS. 4A and 4B, for example, three rows of dummy gate structures 310 (in the positions of hard masks 306 shown in top view in FIG. 4A) are formed across the fins 220. That is, the fins 220 go along a first direction and the dummy gate structures 310 go along a second direction. The first and second directions are different, and substantially perpendicular to each other in some embodiments. The term "substantially" as used herein may be applied to modify any quantitative representation which could permissibly vary without resulting in a change in the basic function to which it is related. At least one of the fins 220 has channel regions 220a and source/drain regions 220b. The dummy gate structures 310 define the channel regions 220a and the source/drain regions 220b of the fins 220. The dummy gate structures 310 are straddle and disposed on the fins 220 to form channel regions 220a below it, and the source/drain regions 220b of the fins 220 are exposed from the dummy gate structures 310. The sacrificial layers 212 and the nanowires 214 in the channel regions 220a are also referred to as first portions 212a and 214a respectively, and that in the source/drain regions 220b are referred to as second portions 212b and 214b respectively. At least one of the dummy gate structures 310 may include a gate dielectric layer 302, a dummy gate electrode layer 304, and a hard mask 306, and other materials may also be used. The channel regions 220a are covered by the gate dielectric layer 302, the dummy gate electrode layer 304, and the hard mask 306. In some embodiments, the dummy gate structures 310 are deposited as a blanket layer and then patterned. As shown in FIGS. 4A and 4B, the dummy gate structures 310 at either ends of the fins 220 anchor the fins 220, and therefore the anchoring dummy gate structures 310 have portions over the fins 220 and the remaining portion touches down to the isolation structures 204. In some embodiments, the gate dielectric layer 302 may be made of, such as, $SiO_2$, the dummy gate electrode layer 304 may be made of, such as, polysilicon, and the hard mask 306 may be made of, such as, oxide and/or nitride materials, but the instant disclosure is not limited thereto.

After the deposition of the dummy gate structures 310, spacers 312 are formed on sides of the dummy gate structures 310 and on the sidewalls of the fins 220 exposed from the dummy gate structures 310 (see FIG. 4A), and spaces 300 are left between the spacers 312. Specifically, the spacers 312 are formed by depositing a spacer layer (such as oxide or nitride) conformally on the fins 220 and the dummy gate structures 310, and then anisotropically etching from the surface of the spacer layer. The etching process removes spacer layer on the top portion of the dummy gate structures 310 and on the top portion of the fins 220 exposed from the dummy gate structures 310. In the case, the spacers 312 formed on the side walls of dummy gate structures 310 can be referred to as gate spacers 312a, and that formed on the sidewalk of fins 220 exposed from the dummy gate 310 can be referred to as fin spacers 312b.

As shown in FIG. 4B, the dummy gate structures 310 are used as a mask where the channel regions 220a are located. In other words, the channel regions 220a of the fins 220 (i.e., the first portions 214a of the nanowires 214) are under the protection of the dummy gate structures 310.

Figure 5A:
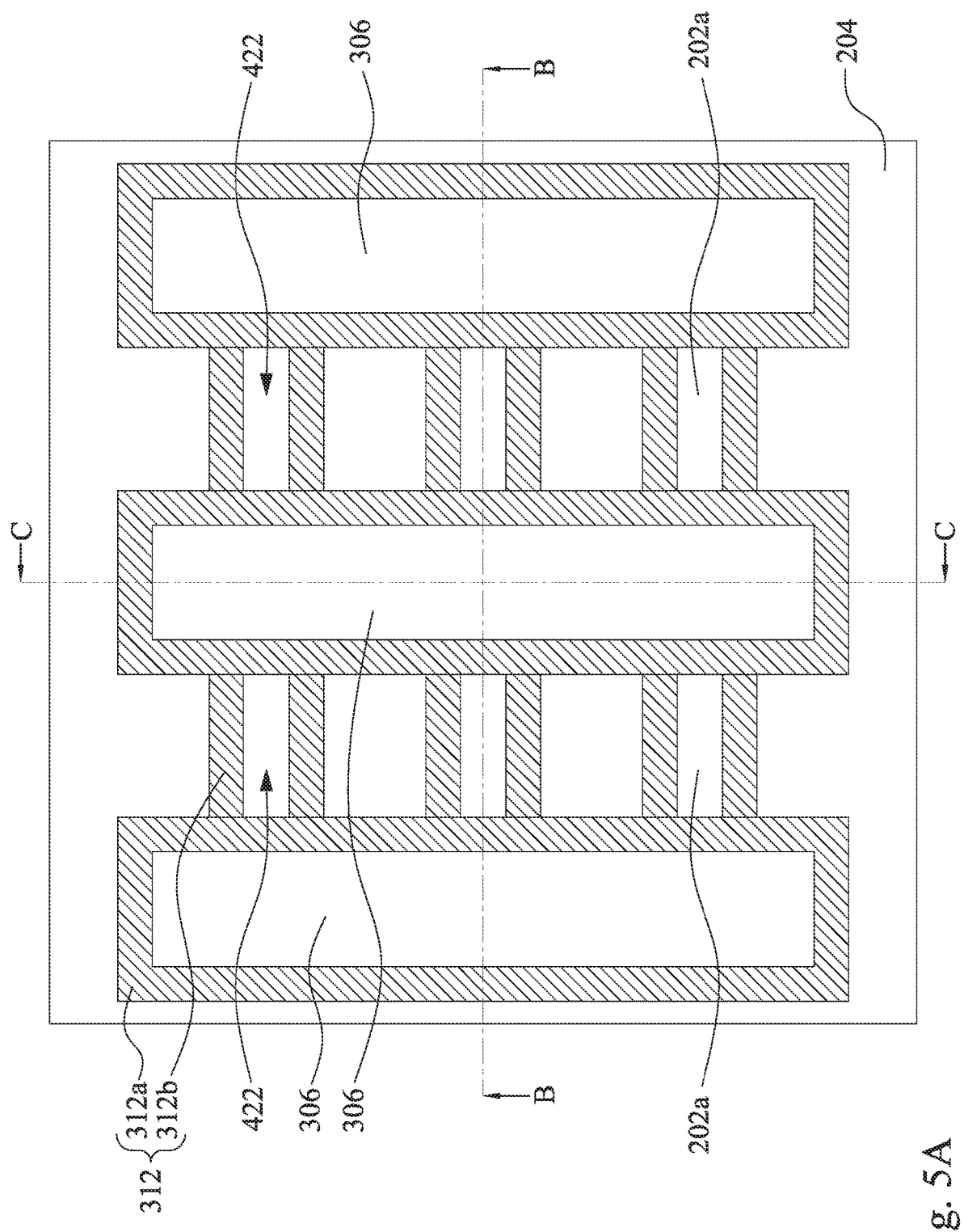
Figure 5B:
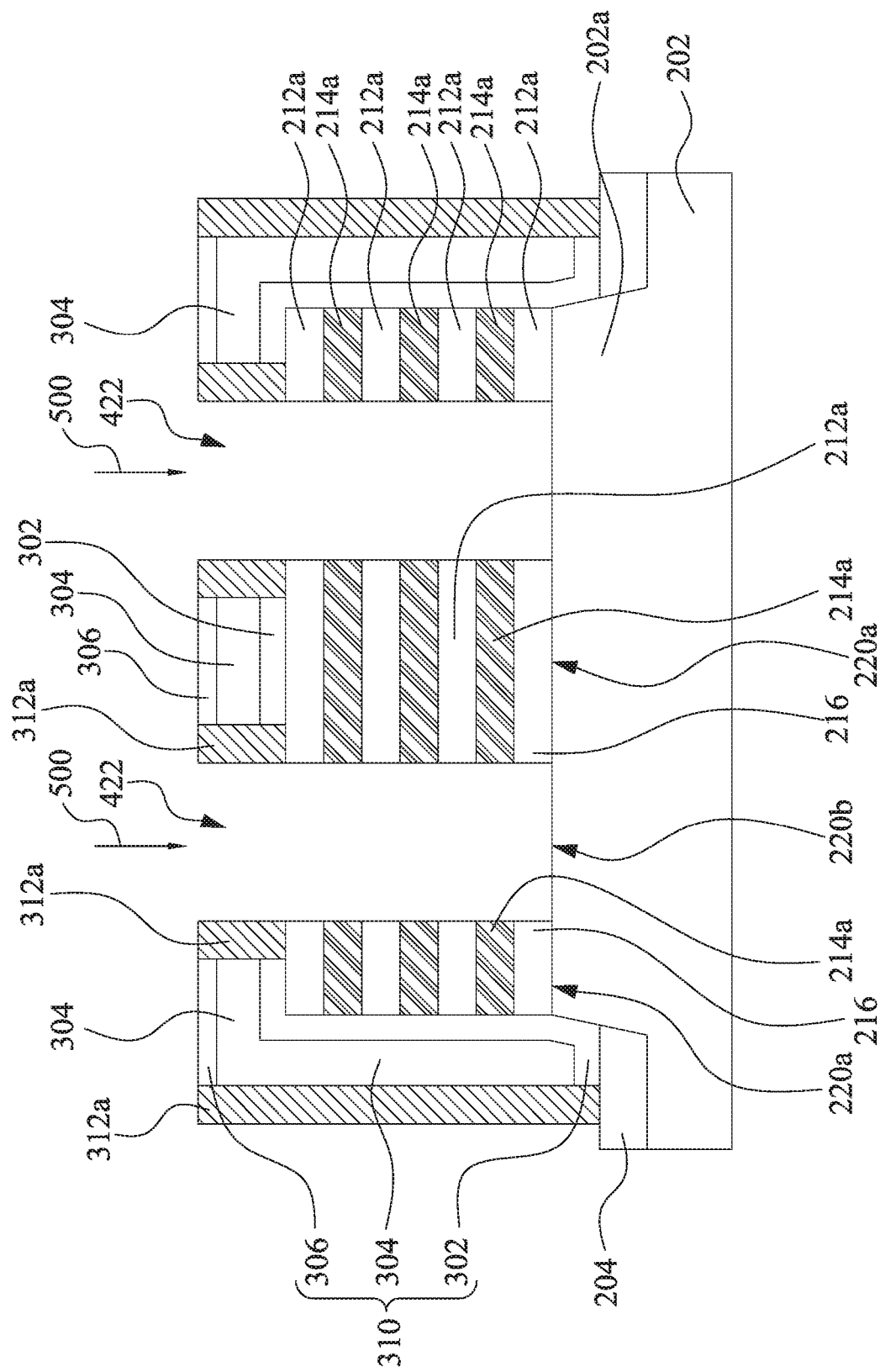
Figure 5C:
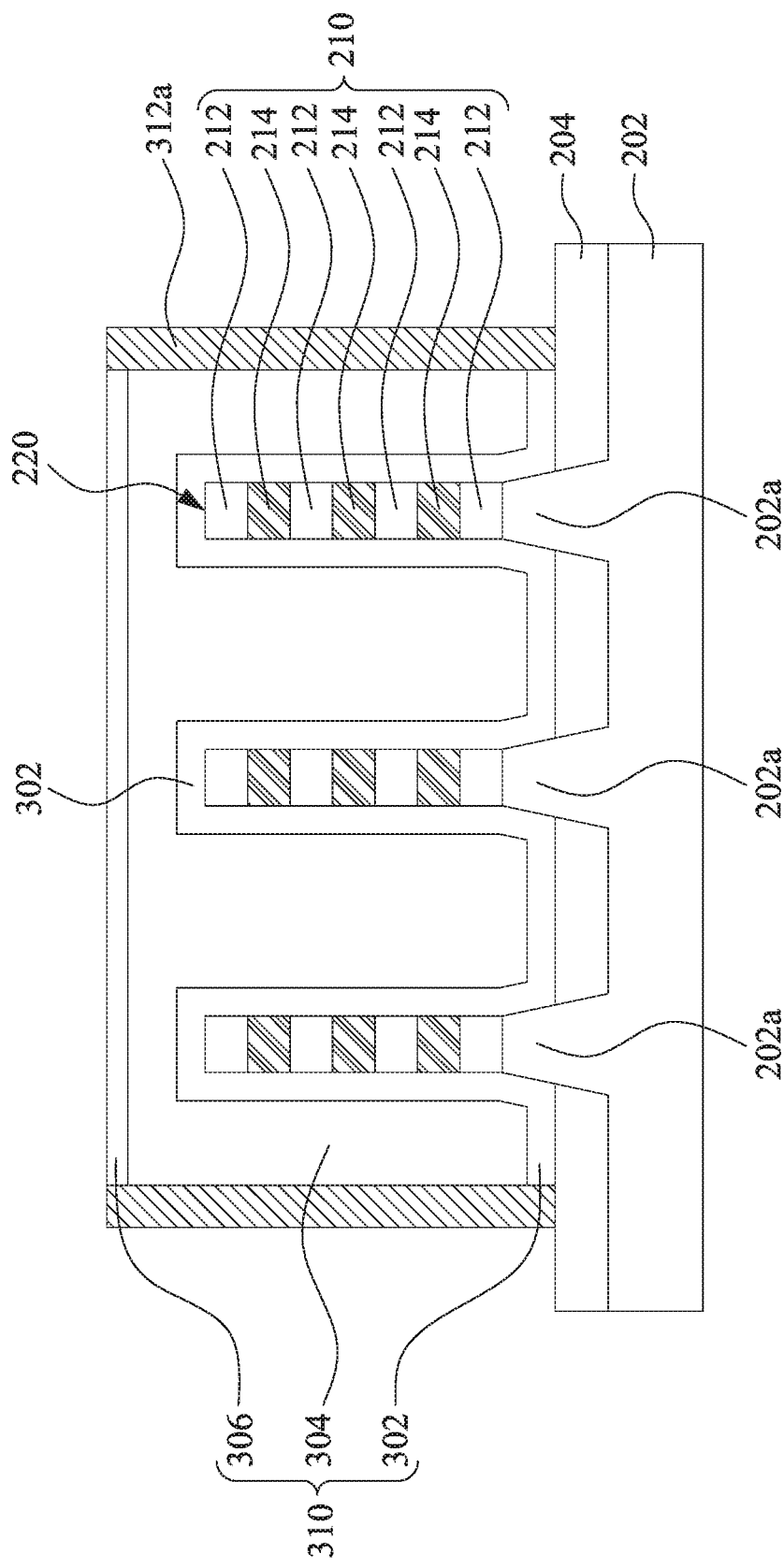

Reference is made to FIGS. 5A-5C. The fins 220 are recessed to form openings 422 therein. An etch process, such as, reactive ion etching (RIE), atomic layer etching (ALE), or a combination thereof, may be performed on portions of the fins 220 (shown in FIGS. 4A and 4B) exposed from the dummy gate structures 310 and the spacers 312 (outside the dummy gate structures 310 and the spacers 312). As such, the exposed fins 220 are removed to expose the protruded portions 202a of the semiconductor substrate 202. The openings 422 are formed in the fins 220 and between the fin spacers 312b as shown in FIGS. 5A and 5B. That is, the etching process is performed to remove the second portions 212b and 214 b of the sacrificial layer 212 and the nanowires 214 (shown in FIGS. 4B and 4C). The second portions 212b and 214b of the sacrificial layer 212 and nanowire 214 respectively are removed to yield source/drain regions which will be formed later.

The openings 422 fall between the gate spacers 312a, and between the fin spacers 312b, and are located between the channel regions 220a of the fins 220. The openings 422 are in parallel with the fins 220 (i.e., perpendicular to the dummy gate structures 310) and do not overlap the dummy gate structures 310 and channel regions 220a of the fins 220 (i.e., the first portions 214a of the nanowires 214). Furthermore, the first portions 212a and 214a of the sacrificial layer 212 and the nanowires 214 are exposed from the gate spacers 312a through the openings 422.

Figure 6A:
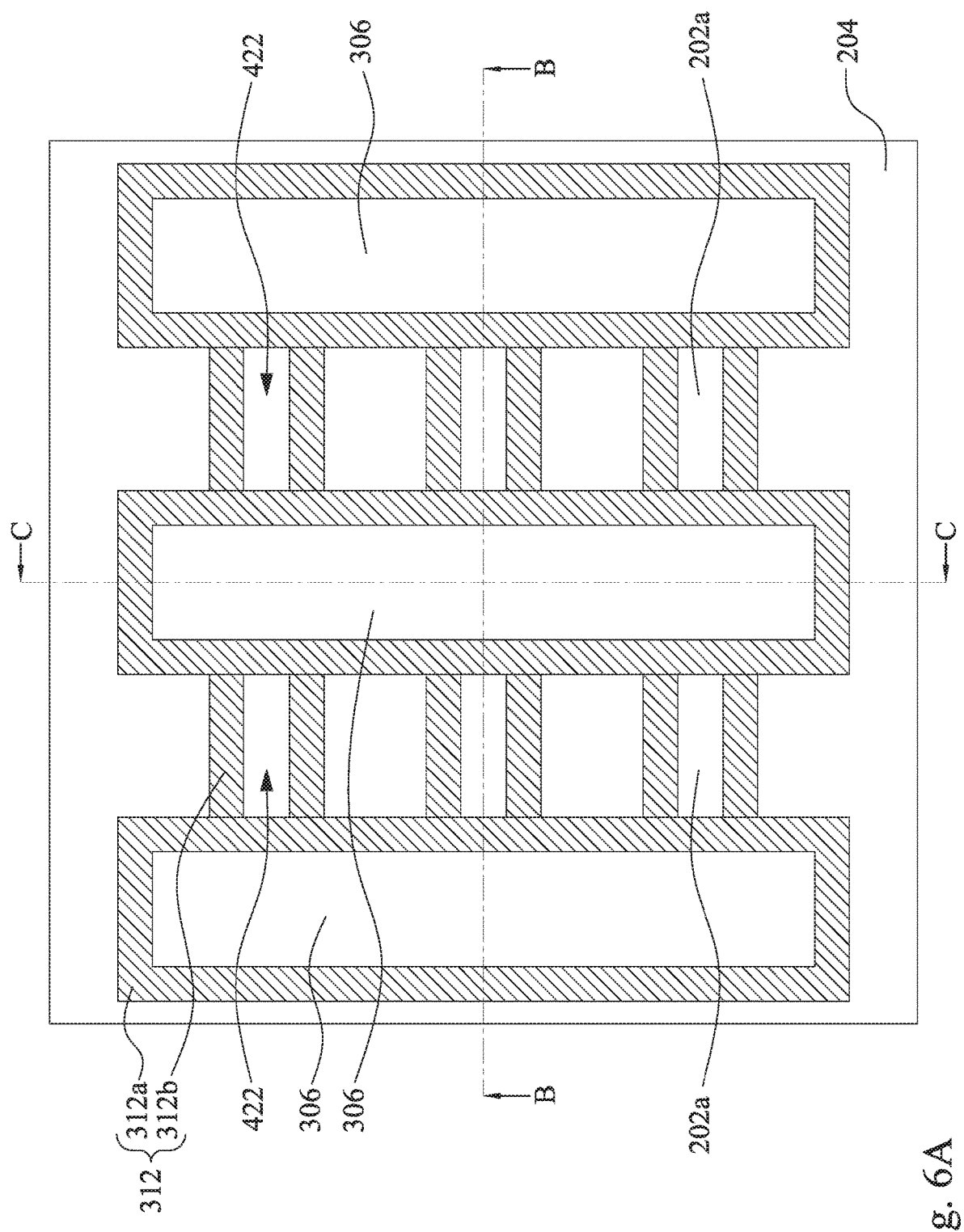
Figure 6B:
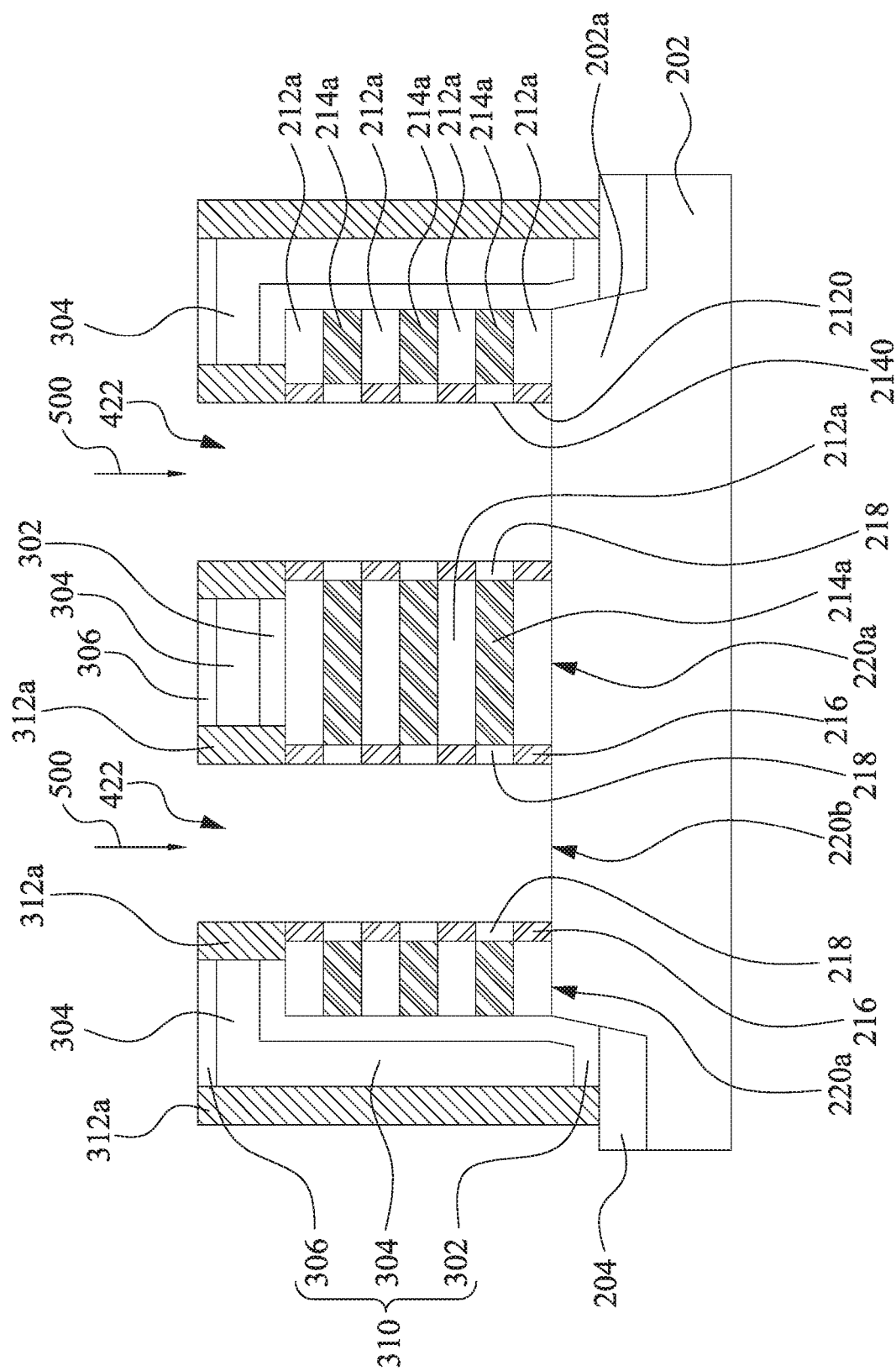
Figure 6C:
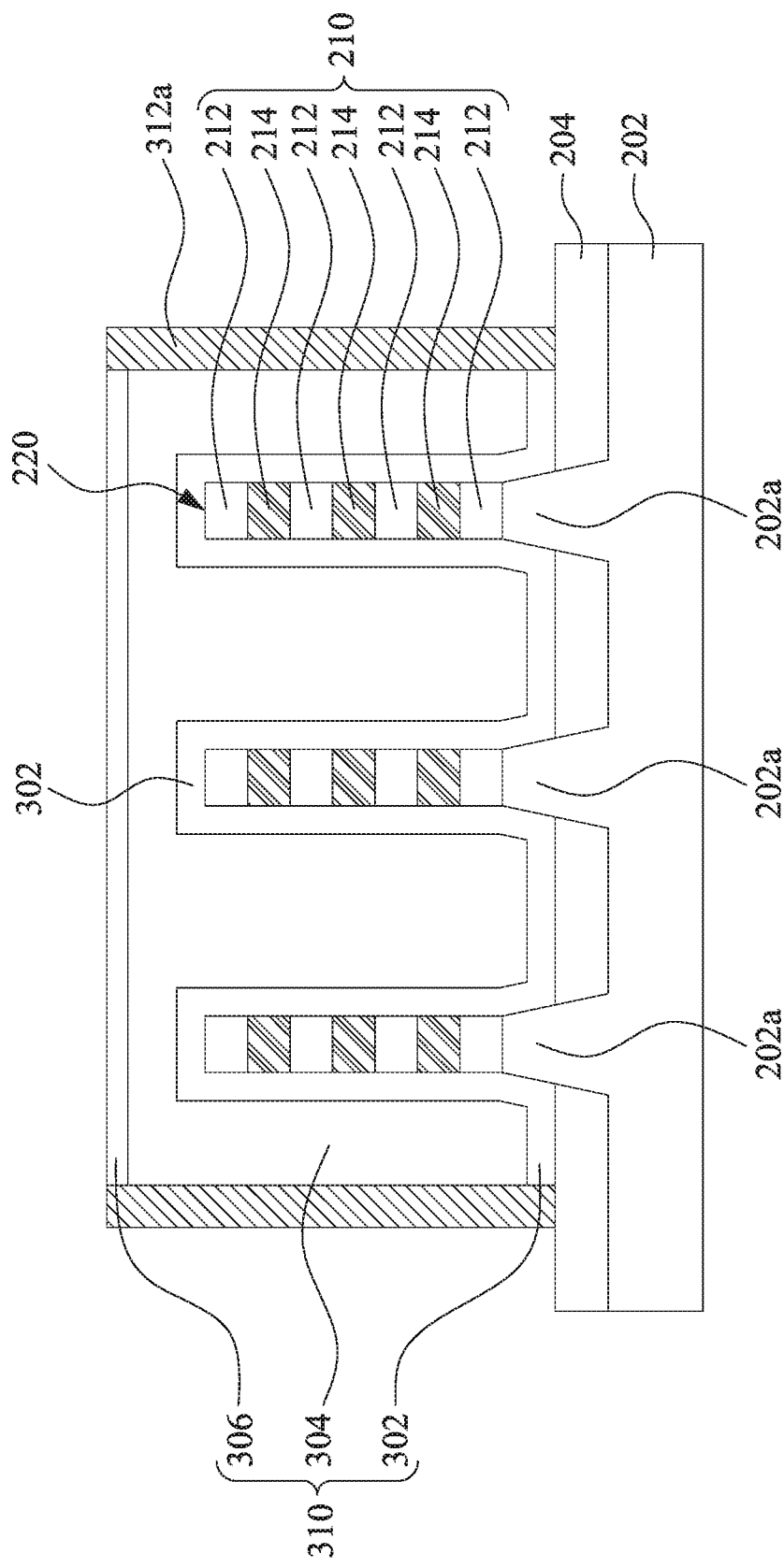

Reference is made to FIGS. 6A-6C. After the recessing of the fins 220, the channel regions 220a of the fins 220 exposed from the openings 422 are oxidized by an oxidation process 500. The oxidation process 500 may be performed on the exposed channel regions 220a, such as, an in-situ steam generated (ISSG) oxidation process 500 conducted in a temperature range about 600° C. to about 1100° C., an annealing process in oxidizing ambient $O_2$ and $O_3$ conducted in a temperature range about 600° C. to about 1100° C., or plasma enhanced chemical vapor deposition (PECVD) process with precursor (e.g., tetraethoxy silane (TEOS)) conducted in a temperature about 800° C. As such, the first portions 212a of the exposed channel regions 220a (the end sidewall 2120 of the first portions 212a) are oxidized to form source/drain spacers 216 (can also be referred to as a second oxidation layer), and the first portions 214a of the exposed channel regions 220a (the end sidewall 2140 of the first portions 214a) are oxidized to form first sacrificial portions 218 (can also be referred to as a first oxidation layer). For example, the first portions 212a are made of a material, such as, SiGe, and the first portions 214a are made of a material, such as, Ge/Si. The oxidation process 500 may be performed on the first portions 212a to form SiGeOx as the source/drain spacers 216, and on the first portions 214a to form $GeO_2$/$SiO_2$ as the first sacrificial portions 218.

Figure 7A:
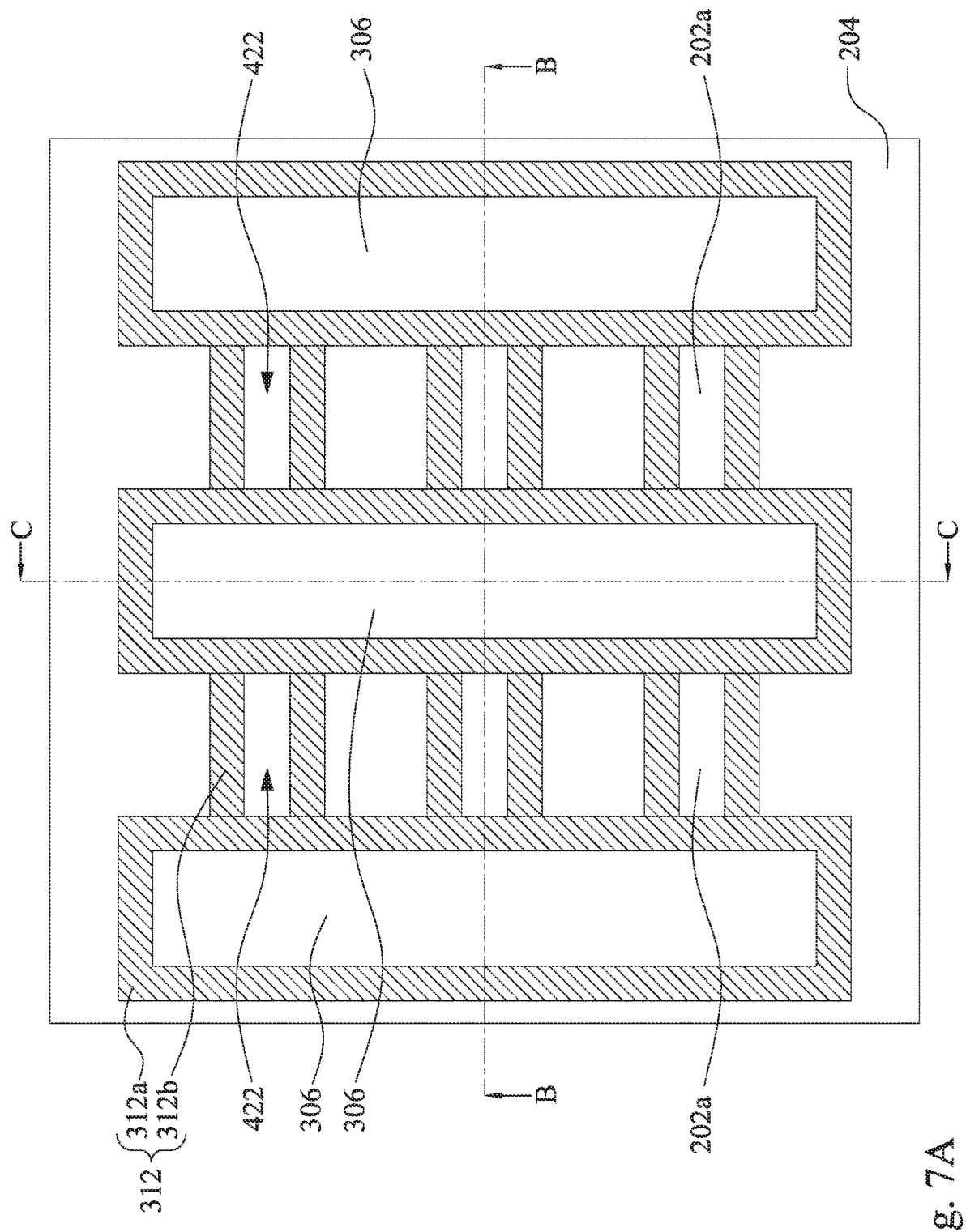
Figure 7B:
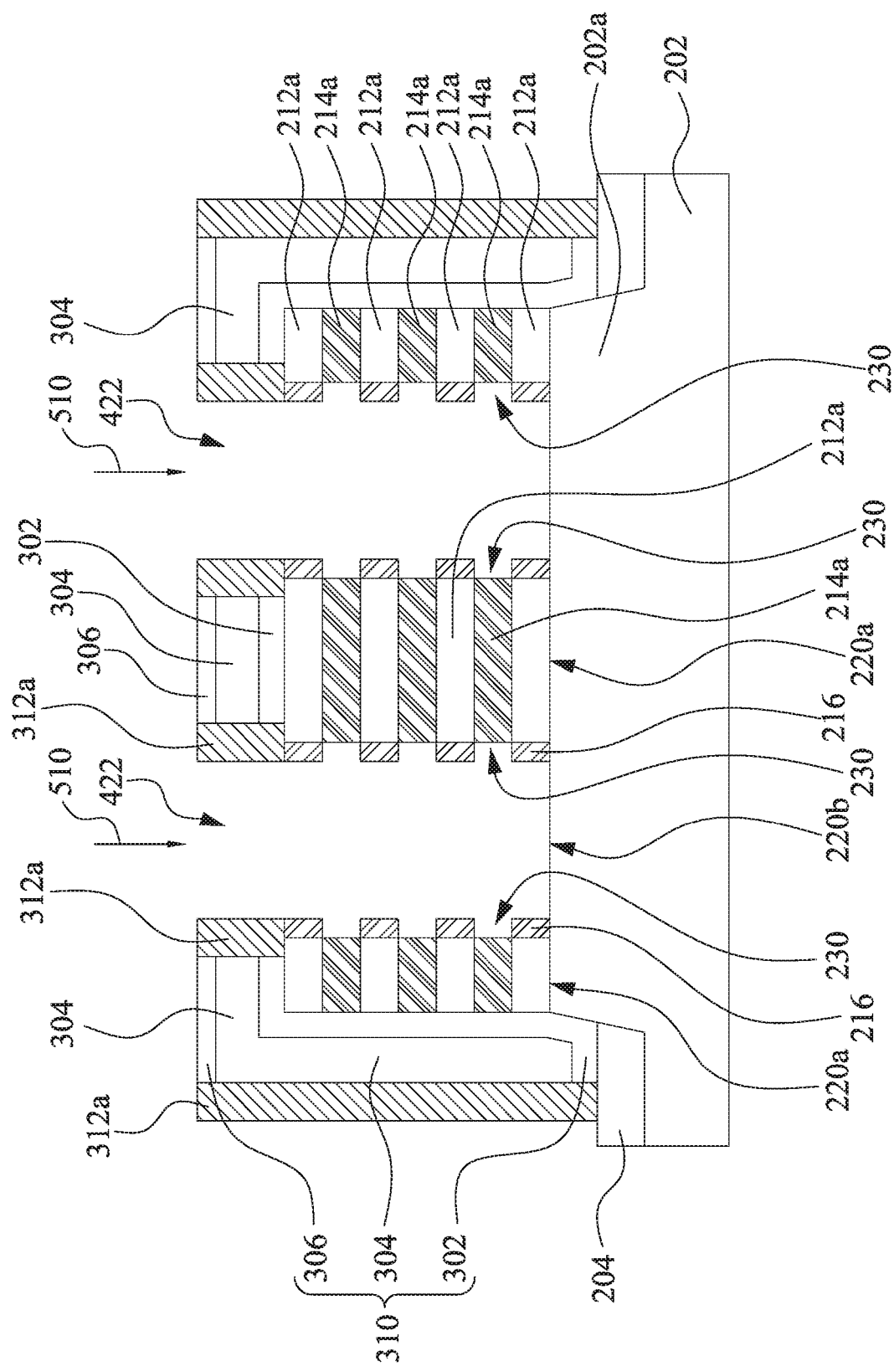
Figure 7C:
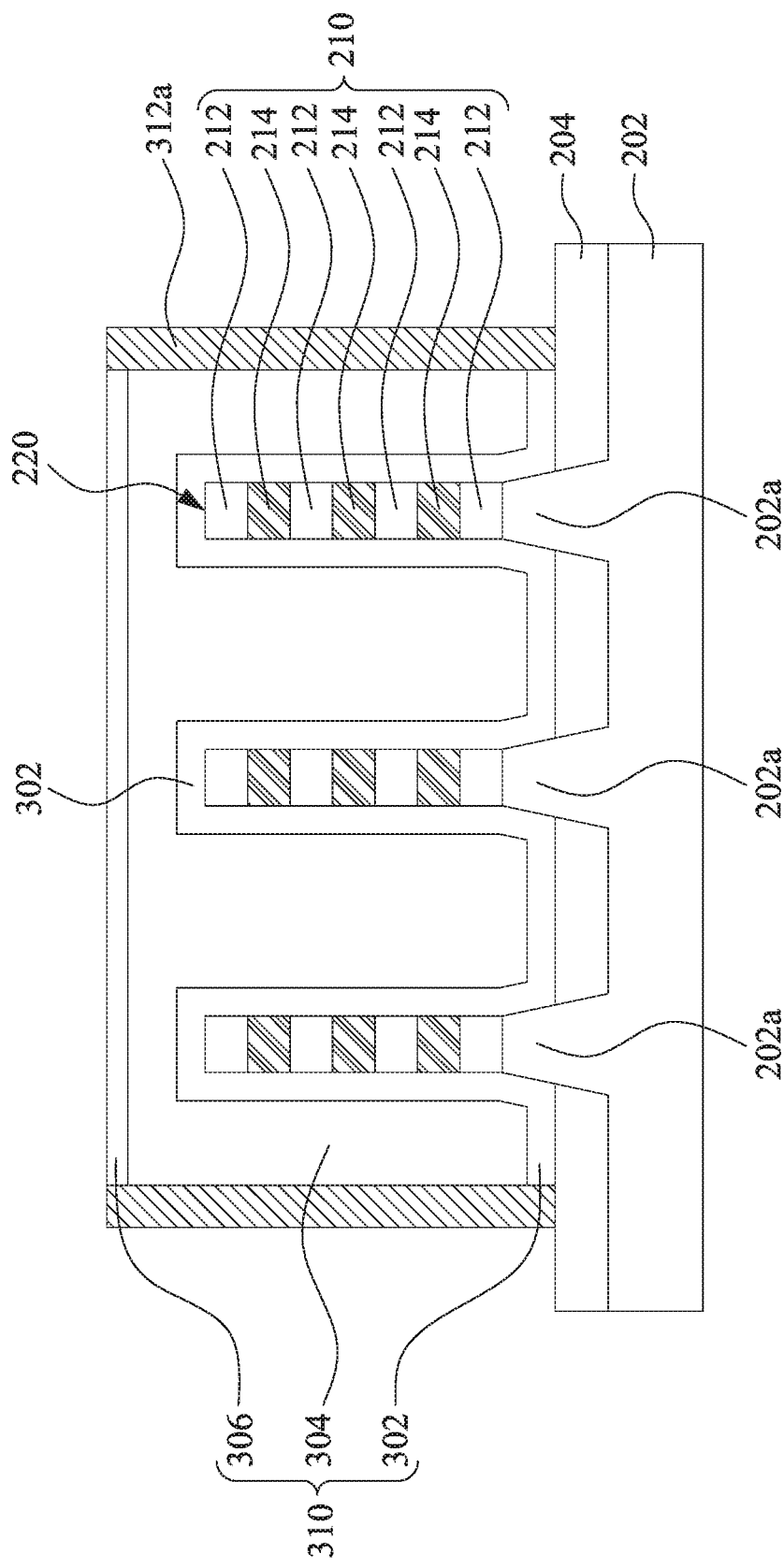

Reference is made to FIGS. 7A-7C. After the oxidation of the exposed channel regions 220a, the first sacrificial portions 218 (shown in FIG. 6B) of the channel regions 220a are removed by an etching process 510, but the source/drain spacers 216 remain. In some embodiments, the etching process 510 is a selective removal process for different oxide materials, such as, a wet etching process with different etching rates depend on different oxide materials for the source/drain spacers 216 and the first sacrificial portions 218. For example, when the source/drain spacers 216 are made of a material, such as, SiGeOx and the first sacrificial portions 218 are made of a material, such as, $GeO_2$, the etching process 510 may include de-ionized water to remove the first sacrificial portions 218 and remain the source/drain spacers 216. Similarly, when the source/drain spacers 216 are made of a material, such as, SiGeOx and the first sacrificial portions 218 are made of a material, such as, $SiO_2$, the etching process 510 may include, such as, deionized water, ozonated DIW, buffered hydrofluoric acid (BHF), hydrofluoric acid (HF), HF water diluted by ethylene glycol (HFEG), or any combination thereof, to remove the first sacrificial portions 218 and remain the source/drain spacers 216. It is note that, $GeO_2$ dissolves in water, while SiGeOx does not.

As such, after the removing of the first sacrificial portions 218 of the channel regions 220a, at least one recess 230 is formed between adjacent two of the source/drain spacers 216, and beneath the gate spacers 312a. For example, there are a plurality of recesses 230 in FIG. 7B. The source/drain spacers 216 remain suspended on the dummy gate structures 310. In other words, the source/drain spacers 216 protrude from sidewalls of the dummy gate structures 310 beneath the gate spacers 312a to form the recesses 230. The first portions 214a of the nanowires 214 are exposed from the recesses 230.

Figure 8A:
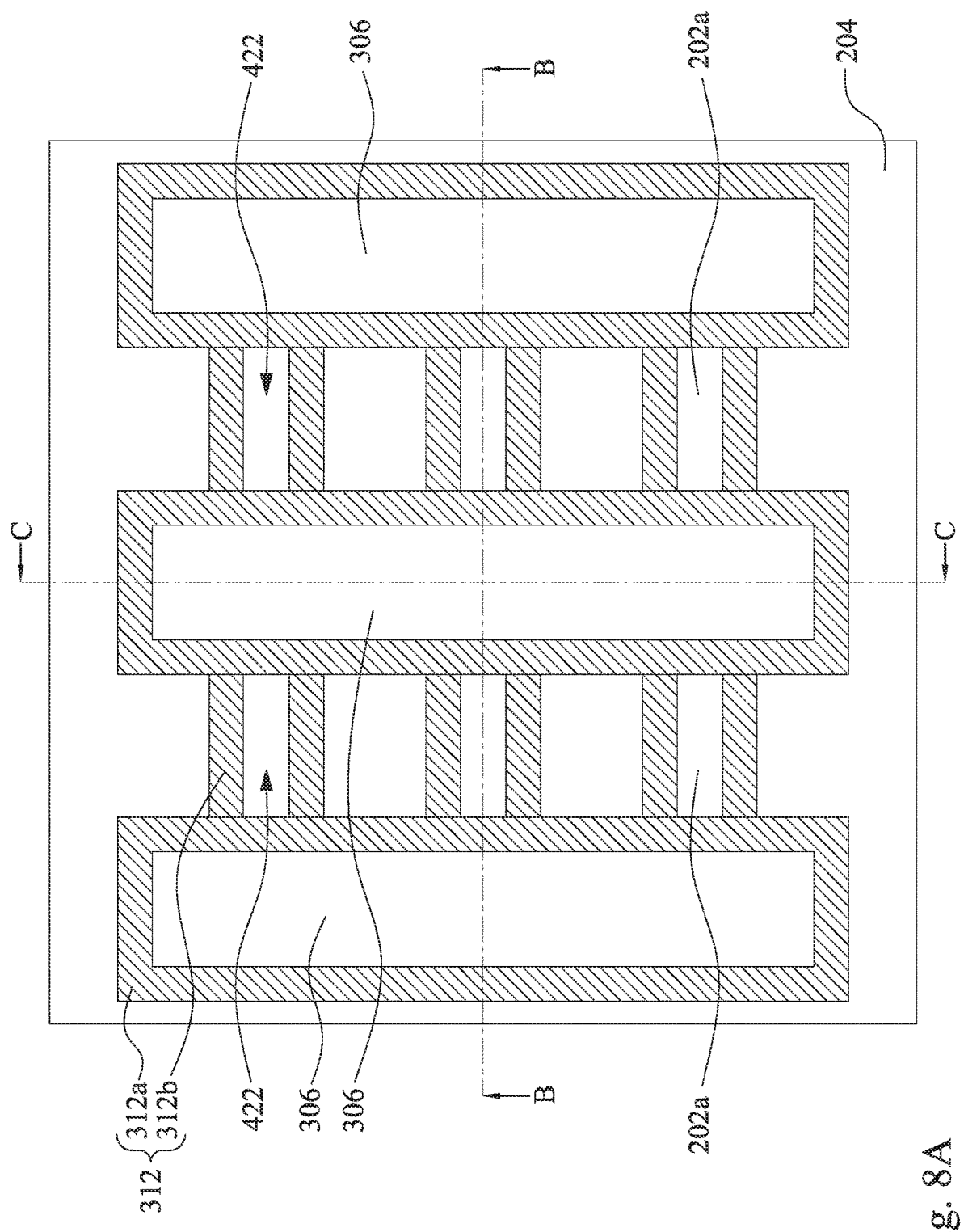
Figure 8B:
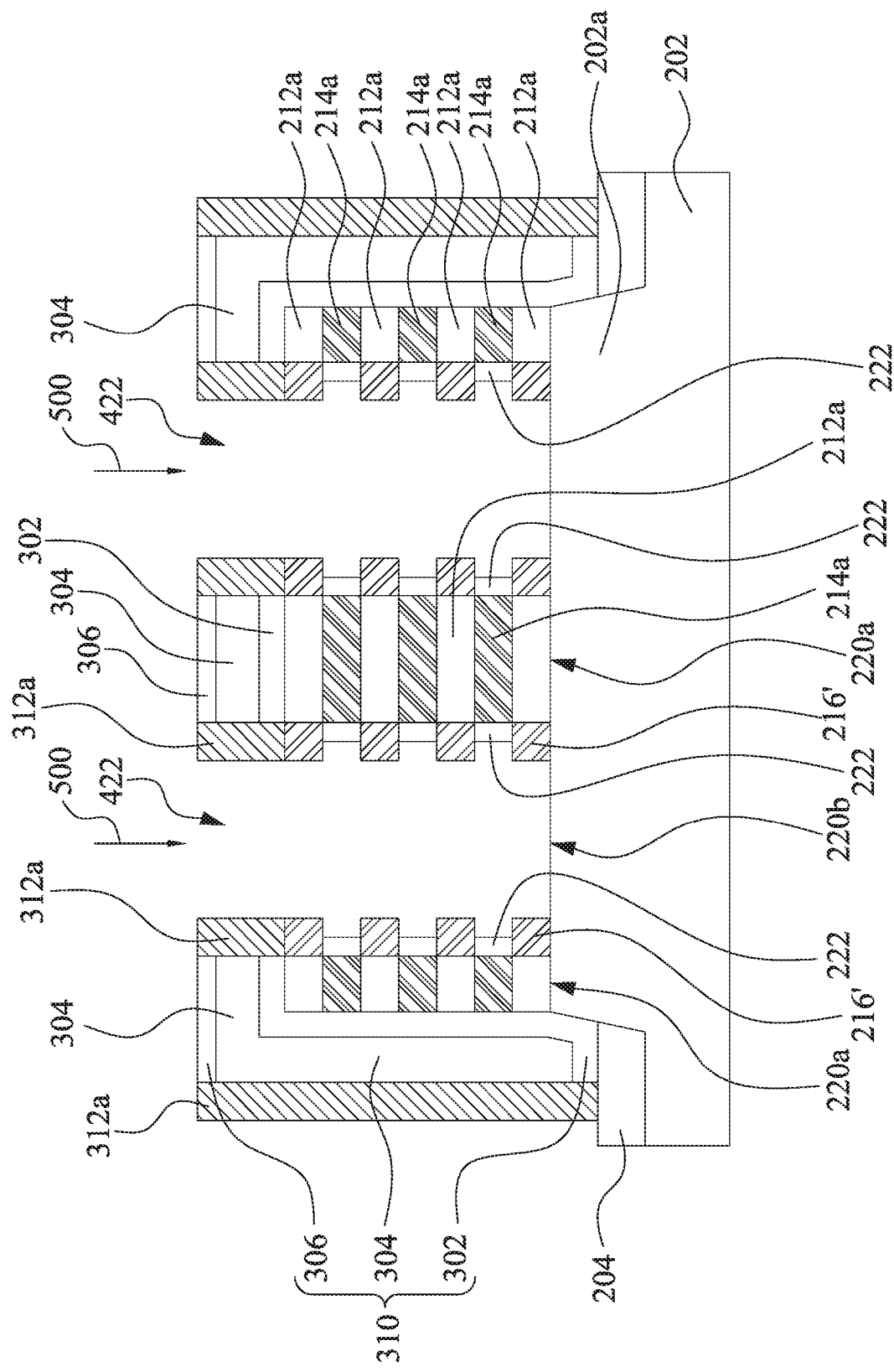
Figure 8C:
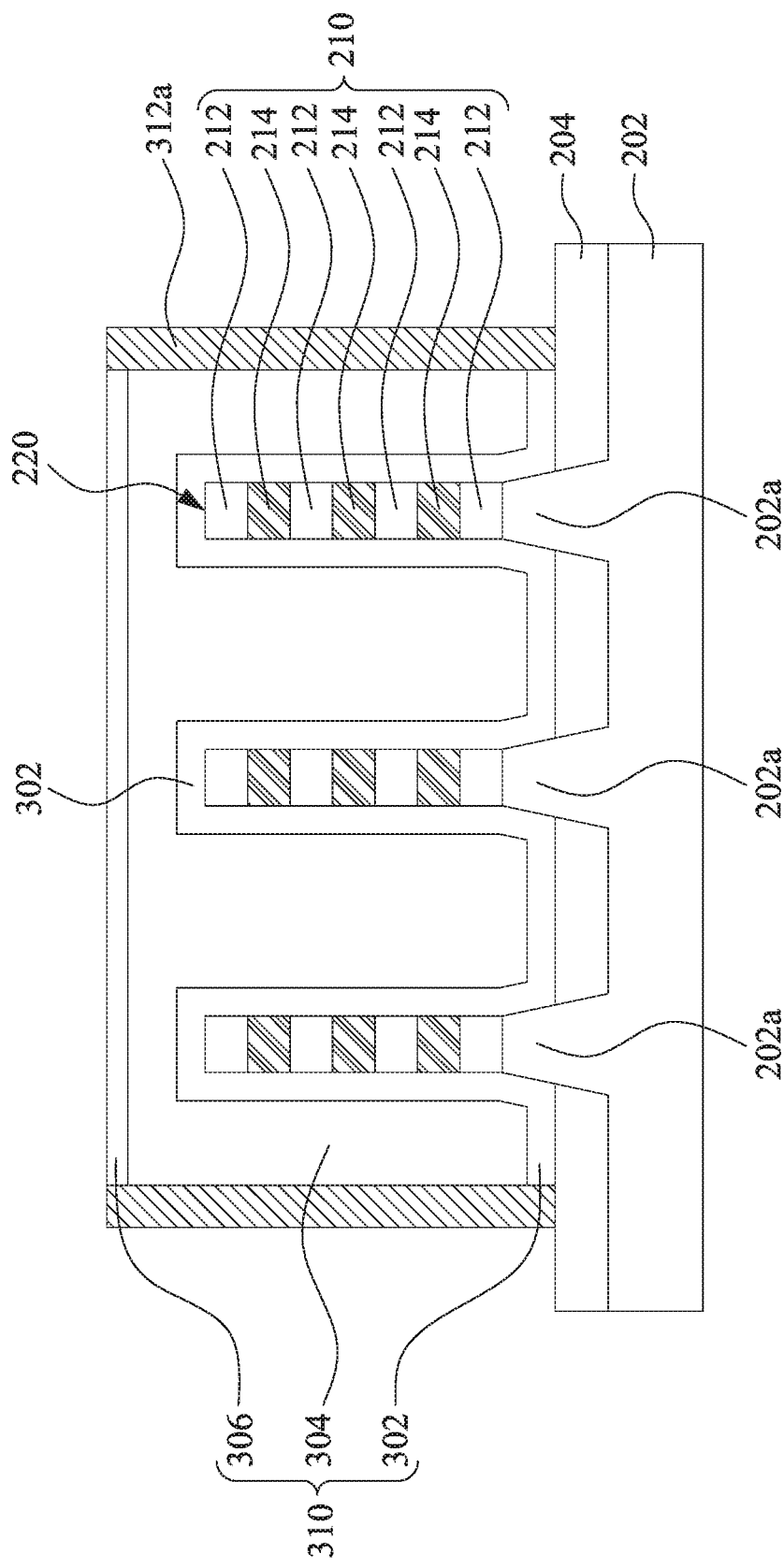

Reference is made to FIGS. 8A-8C. After the moving of the first sacrificial portions 218 (shown in FIGS. 6A-6C) of the channel regions 220a, the channel regions 220a of the fins 220 exposed from the contact openings 422 are oxidized by another oxidation process 500 again. The oxidation process 500 may be performed on the exposed channel regions 220a exposed from the contact openings 422. As such, parts of the first portions 212a adjacent to the source/drain spacers 216 are oxidized such that to form source/drain spacers 216' with the source/drain spacers 216. In addition, parts of the first portions 214a exposed from the contact openings 422 are oxidized to form second sacrificial portions 222.

Figure 9A:
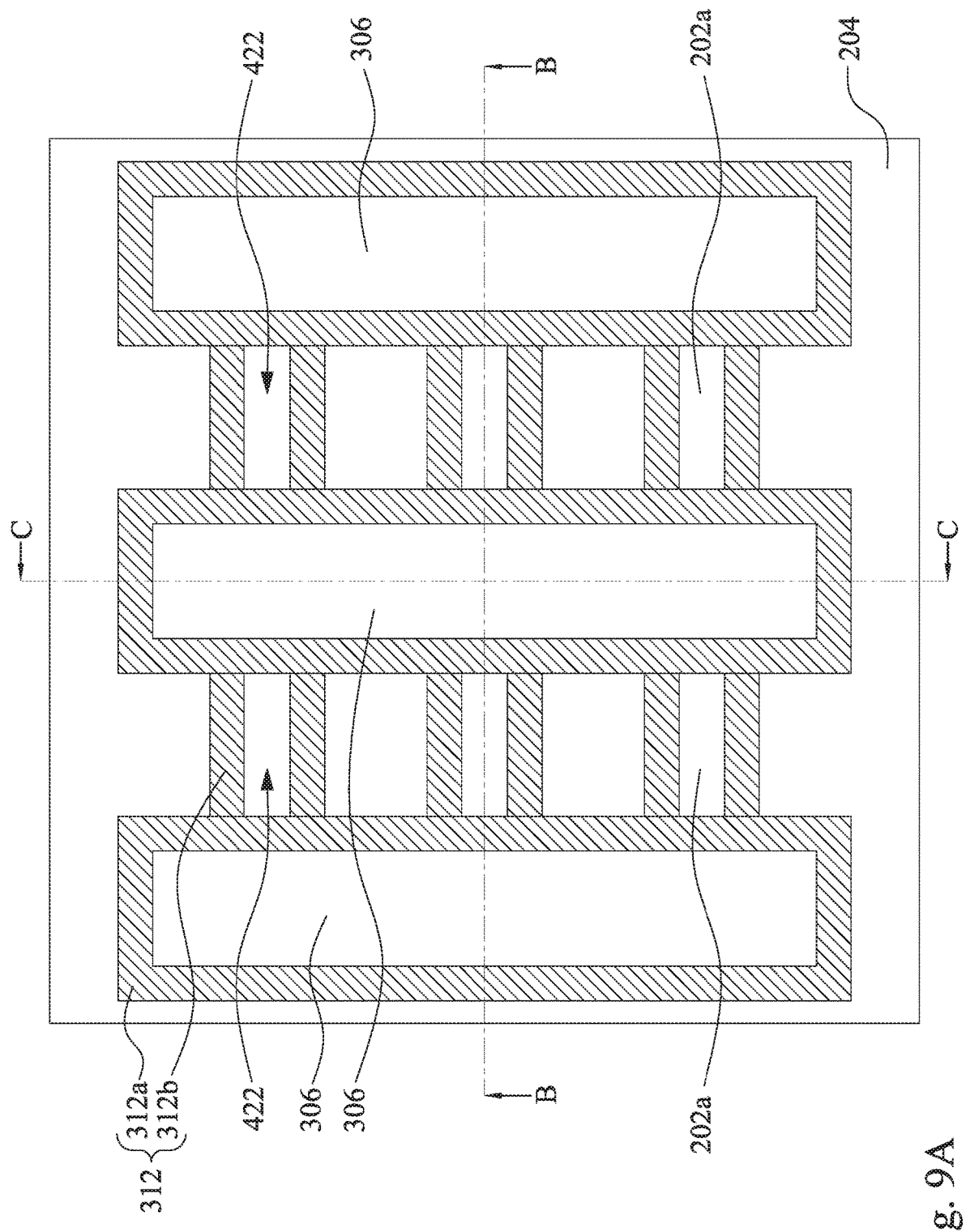
Figure 9B:
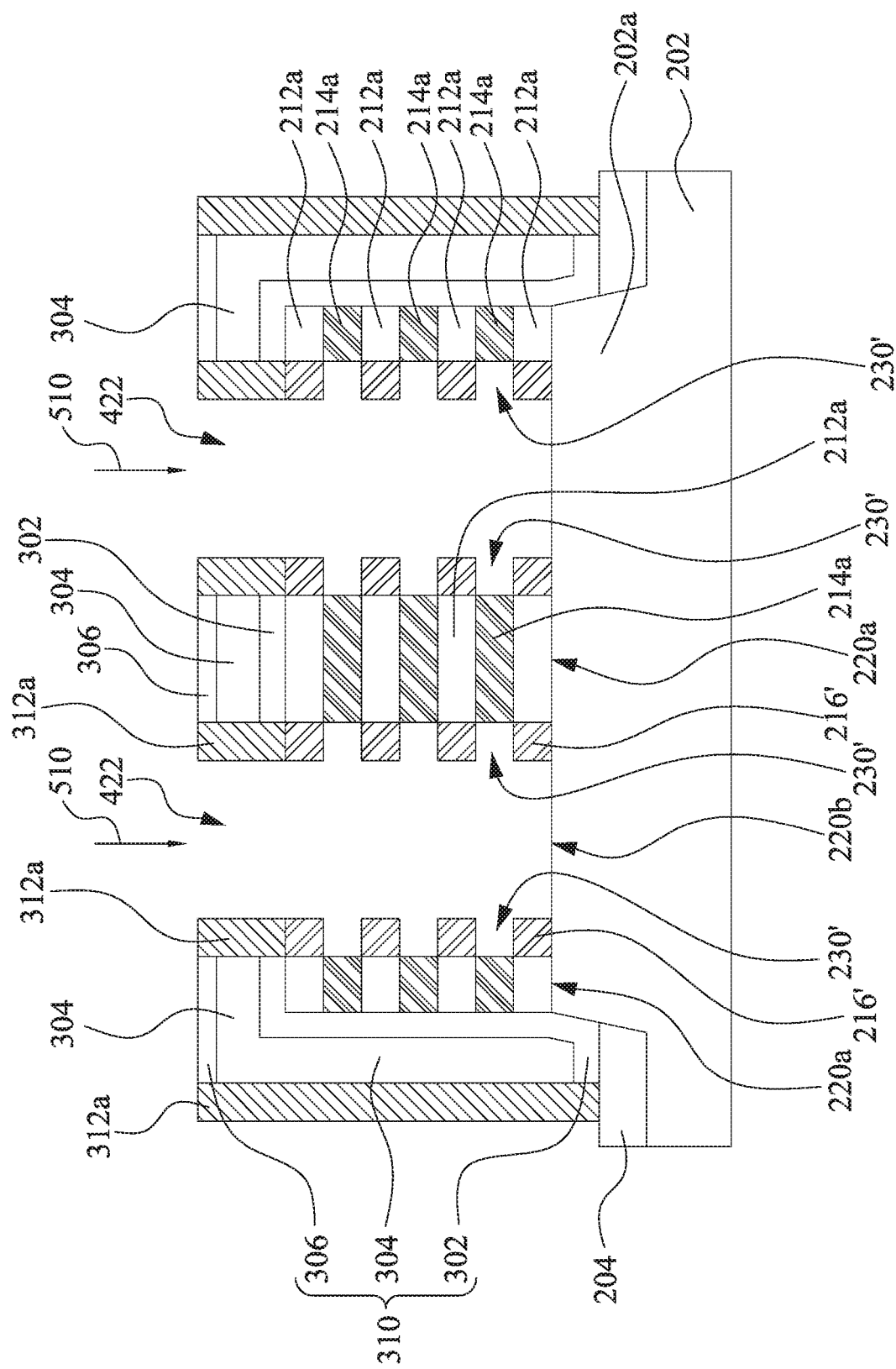
Figure 9C:
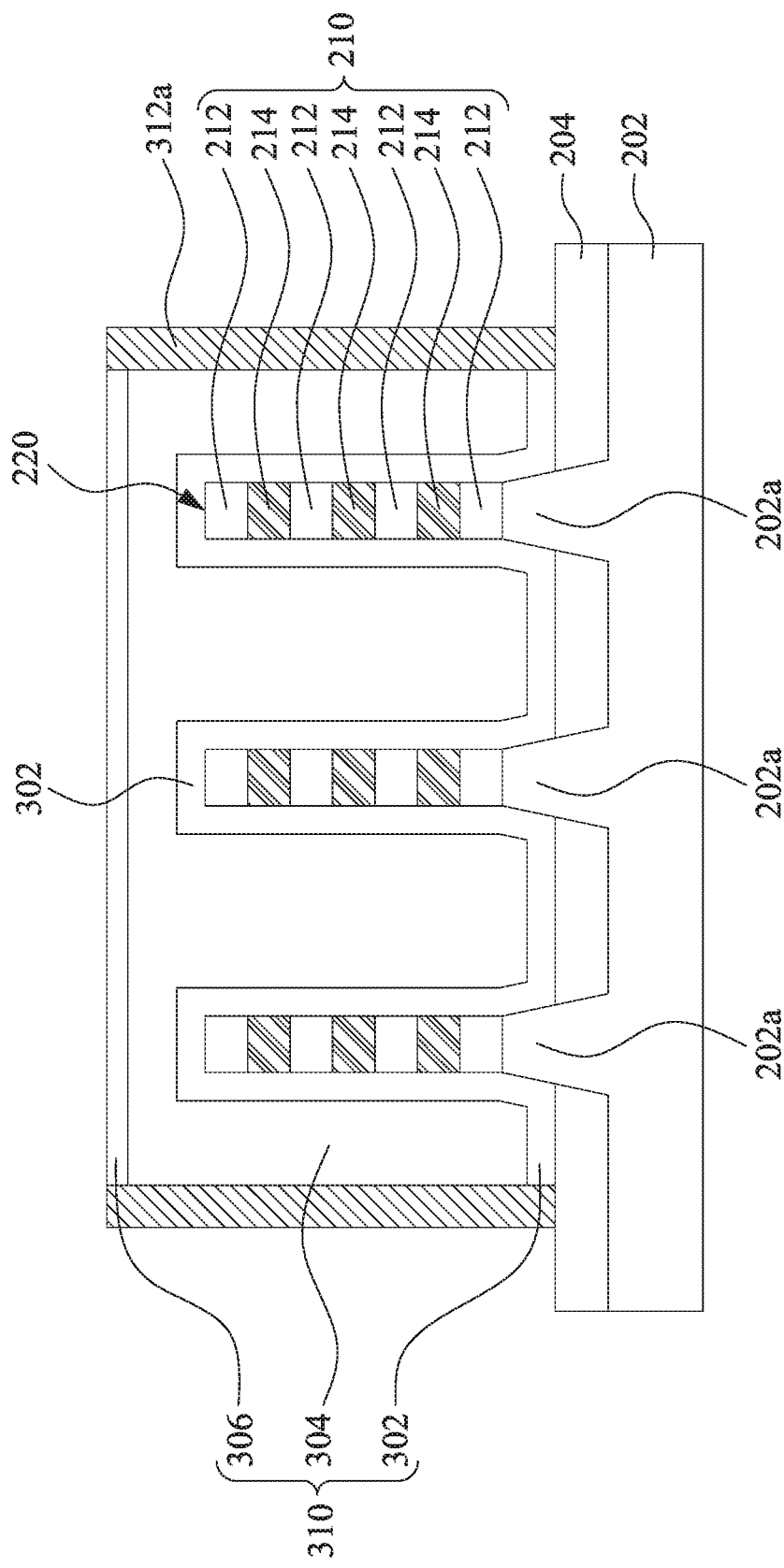

Reference is made to FIGS. 9A-9C. After the oxidation of the exposed channel regions 220a, the second sacrificial portions 222 of the channel regions 220a are removed by the etching process 510, but the source/drain spacers 216' remain, In some embodiments, the etching process 510 is the selective removal process for the source/drain spacers 216' and the second sacrificial portions 222. As such, after the removing of the second sacrificial portions 222 of the channel regions 220a, at least one recesses 230' is formed between adjacent two of the source/drain spacers 216', and beneath the gate spacers 312a. For example, there are a plurality of recesses 230' in FIG. 9B. The source/drain spacers 216' remain suspended on the dummy gate structures 310 and positioned beneath the gate spacers 312a, In other words, the source/drain spacers 216' protrude from sidewalls of the dummy gate structures 310 beneath the gate spacers 312a to form the recesses 230'. In some embodiments, the source/drain spacers 216' substantially have the same length as that of the gate spacers 312a. The first portions 214a of the nanowires 214 are exposed from the recesses 230'.

In the case, the channel regions 220a are performed on a cyclic oxidation etch (COE) process. That is, the source/drain spacers on the first portions 214a are formed by repeated oxidation process 500 to achieve a predetermined thickness thereof. Relatively, the sacrificial portions formed on the first portions 212a are removed by the selective removal process to remain the source/drain spacers without removing it. In the cyclic oxidation etch (COE) process of the source/drain spacers formation, it can ensure the thickness of source/drain spacers achieve designed thickness, and has a good control for widths of the source/drain spacers. In some embodiments of the instant disclosure, the oxidation for the source/drain spacers and the selective etching of the sacrificial portions may repeat twice or even more. As a result, the thickness of the source/drain spacers can be controlled in cycle times of the oxidation process 500.

Specifically, the thickness of the source/drain spacers 216' is larger than that of the source/drain spacers 216 shown in FIG. 7B. In addition, the length of the first portions 214a of the nanowires 214 is shorter than that shown in FIG. 7B due to the multiple selective etching processes, and therefore the first portions 214a of the nanowires 214 can expose from the recesses between the source/drain spacers and not cover by the oxide, such as, sacrificial portions in the present disclosure. Furthermore, the formation of the source/drain spacers 216' can be conducted in a self-aligned process, but no lithography process is required.

Figure 10A:
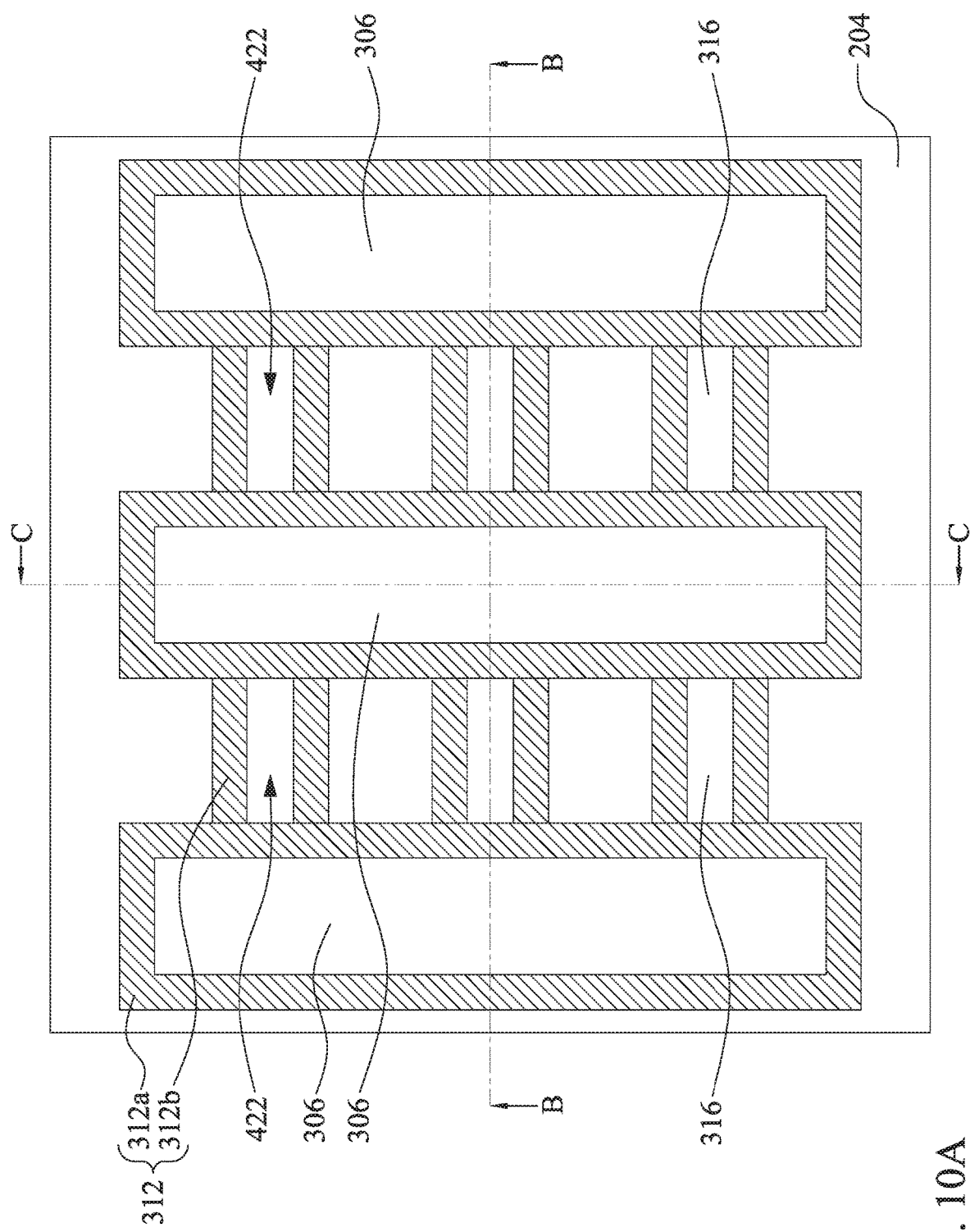
Figure 10B:
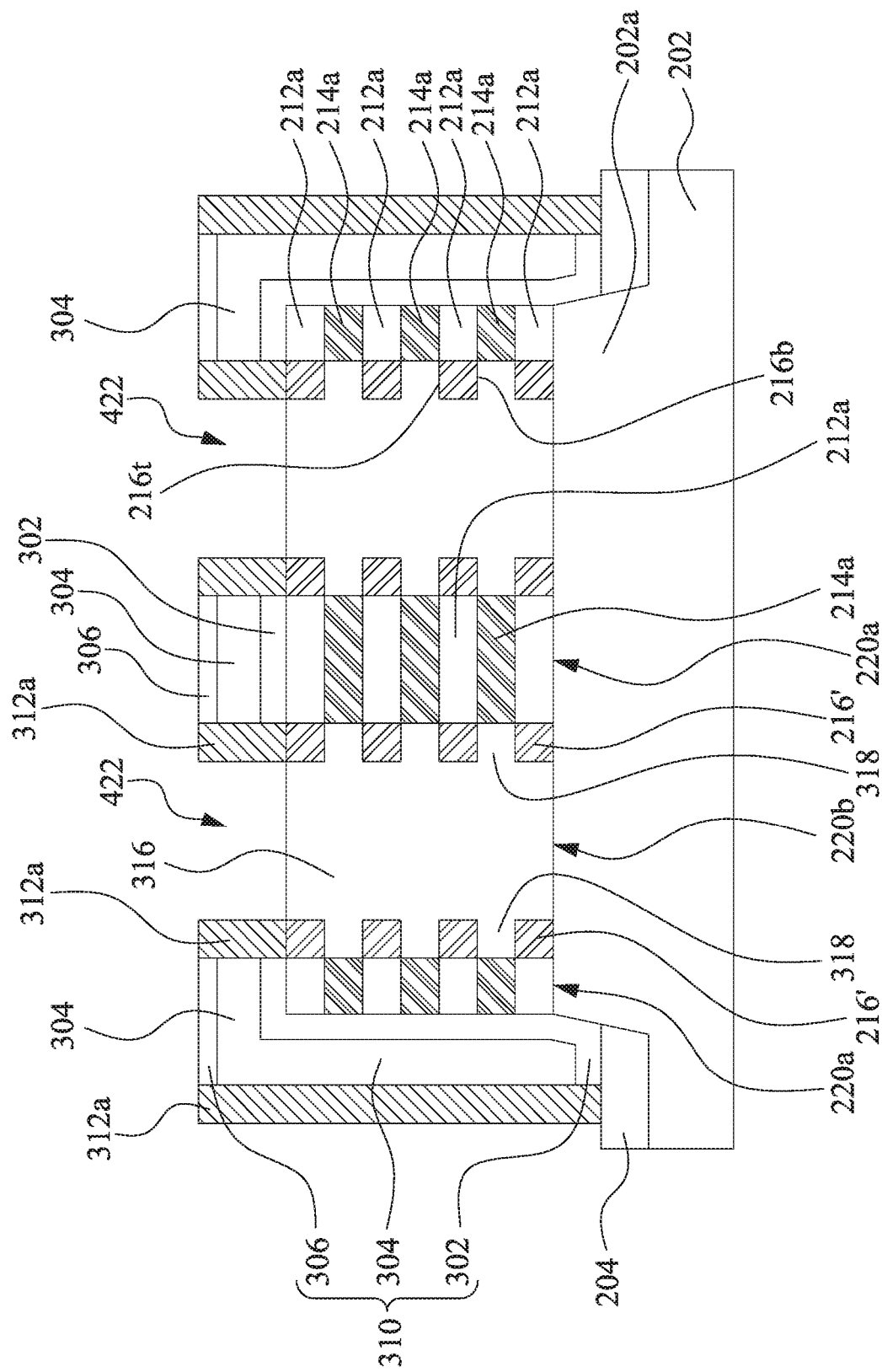
Figure 10C:
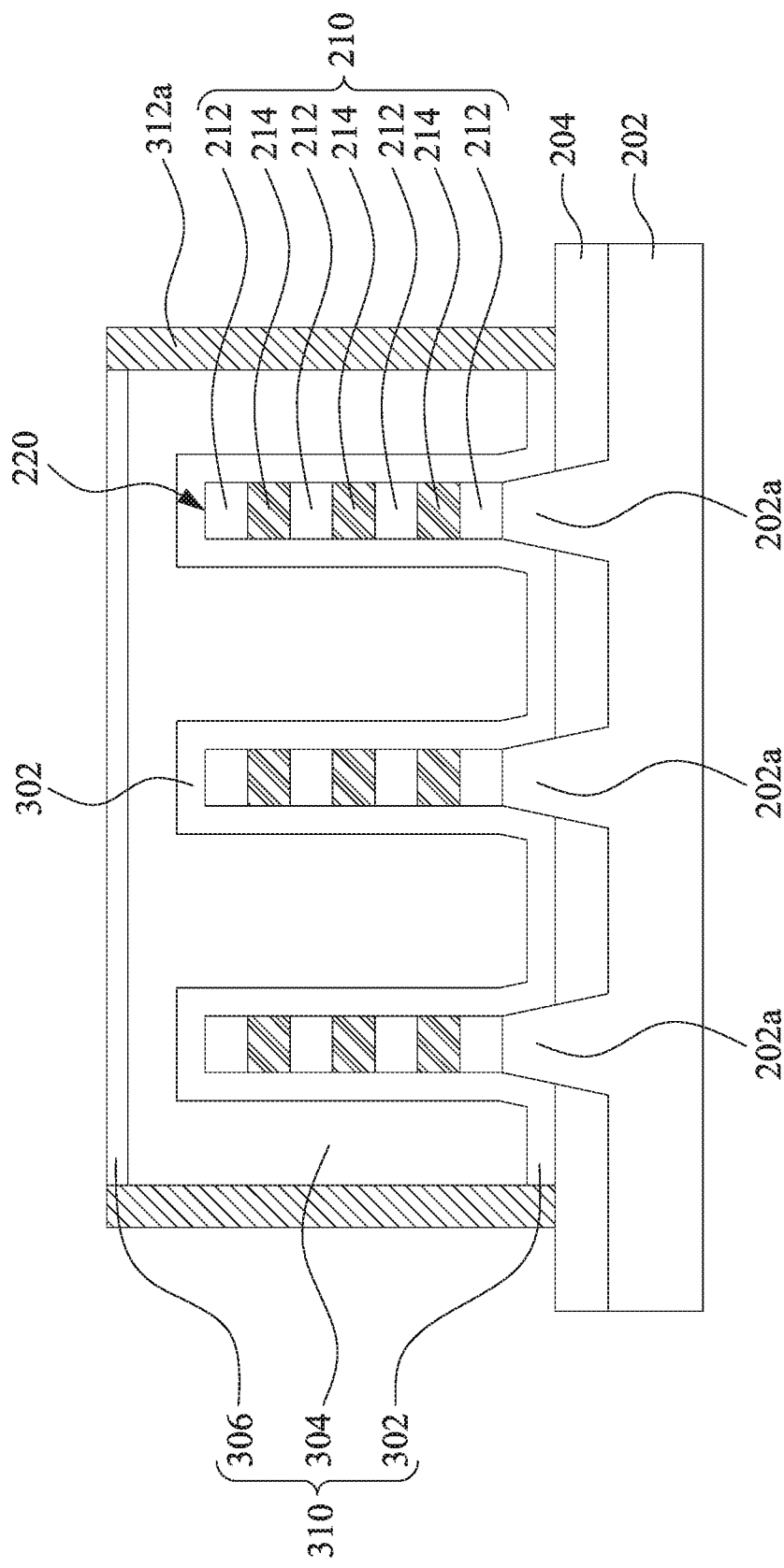

Reference is made to FIGS. 10A-10C. Epitaxy structures 316 are formed in the openings 422 by, for example, an epitaxial growth process as source/drain regions. As such, the tin spacers 312b are in contact with opposite sidewalls of the epitaxy structure 316. The epitaxial growth process is performed on exposed parts of the first portions 214a of the nanowires 214, and performed on exposed parts of the protruded portions 202a of the semiconductor substrate 202. Therefore, the epitaxy structures 316 are formed between the channel regions 220a, further formed in the recesses 230' of the channel regions 220a, and in contact with the protruded portions 202a. More specifically, the epitaxy structures 316 have protruding portions 318 embedded in (or being protruding into) the recesses 230' of the channel regions 220a and disposed between the gate spacer 312a and the source/drain spacers 216'. Furthermore, the protruding portion 318 is disposed between and extends pass two of the source/drain spacers 216', is in contact with the first portions 214a of the nanowires 214 and top surfaces 216t and/or bottom surfaces 216b of the source/drain spacers 216', and the topmost protruding portion 318 is further disposed between the gate spacer 312a and the source/drain spacer 216'. In other words, the source/drain spacers 216' and the protruding portions 318 are arranged in an alternating manner. On the other hand, the source/drain spacers 216' are disposed between the epitaxy structure 316 and the dummy gate structure 310, are embedded in the epitaxy structure 316, and are in contact with opposite sidewalls of the epitaxy structure 316. Therefore, the source/drain spacers 216' are separated from the first portions 214a of the nanowires 214 by the epitaxy structures 316.

In some embodiments, in situ doping (ISD) is applied to form doped source/drain regions 316. N-type and p-type FETs are formed by implanting different types of dopants to selected regions of the device to form the necessary junction (s). N-type devices may be formed by implanting arsenic (As) or phosphorous (P), and p-type devices may be formed by implanting boron (B). For example, the epitaxy structures 316 may include materials such as SiP or SiGeB and any other suitable materials. The epitaxy structures 316 may be formed conformally by CVD, or by monolayer doping (MLD). Alternatively, the epitaxy structures 316 may be formed by an implantation with activation anneal step.

With such configuration, the epitaxy structures 316 are positioned such that subsequent etching processes that remove the first portions 212a of the sacrificial layer 212 during device fabrication do not also damage the epitaxy structures 316. That is, the epitaxy structures 316 are configured to be separated from the first portions 212a of the sacrificial layer 212 at least by the source/drain spacers 216' and the first portions 214a of the nanowires 214, such that parasitic capacitance between the epitaxy structures 316 and gate under such multi-stack nanowire devices will be reduced.

Figure 11A:
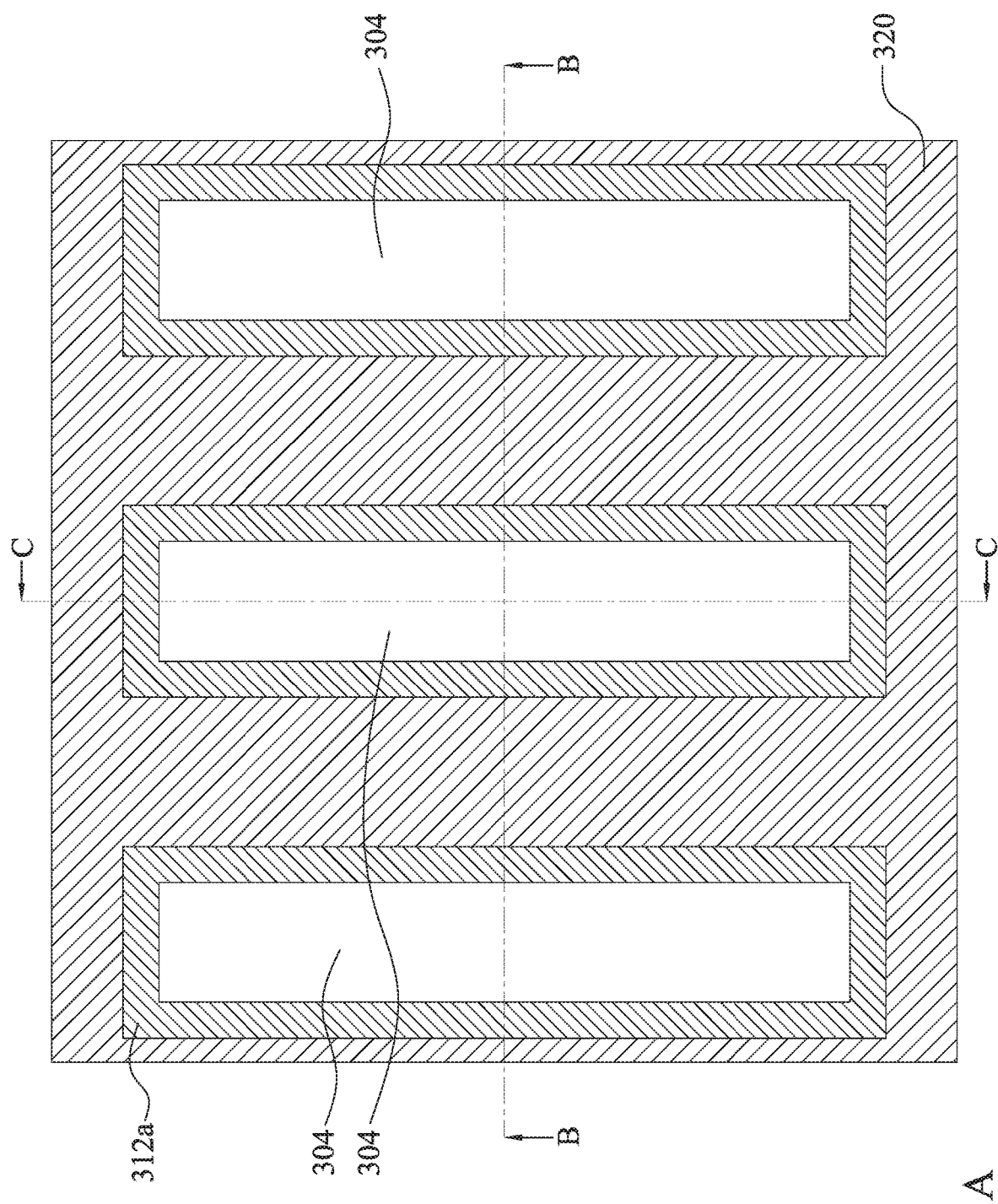
Figure 11B:
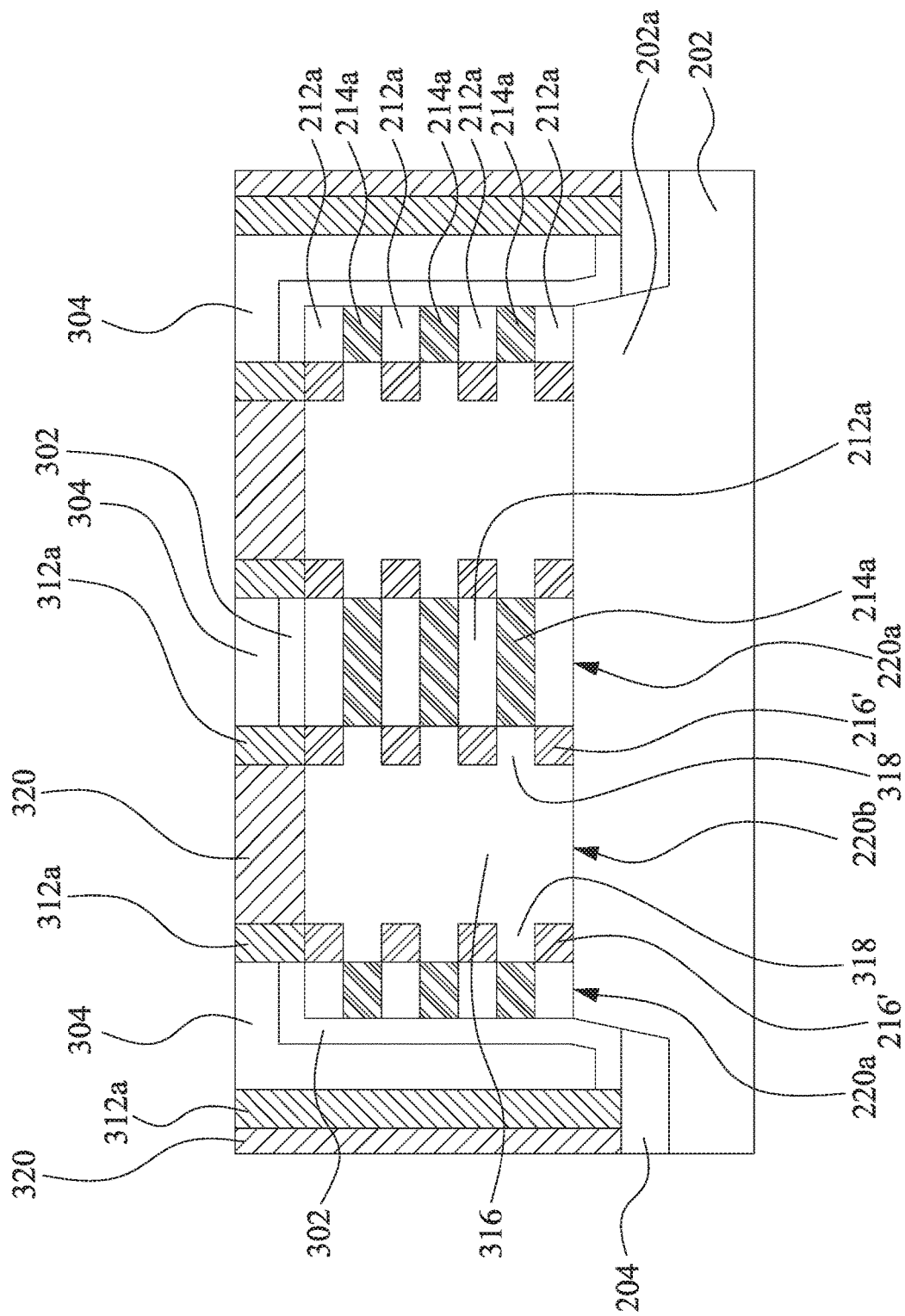
Figure 11C:
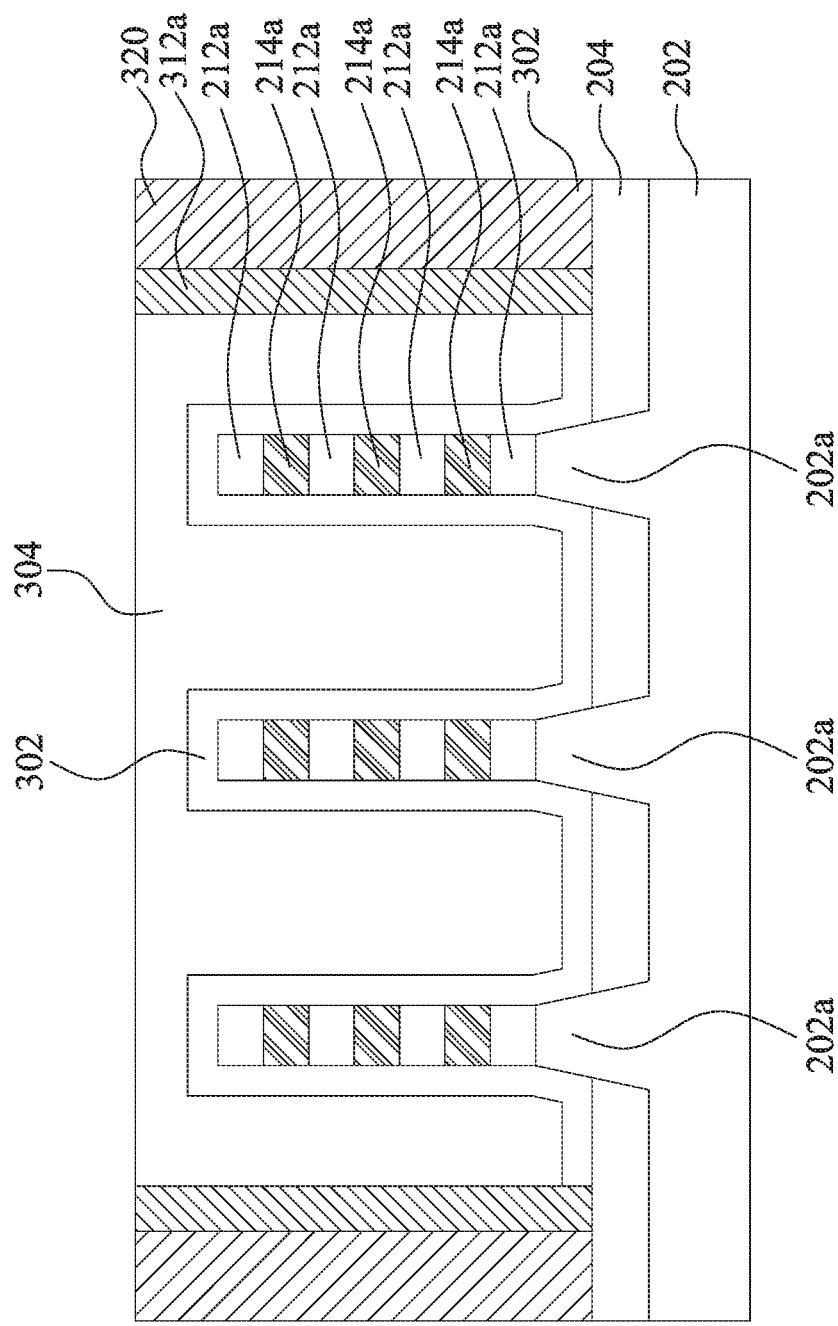

Reference is made to FIGS. 11A-11C. An interlayer dielectric (ILD) layer 320 is blanket deposited on the semiconductor substrate 202, fills in the spaces left between the gate spacers 312a, and between the fin spacers 312b. The epitaxy structures 316 are then covered by the interlayer dielectric layer 320. Further, the interlayer dielectric layer 320 covers up the spacers 312 and the dummy gate structures 310. At least one epitaxy structure 316 is disposed between the interlayer dielectric layer 320 and the source/drain spacer 216'.

Then, a planarization process is performed to the interlayer dielectric layer 320. The planarization process may be chemical mechanical polishing (CMP) process or any other suitable process. Portions of the interlayer dielectric layer 320 are removed. The interlayer dielectric layer 320 between the gate spacers 312a and between the fin spacers 312b remain. In the planarization process, the hard masks 306 shown in FIGS. 10A-10C of the dummy gate structures 310 and portions of the spacers 312 (shown in FIGS. 10A-10C) are removed. On top of the epitaxy structures 316, a layer of the interlayer dielectric layer 320 remains.

Figure 12A:
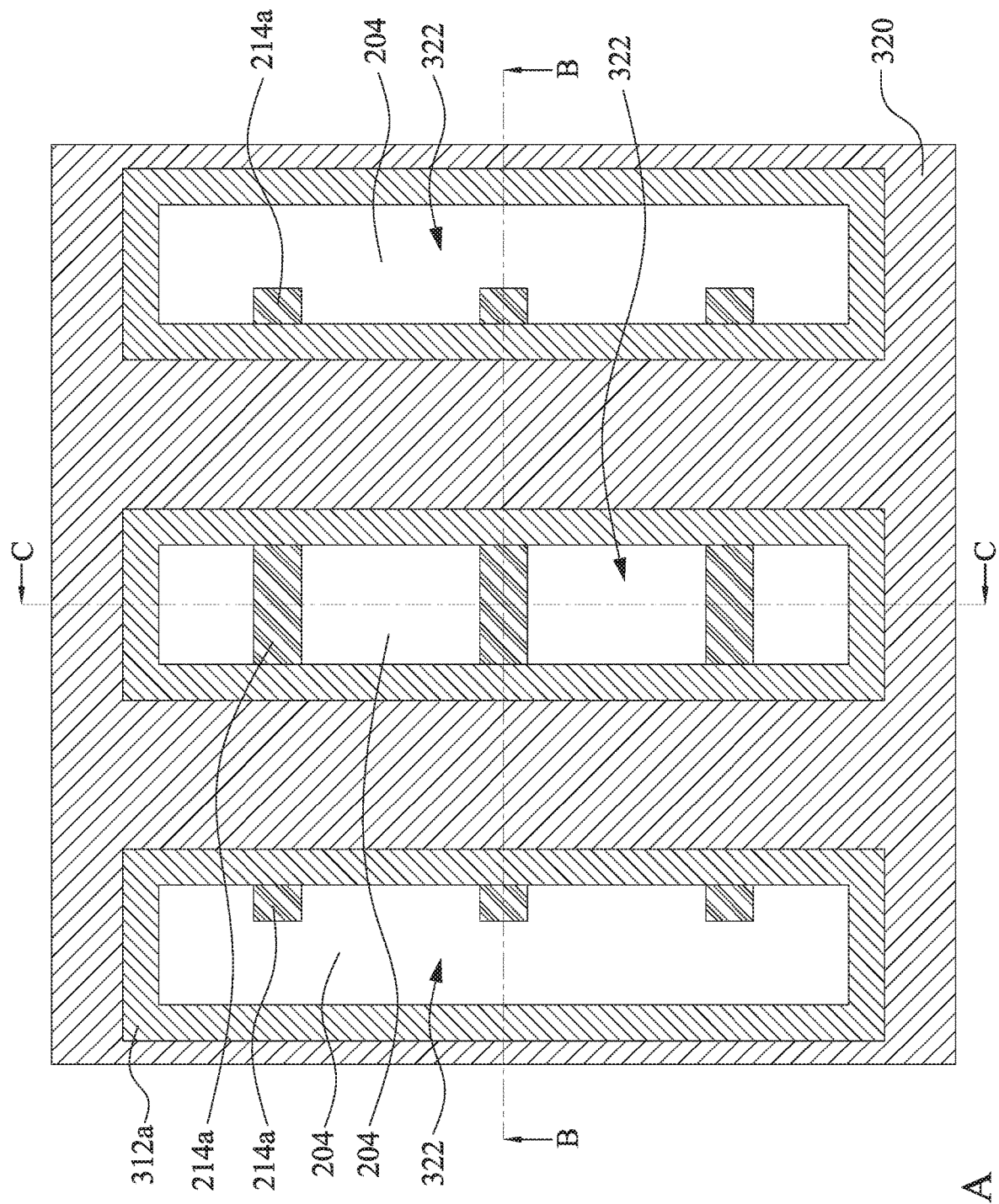
Figure 12B:
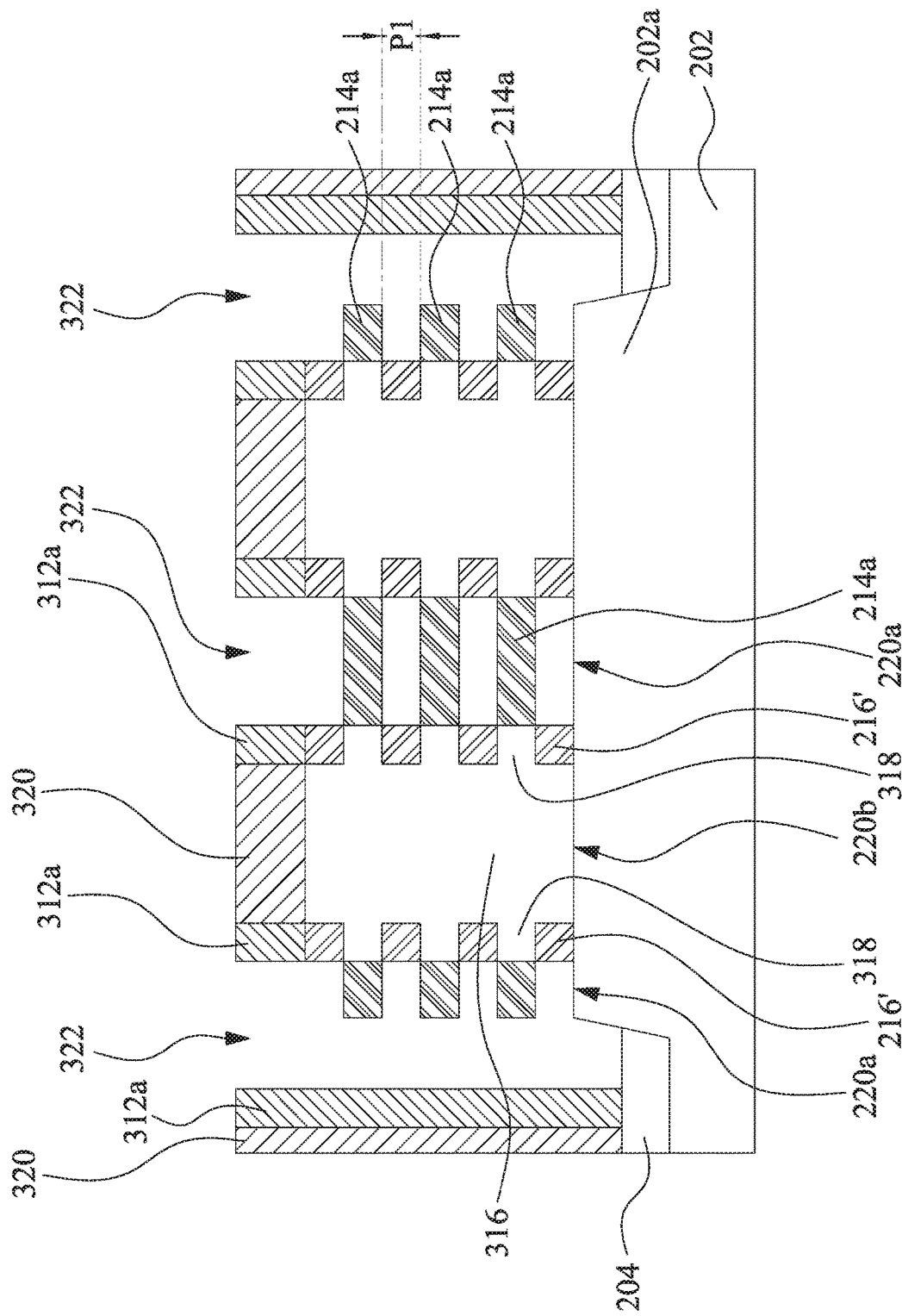
Figure 12C:
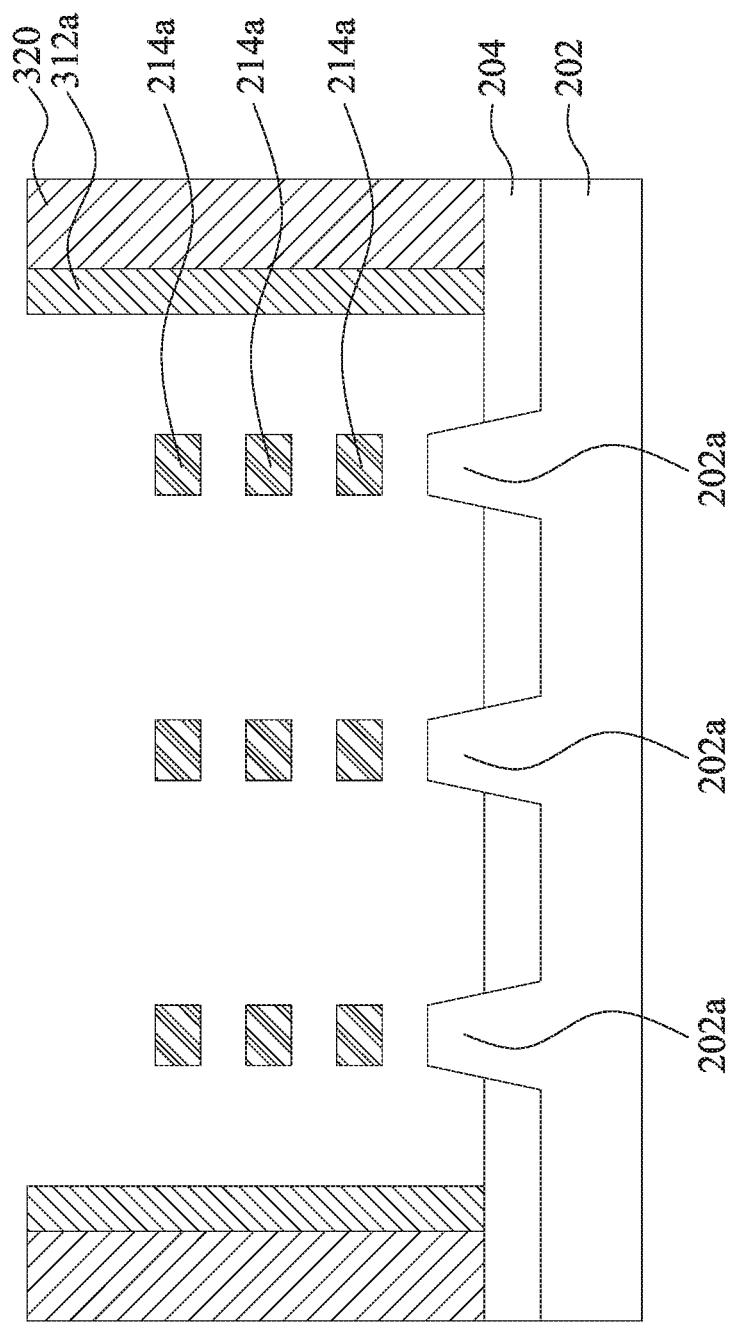

Reference is made to FIGS. 12A-12C. After planarization, the dummy gate structures 310 and the first portions 212a of the sacrificial layers 212 (shown in FIGS. 11B and 11C) are removed to form gate trenches 314, but the spacers 312 and the first portions 214a of the nanowires 214 remain. The dummy gate electrode layer 304 and the gate dielectric layer 302 are removed by suitable process, leaving spaces between the gate spacers 312a. The channel regions 220a of the fins 220 are then exposed from the gate trenches 314, while the epitaxy structures 316 are still under the coverage of the interlayer dielectric layer 320.

Then, after the removal of the dummy gate structures 310, the first portions 212a (shown in FIGS. 11B and 11C) of the sacrificial layers 212 are removed. As shown in FIG. 12A, the first portions 212a of the top sacrificial layers 212 are removed, leaving the underlying nanowire 214 exposed. The first portions 212a of the sacrificial layers 212 between the nanowires 214 are also removed. The first portions 214a of the nanowires 214 are released from the fins 220 and spaced apart from each other. The first portions 214a of the nanowires 214 are not flanked by the sacrificial layer 212 anymore.

After the removal of the first portions 212a of the sacrificial layers 212, spaces are left between the nanowires 214. The pitch $P_1$ between the nanowires 214 are determined by the thickness of the sacrificial layer 212 shown in FIGS. 11B and 11C. The first portions 214a of the nanowires 214 suspend over one another without making contact. The pitch P1 between the nanowires 214 reflects where the first portions 212a of the sacrificial layers 212 use to stand. For example, if the sacrificial layer 212 has a thickness of 8 nm, after the removal of the first portions 212a of the sacrificial layers 212, the pitch P1 is measured of about 8 nm. The pitch P1 has pivotal effect in the nanowire 214 configuration at the channel regions 220a. Furthermore, when the removing the first portions 214a of the nanowires 214, the source/drain spacers 216' avoid unwanted etching on the epitaxy structures 316.

Figure 13A:
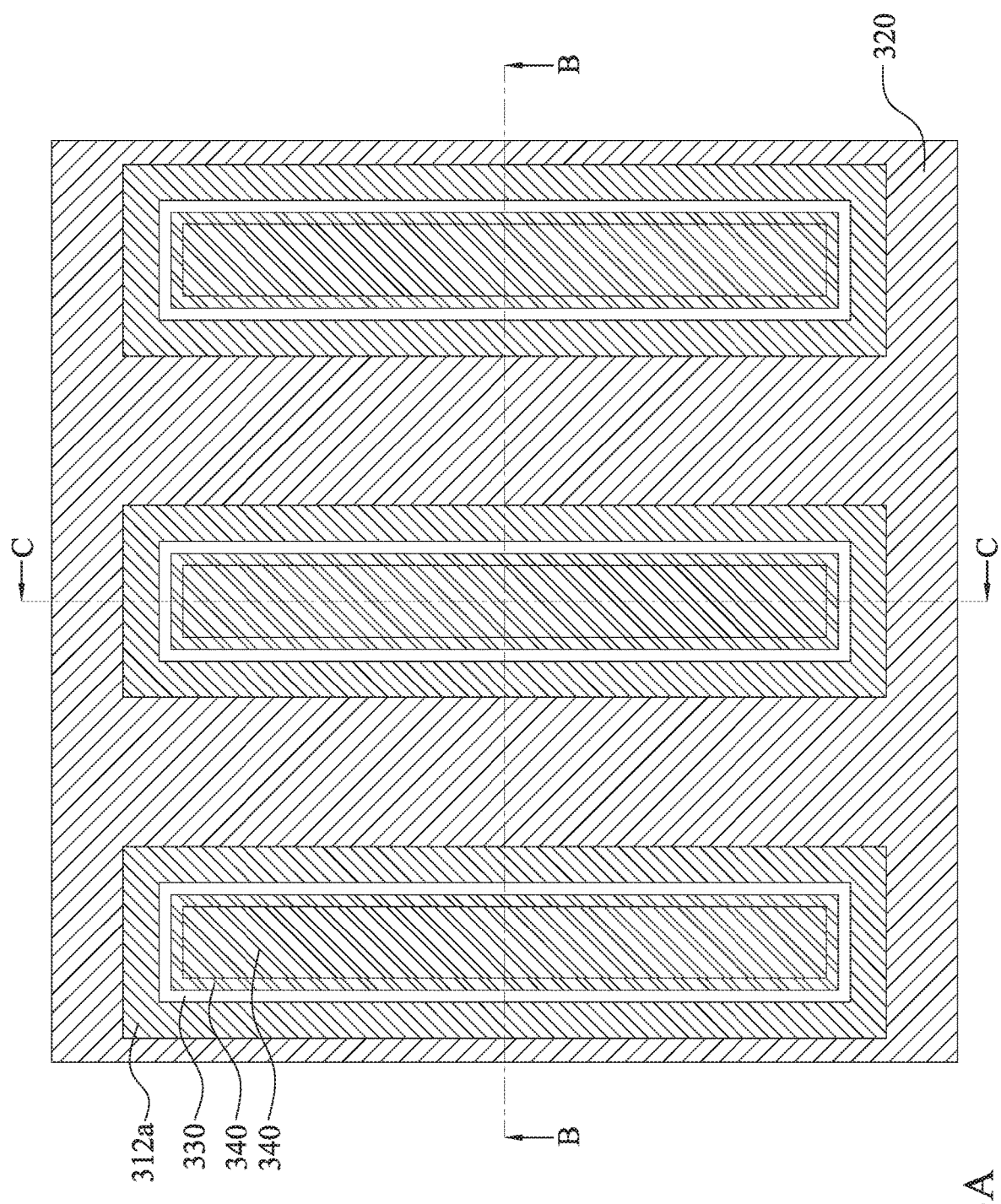
Figure 13B:
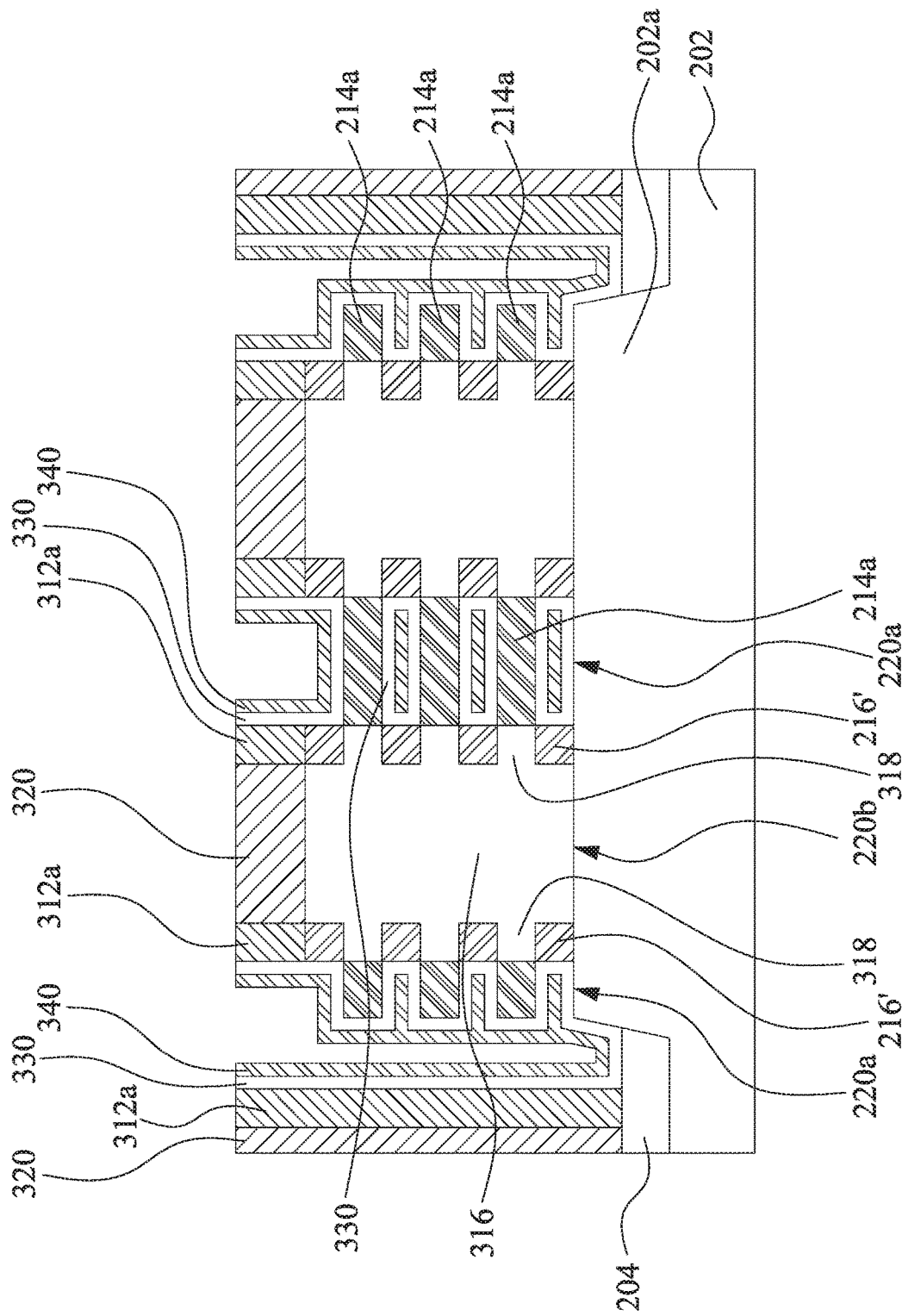
Figure 13C:
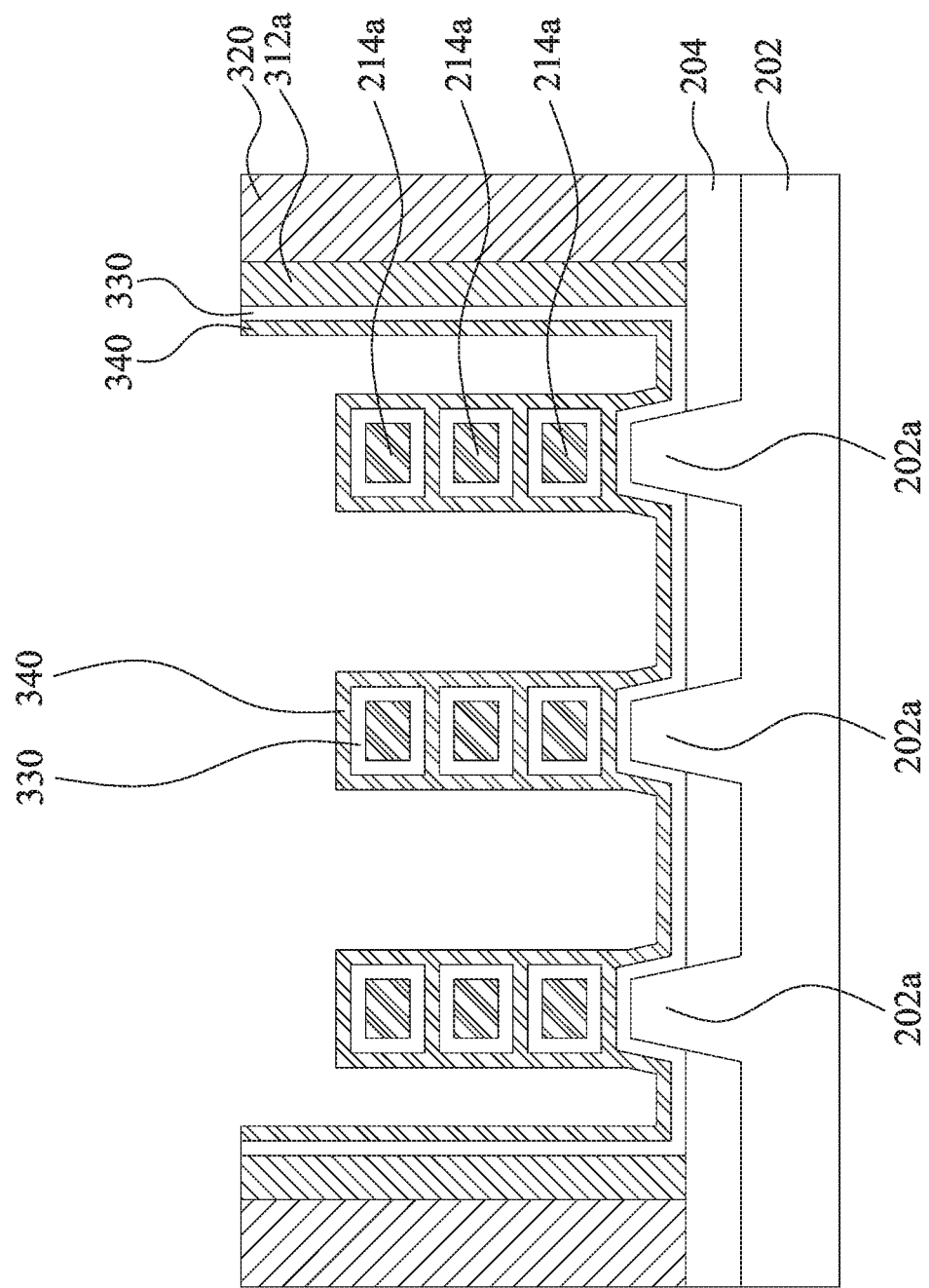

Reference is made to FIGS. 13A-13C. A high-k gate dielectric layer 330 (can also referred to as an interlayer dielectric layer) and a work function metal layer 340 are formed on the first portions 214a of the nanowires 214 to fill the gate trench 322. As shown in FIG. 13B, the high-k gate dielectric layer 330 is a thin layer formed on the exposed surfaces including the sidewalls of the gate spacers 312a and first portions 214a of the nanowires 214. Specifically, the high-k gate dielectric layer 330 is in contact with the source/drain spacers 216' and covers the first portions 214a of the nanowires 214. As shown in FIG. 13C, the high-k gate dielectric layer 330 wraps around the first portions 214a of each of the nanowires 214. The surface of the isolation structures 204 and the protruded portions 202a of the semiconductor substrate 202 are also covered by the high-k gate dielectric layer 330. Spaces between the first portions 214a of the nanowires 214 are still left after the deposition of the high-k gate dielectric layer 330. The high-k gate dielectric layer 330 includes a material such as hafnium oxide ($HfO_2$), zirconium oxide ($ZrO_2$) or lanthanum oxide ($La_2O_3$). The high-k gate dielectric layer 330 may be formed by suitable deposition processes, for example, chemical vapor deposition (CVD), plasma enhanced chemical vapor deposition (PECVD), atomic layer deposition (ALD), evaporation, physical vapor deposition (PVD), chemical solution deposition, or other like processes. The thickness of the high-k gate dielectric layer 330 may vary depending on the deposition process as well as the composition and number of the high-k gate dielectric layer 330 used.

Then, a work function metal layer 340 is formed. The work function metal layer 340 may be disposed over the high-k gate dielectric layer 330, and till up the spaces between the nanowires 214a replacing the first portions 212a of the sacrificial layers 212. The type of work function metal layer 340 depends on the type of transistor. That is, the work function metal layer 340 may include p-type work function metal materials and n-type work function metal materials. P-type work function materials include compositions such as ruthenium (Ru), palladium (Pd), platinum (Pt), cobalt (Co), nickel (Ni), and conductive metal oxides, or any combination thereof. N-type metal materials include compositions such as hafnium (Hf), zirconium (Zr), titanium (Ti), tantalum (Ta), aluminum (Al), metal carbides (e.g., hafnium carbide (HfC), zirconium carbide (ZrC), titanium carbide (TiC), and aluminum carbide ($Al_4C_3$)), aluminides, or any combination thereof. The work function metal(s) may be deposited by a suitable deposition process, for example, chemical vapor deposition (CVD), plasma-enhanced chemical vapor deposition (PECVD), physical vapor deposition (PVD), plating, thermal or e-beam evaporation, and sputtering. For example, the work function metal layer 340 may include materials such as titanium nitride (TiN) or tantalum nitride (TaN).

Figure 14A:
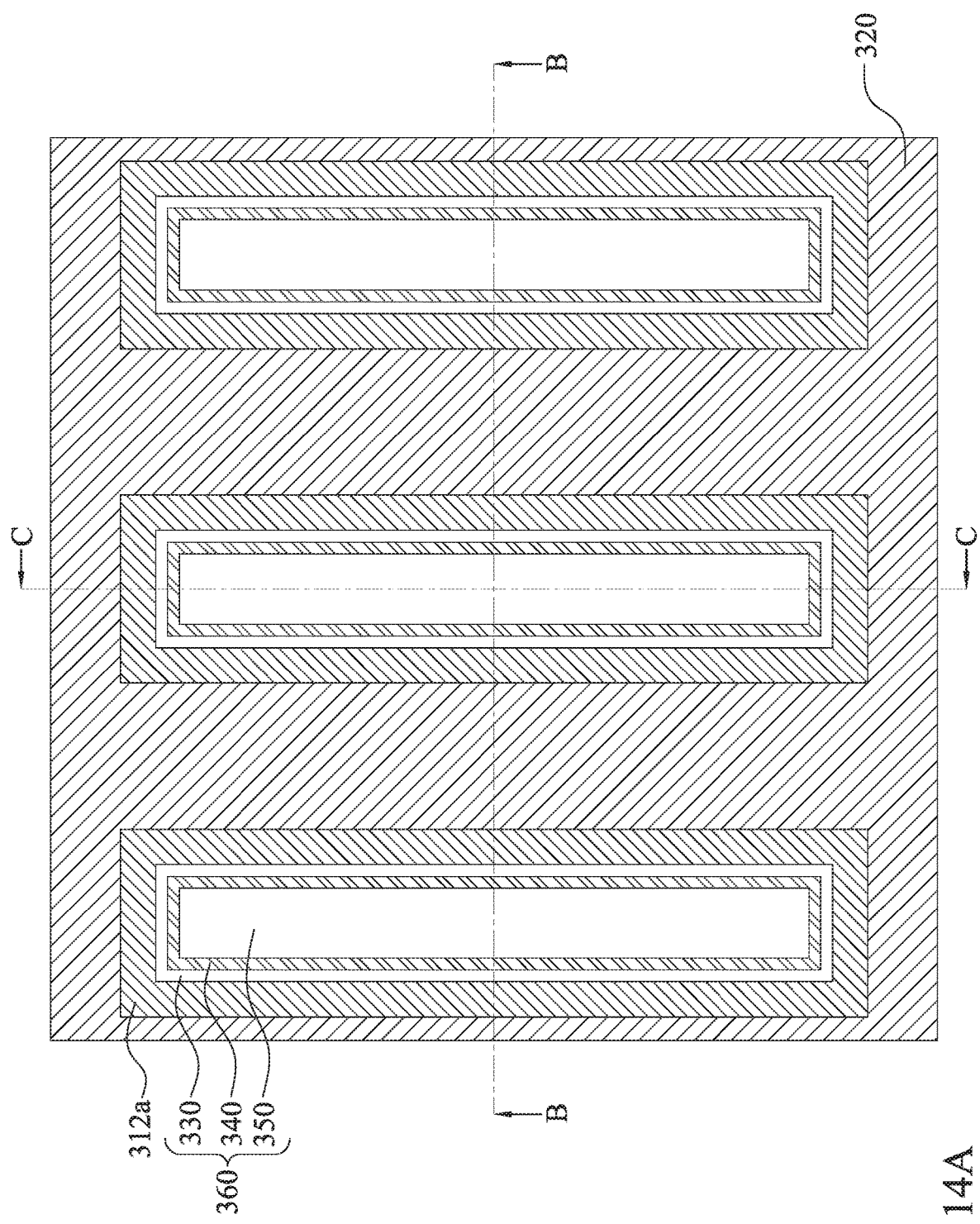
Figure 14B:
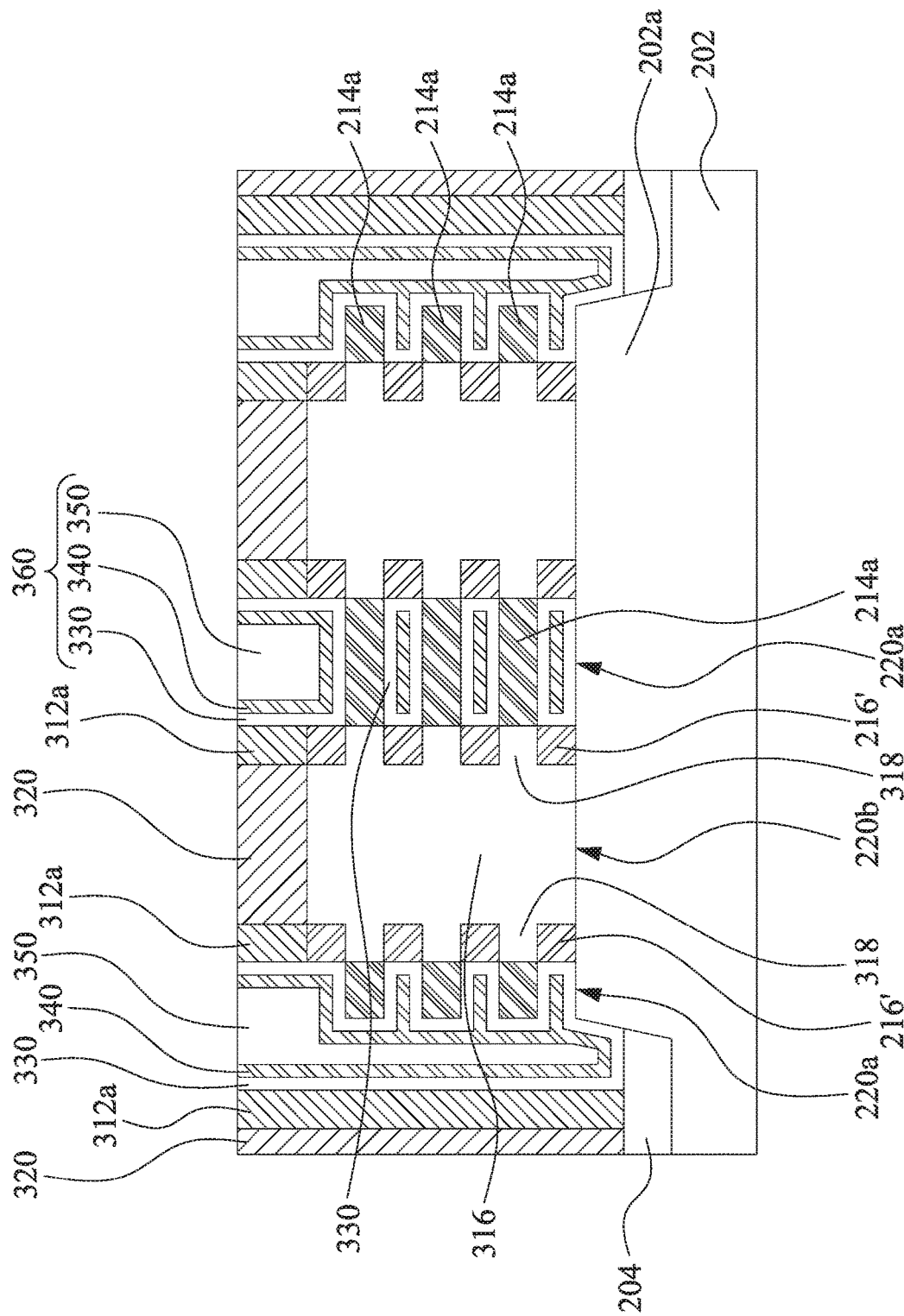
Figure 14C:
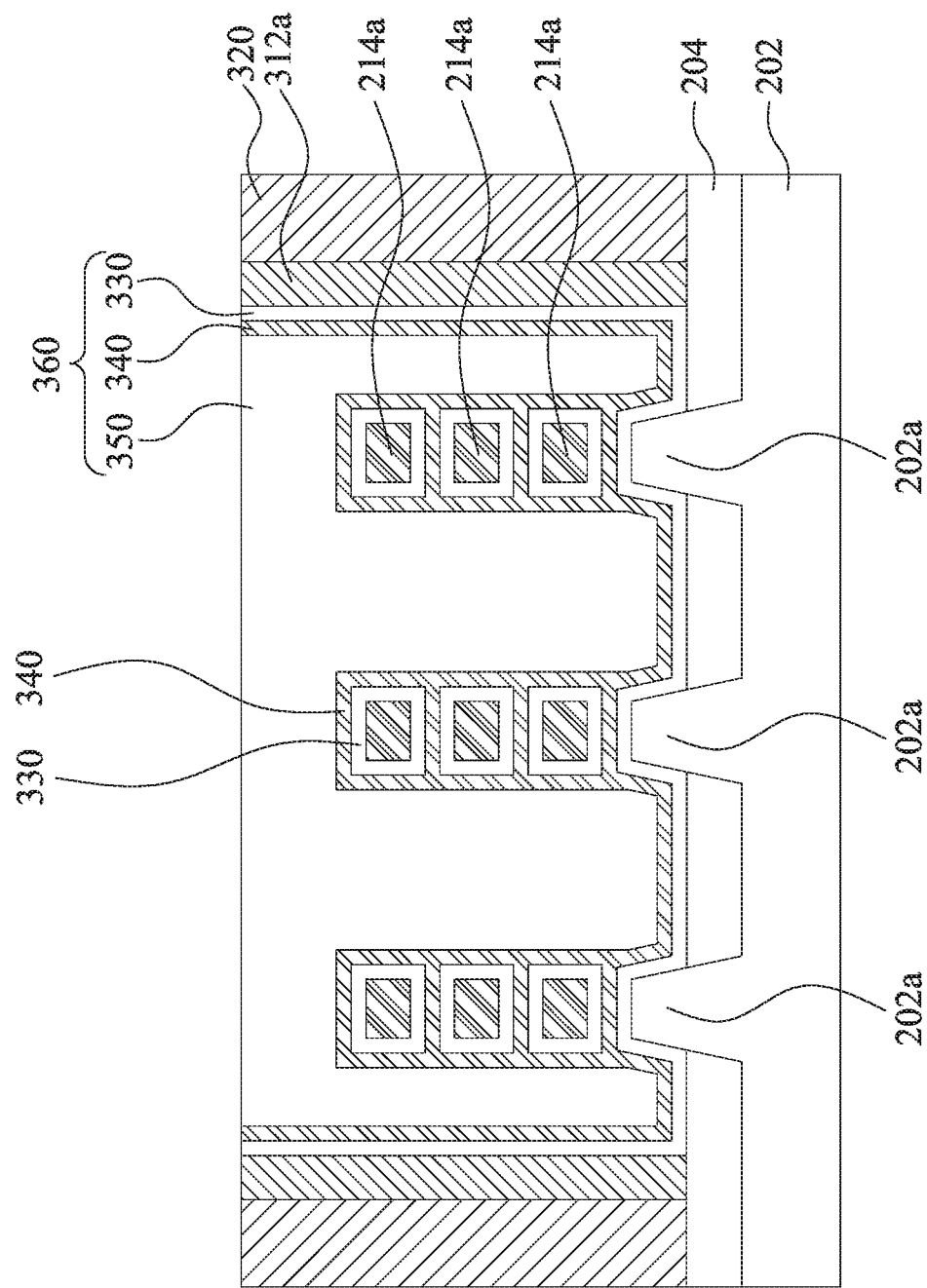

Reference is made to FIGS. 14A-14C. A gate electrode 350 is formed. The gate electrode 350 is deposited over the high-k gate dielectric layer 330 and the work function metal layer 340 to form the gate structures 360. As shown in FIG. 14C, the gate electrode 350 fills up the spaces surrounding the nanowires 214, thereby completely wrapping around the first portions 214a of the nanowires 214. In other words, the nanowires 214 extend through the gate structures 360. The gate structures 360 replace the dummy gate structures 310. Furthermore, the source/drain spacers 216' are in contact with and protrude from the gate structures 360, and are separated from the first portions 214a of the nanowires 214 by the gate structures 360. The source/drain spacer 216' is disposed between the epitaxy structure 316 and the gate structures 360.

The gate electrode 350 may include conductive material, such as, aluminum (Al), platinum (Pt), gold (Au), tungsten (W), titanium (Ti), or any combination thereof. The gate electrode 350 may be deposited by a suitable deposition process, for example, chemical vapor deposition (CVD), plasma-enhanced chemical vapor deposition (PECVD), physical vapor deposition (PVD), plating, thermal or e-beam evaporation, and sputtering. A planarization process, for example, chemical mechanical planarization (CMP), is performed to polish the surface of the conductive gate metal and form the gate structures 360.

Figure 15A:
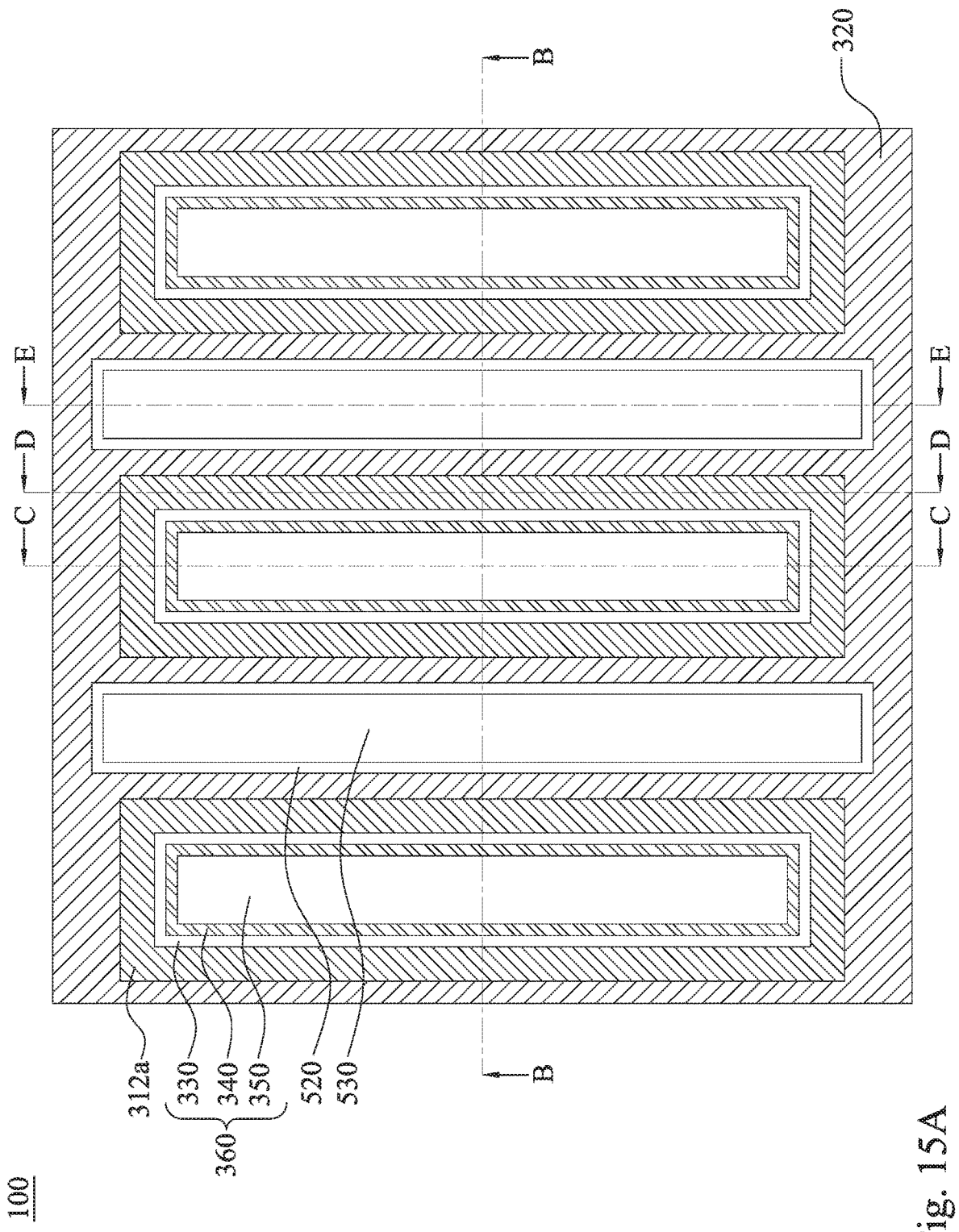
Figure 15B:
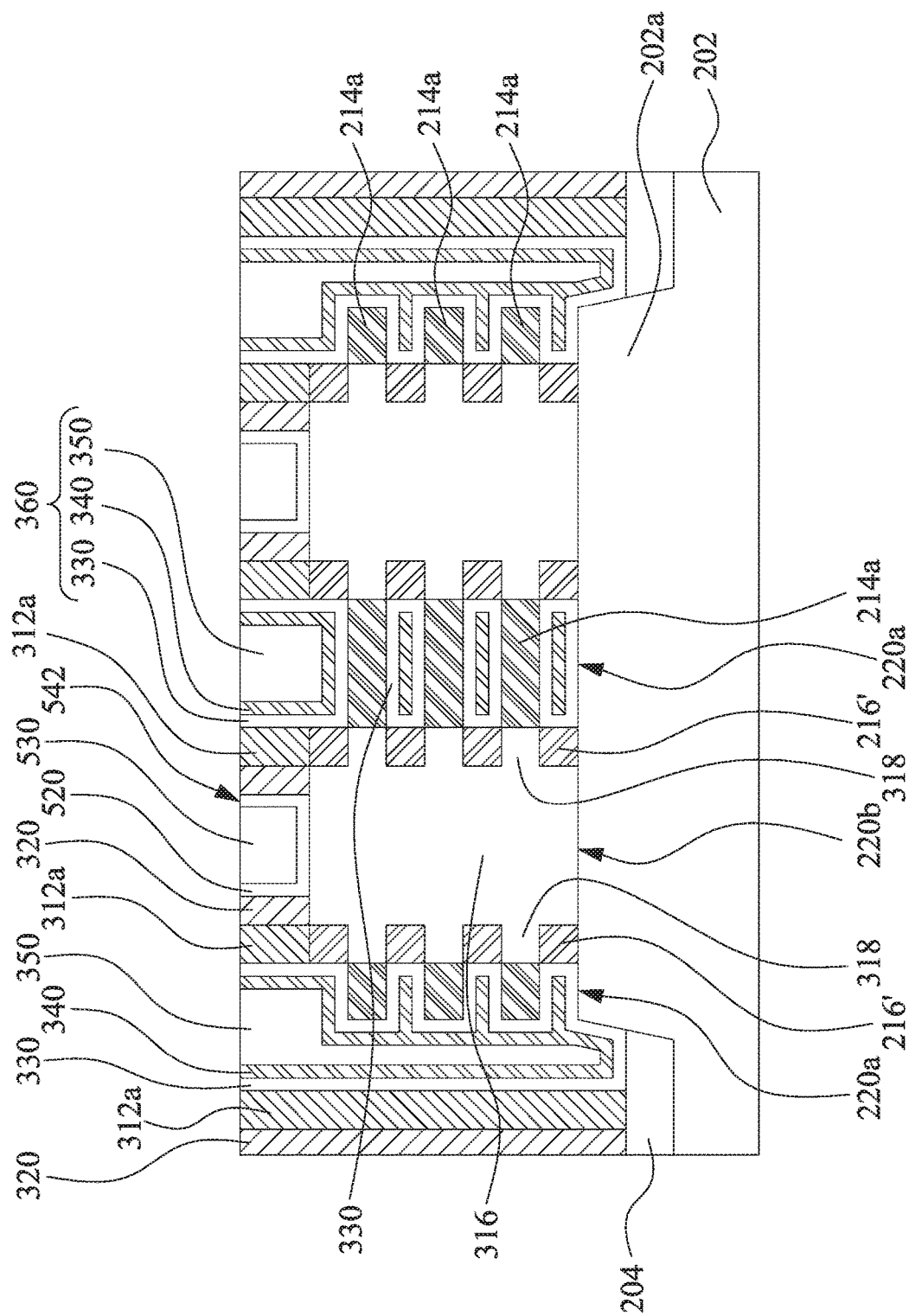
Figure 15C:
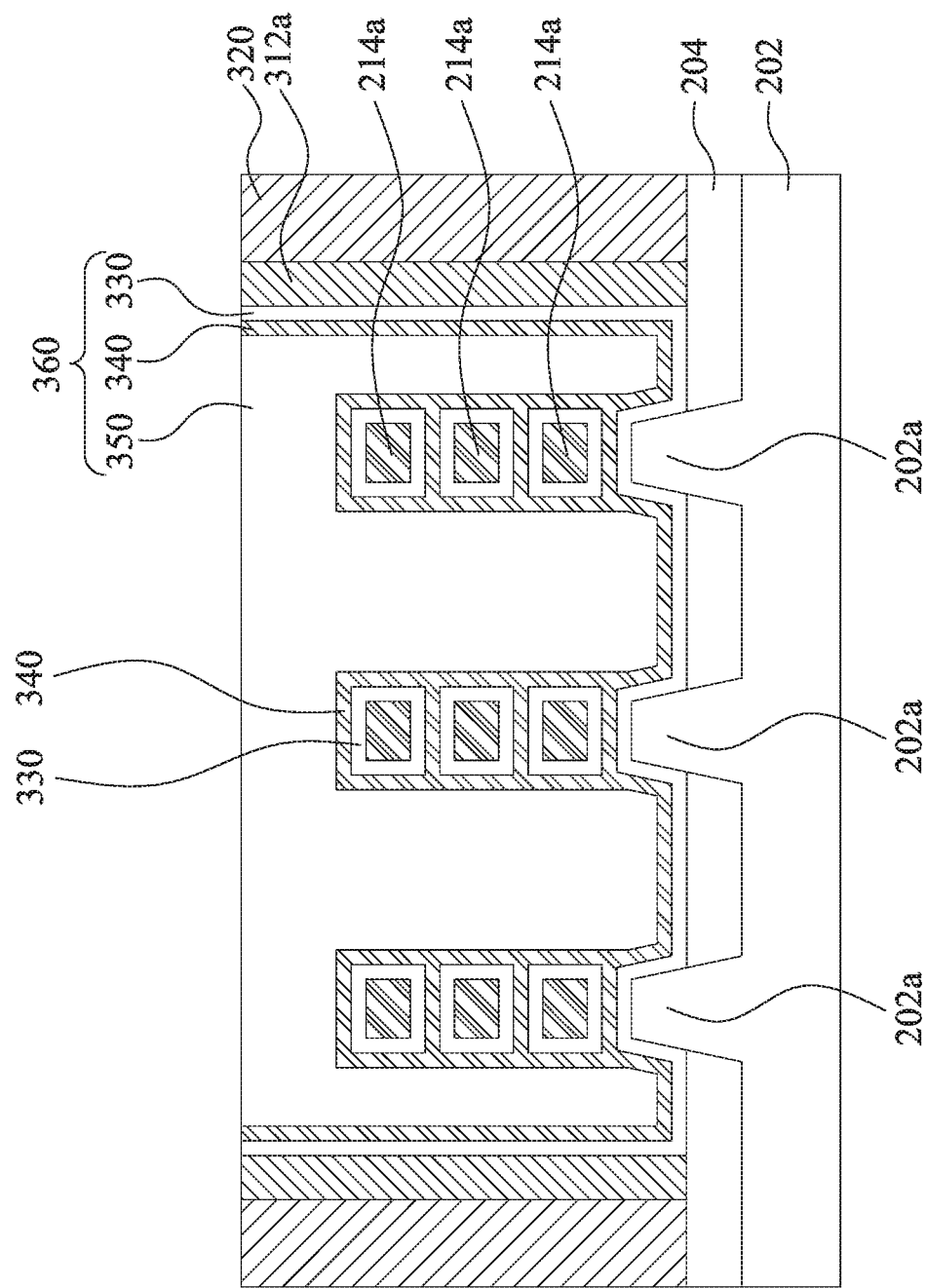
Figure 15D:
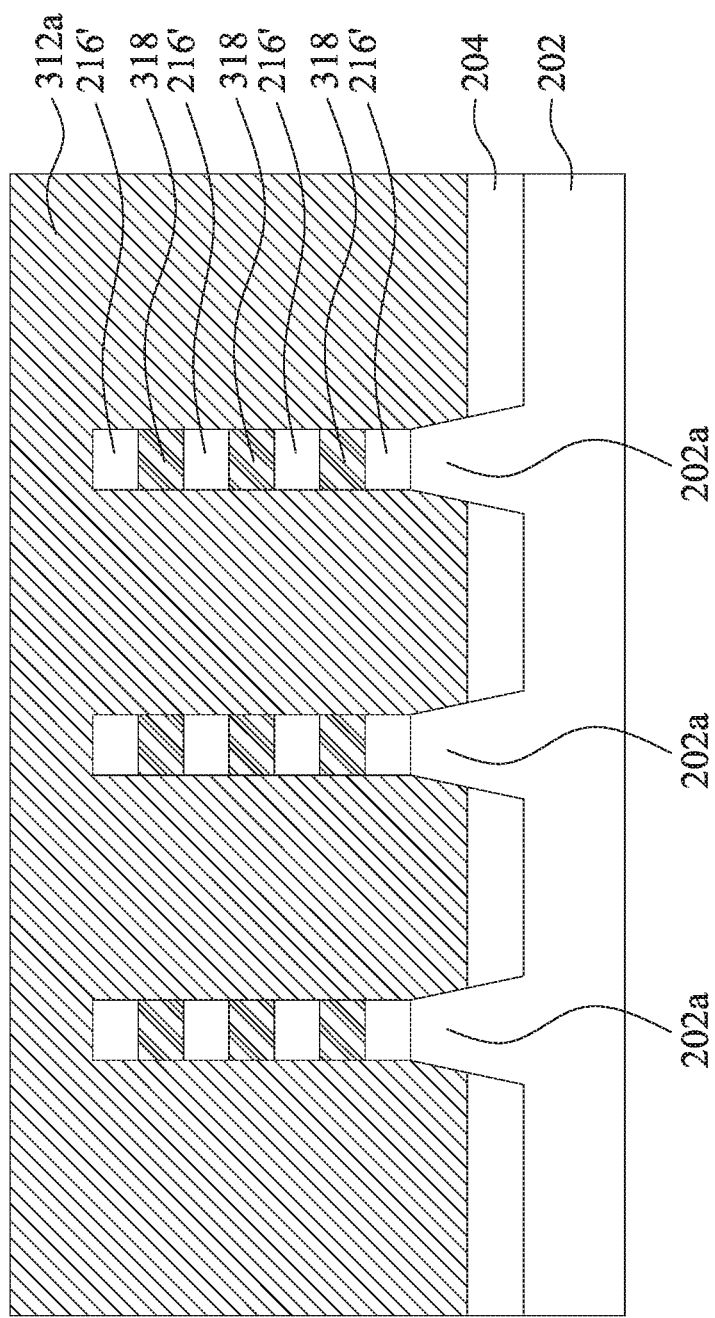
FIGS. 15D and 15E are cross-sectional views along sections D-D and line E-E in FIG. 15A respectively.
Figure 15E:
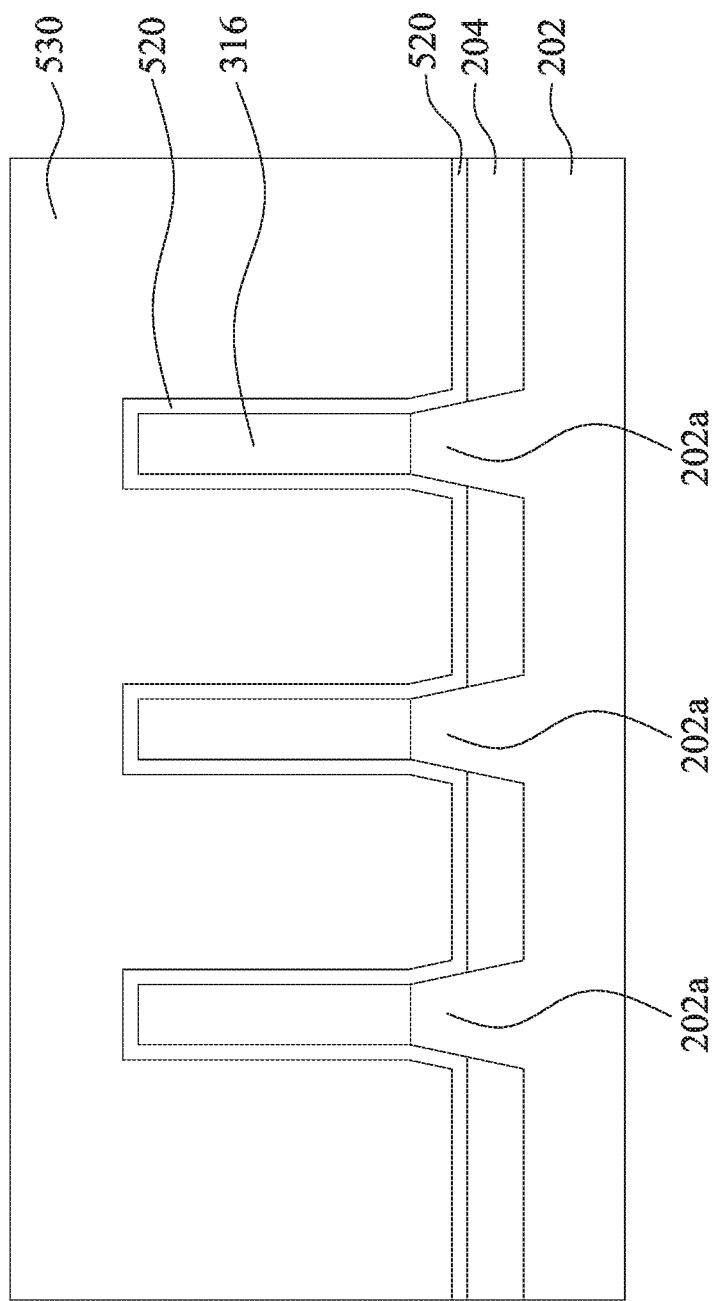

Reference is made to FIGS. 15A-15C. FIG. 15A is a top view of the local semiconductor device 100. FIGS. 15B and 15C are cross-sectional views taken along sections B-B and C-C in FIG. 15A respectively. A plurality of contact openings 542 are formed in the interlayer dielectric layer 320, and the contact openings 542 respectively expose the epitaxy structures 316. A plurality of contacts are respectively formed in the contact openings 542. In some embodiments, the contact includes a work function metal layer 520 and a metal layer 530 formed on the work function metal layer 520. The work function metal layer 520 is deposited in the contact openings 542 and formed on a top surface of the epitaxy structures 316. Subsequently, the metal layer 530 is formed on the work function metal layer 520 and fills in the contact openings 542 shown in FIGS. 15A and 15B.

Reference is made to FIGS. 15D and 15E. FIGS. 15D and 15E are cross-sectional views along sections D-D and line E-E in FIG. 15A respectively. The source/drain spacers 216' are disposed between the protruding portions 318 of the epitaxy structures 316, and surrounded by the gate spacers 312a as shown in FIG. 15D. Furthermore, the epitaxy structures 316 are conformally covered by the work function metal layer 520, and disposed on and in contact with the protruded portions 202a of the semiconductor substrate 202 as shown in FIG. 15E.

Some other illustrative embodiments for forming a local semiconductor device 400 at various stages of fabrication in accordance with some embodiments of the present disclosure will be described below with reference to FIGS. 16A-23E. The structures illustrate operations which may be used in the process of forming the local semiconductor device 100. FIGS. 16A-23A are top views of the local semiconductor device 400 at various stages of fabrication in accordance with some embodiments of the present disclosure. FIGS. 16B-23B are cross-sectional views along lines A-A in FIGS. 16A-23A respectively. FIGS. 16C-23C are cross-sectional views along lines B-B in FIGS. 16A-23A respectively. FIGS. 23D and 23E are cross-sectional views along line D-D and line E-E in FIG. 23A respectively.

Figure 16A:
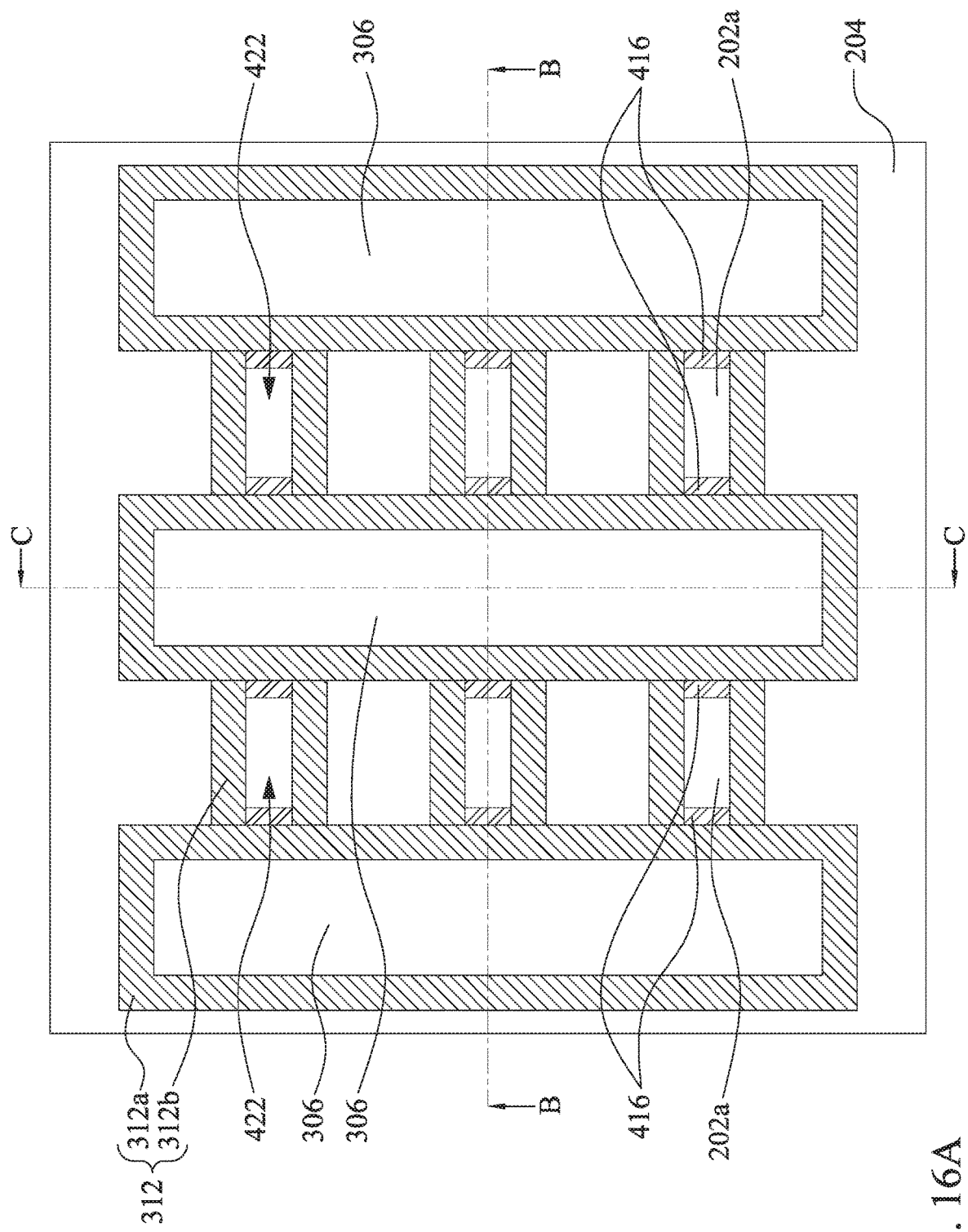

It should be pointed out that operations for forming the local semiconductor device 400 before the structure shown in FIG. 16 are substantially the same as the operations for forming the local semiconductor device 100 shown in FIGS. 1A-5C, and the related detailed descriptions may refer to the foregoing paragraphs and are not discussed again herein. The differences between the present embodiment and the embodiment in FIGS. 16A-23E are that operations of forming source/drain spacers.

Figure 16B:
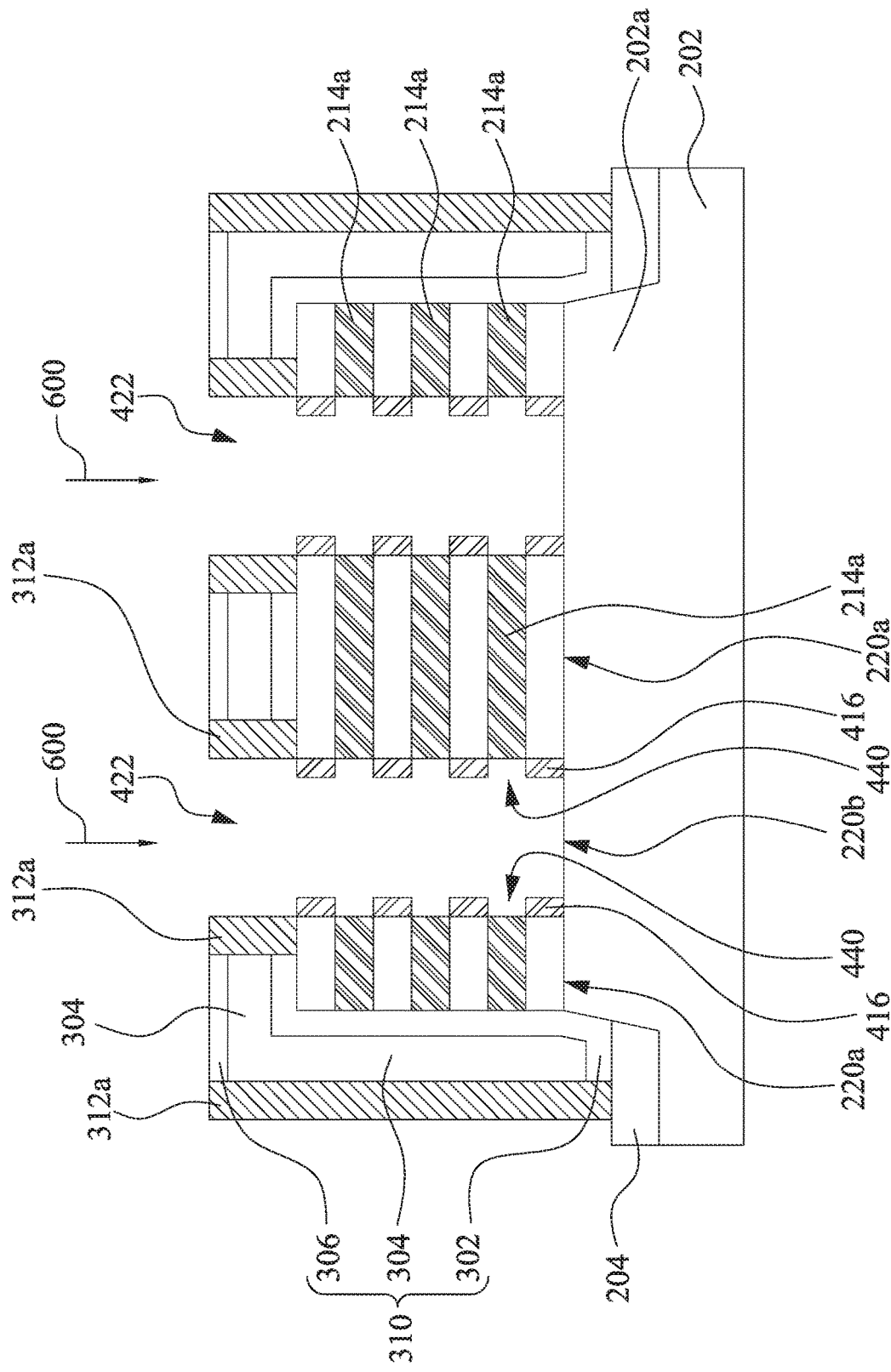
Figure 16C:
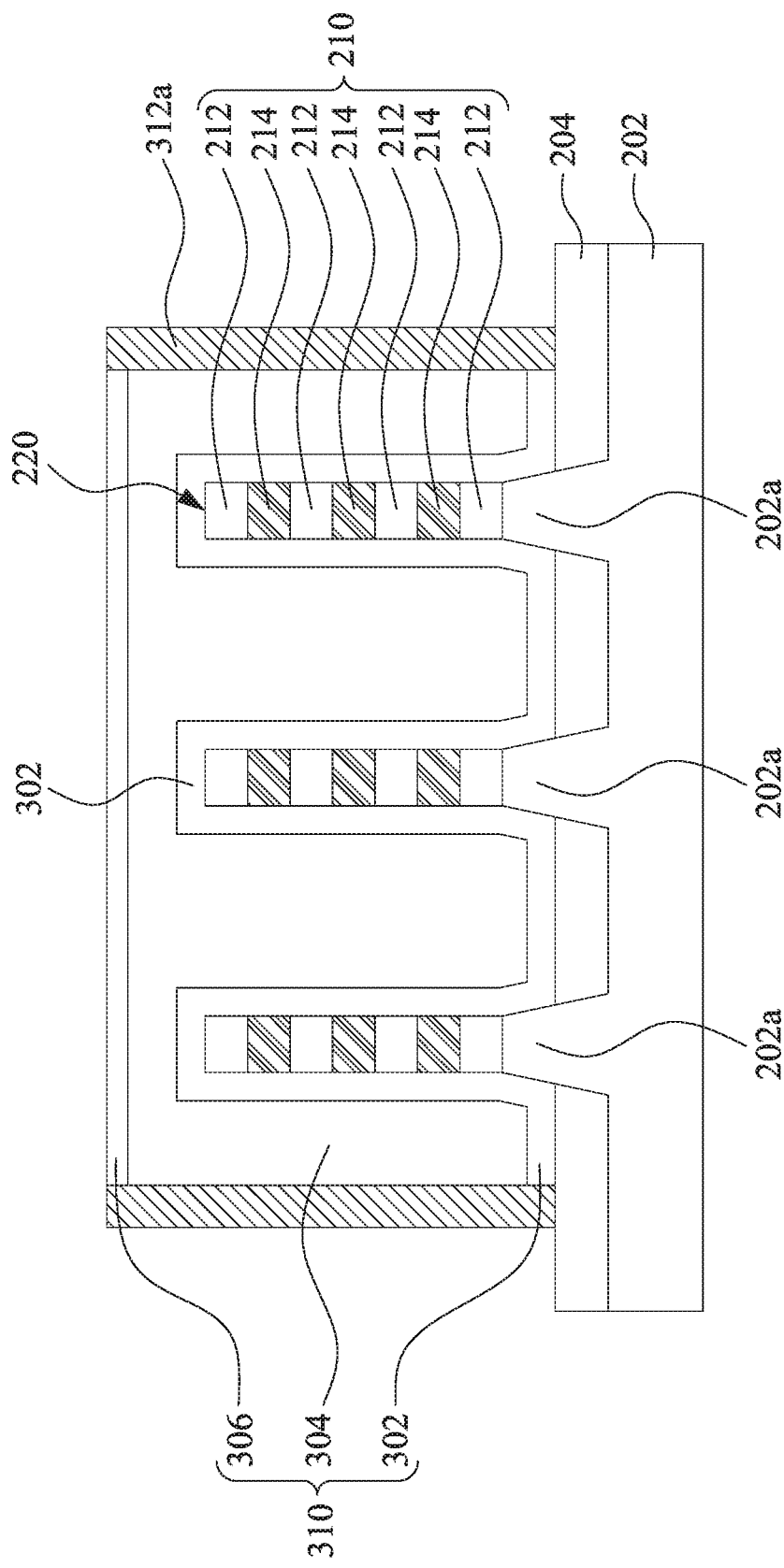

Reference is made to FIGS. 16A-16C. After the recessing of the fins 220 (see FIG. 5B), the channel regions 220a of the fins 220 exposed from the contact openings 422 are performed by an atomic layer chemical vapor deposition (ALD) process 600. Specifically, the ALD process 600 is conducted in an ALD $H_2O$ pulse with a duration $t_1$ followed by $N_2$ purge with a duration $t_2$. In some embodiments, the duration $t_1$ has a range from about 0.1 second to about 5 seconds, the duration $t_2$ has a range from about 0.1 second to about 5 seconds, but the instant disclosure is not limited thereto. The ALD process 600 may be performed on the exposed channel regions 220a to form selective oxide formations as source/drain spacers 416. For example, the first portions 212a are made of a material, such as, SiGe, and the first portions 214a are made of a material, such as, Ge/Si. The atomic layer deposition (ALD) process 600 may be performed on the first portions 212a to form SiGeOx as the source/drain spacers 416, but without forming oxide formations on the first portions 214a of the exposed channel regions 220a.

As such, after the forming of the source/drain spacers 416, at least one recess 440 is formed between adjacent two of the source/drain spacers 416, and beneath the gate spacers 312a. For example, there are a plurality of recesses 440 in FIG. 16B. The source/drain spacers 416 remain suspended on the dummy gate structures 310. In other words, the source/drain spacers 416 protrude from sidewalls of the dummy gate structures 310 beneath the gate spacers 312a to form the recesses 440. The first portions 214a of the nanowires 214 are exposed from the recesses 440.

Figure 17A:
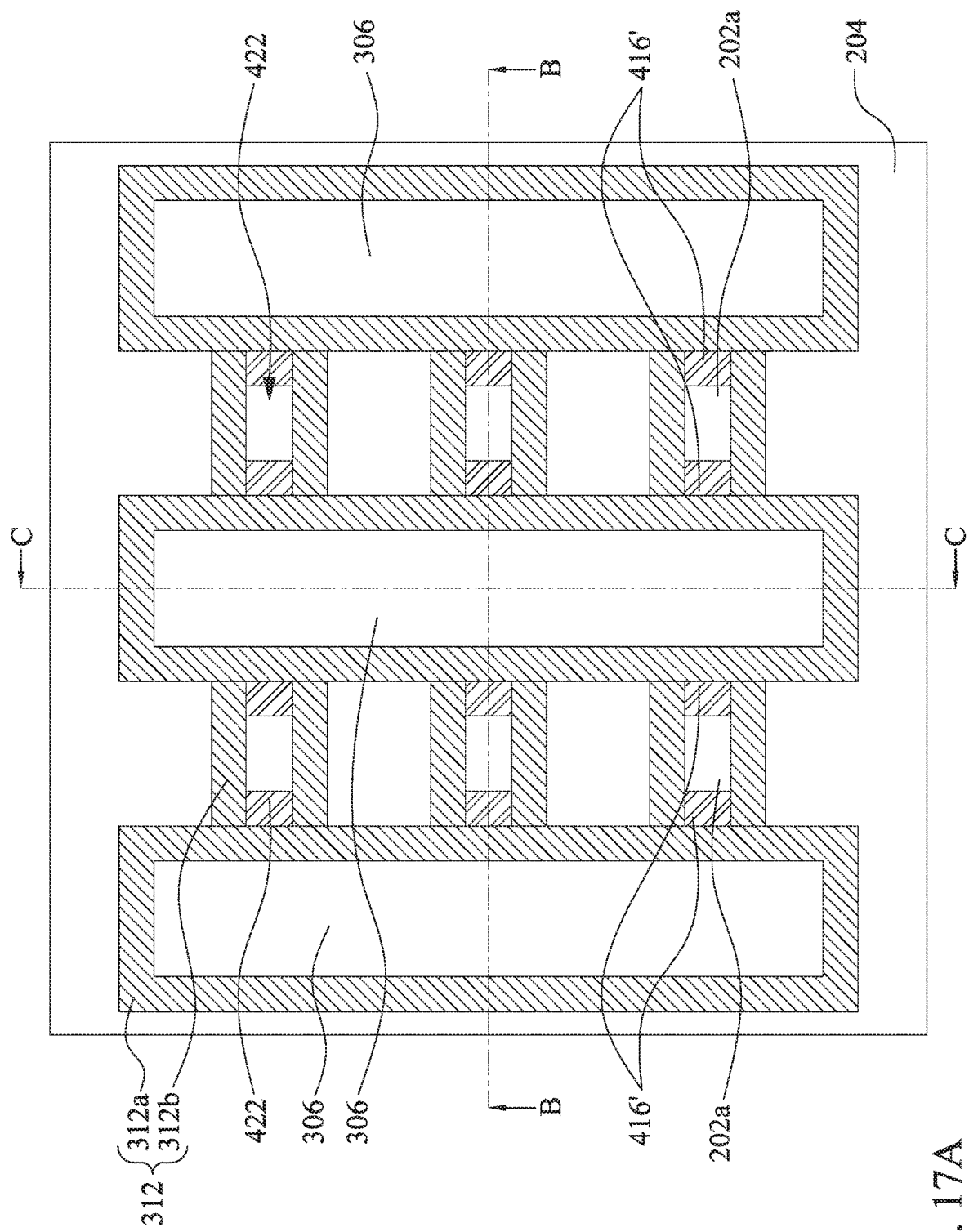
Figure 17B:
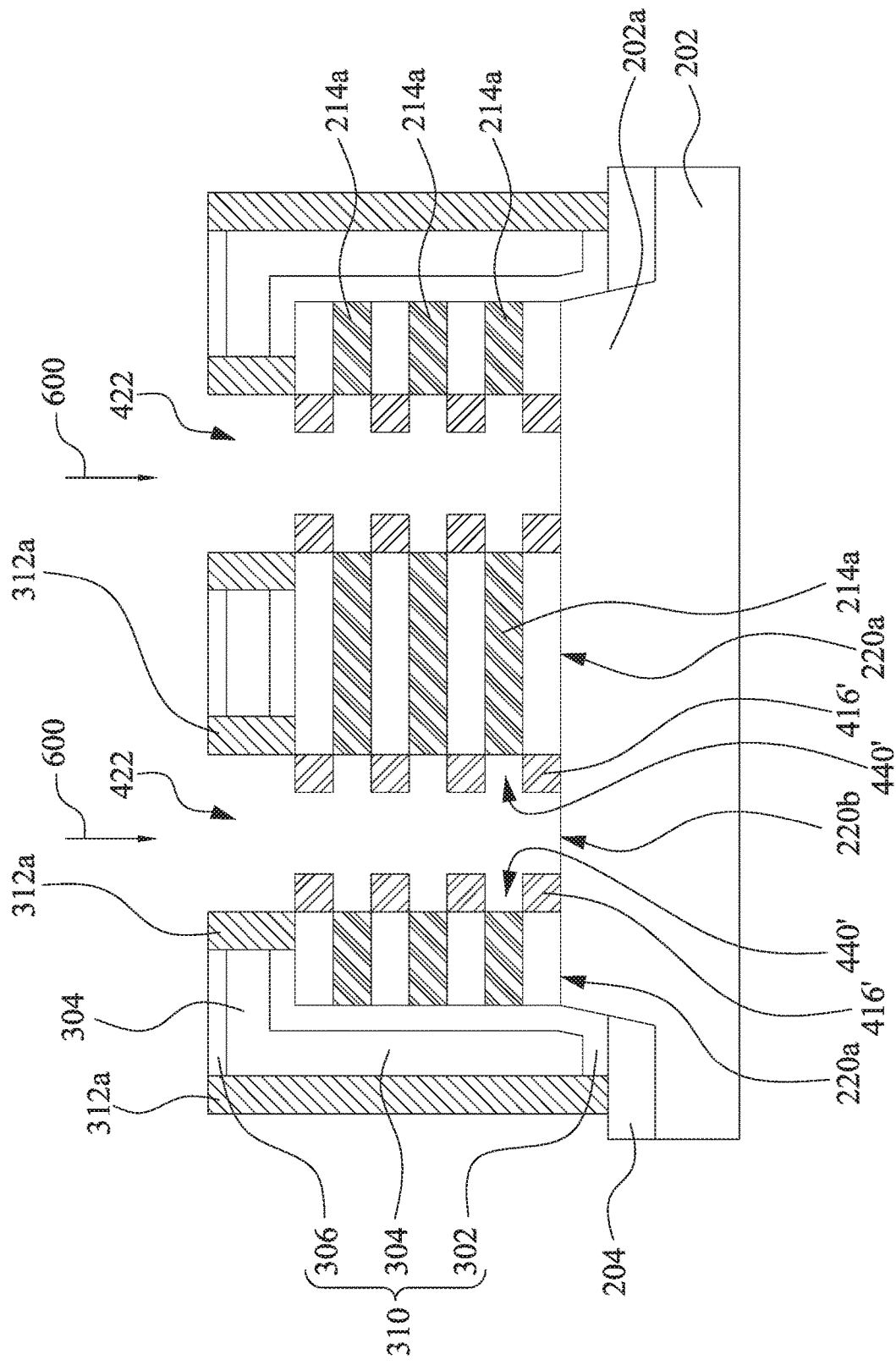
Figure 17C:
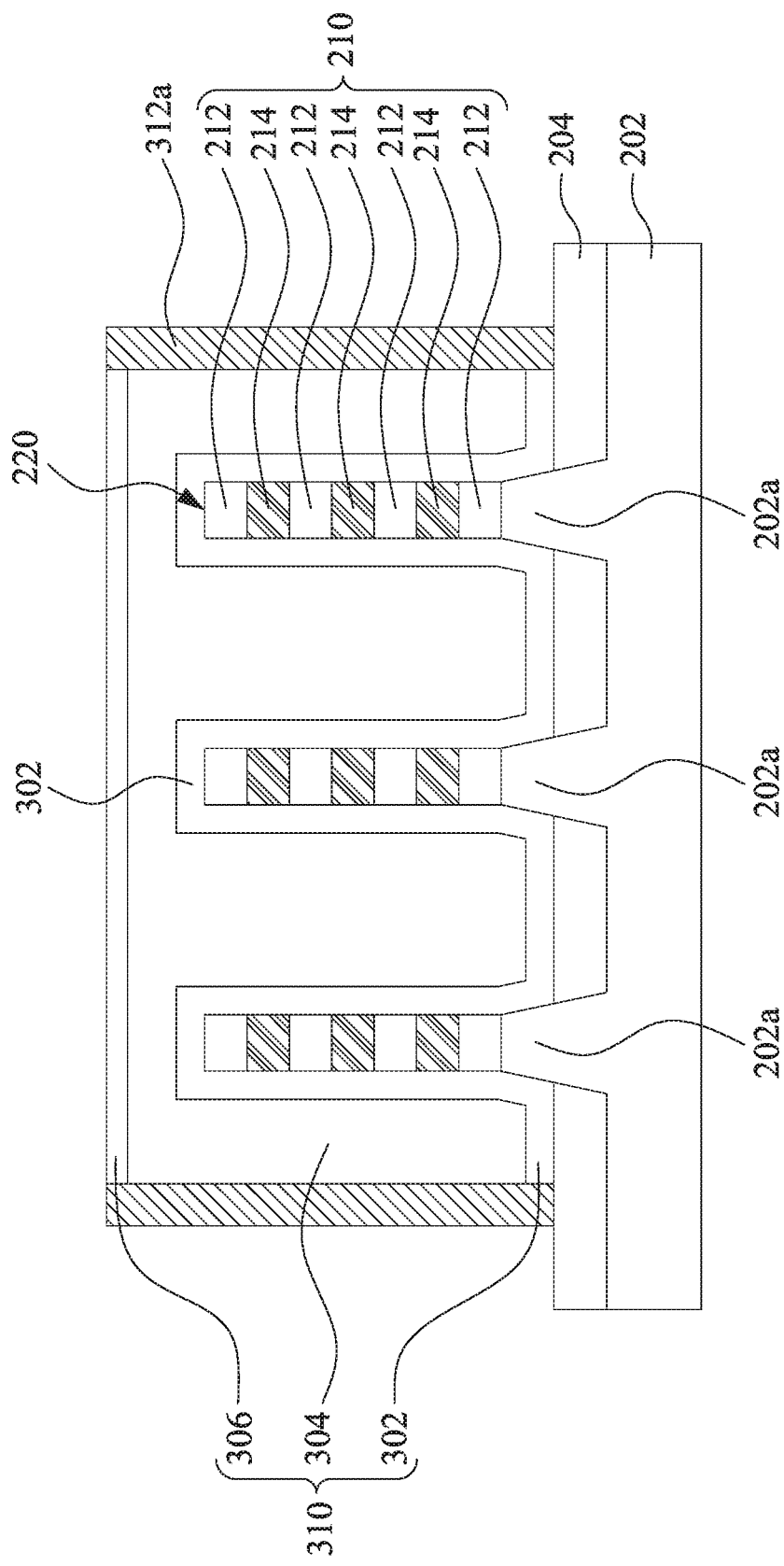

Reference is made to FIGS. 17A-17C. In the case, the channel regions 220a are performed on a single multi-cycle ALD process 600. That is, the source/drain spacers 416' on the first portions 214a are formed by repeated ALL) process 600 to achieve a predetermined thickness thereof. Relatively, the first portions 214a of the exposed channel regions 220a are without forming oxide formations thereon. As such, after the forming of the source/drain spacers 416', at least one recess 440' is formed between adjacent two of the source/drain spacers 416', and beneath the gate spacers 312a. For example, there are a plurality of recesses 440' in FIG. 17B. In some embodiments, the width of the source/drain spacers 416' may be about 2 nm to 10 nm, and the instant disclosure is not limited thereto. In other words, the source/drain spacers 416' protrude from sidewalls of the dummy gate structures 310 beneath the gate spacers 312a to form the recesses 440'. The first portions 214a of the nanowires 214 are exposed from the recesses 440'.

In the single multi-cycle ALD process 600 of the source/drain spacer formation, it can ensure the thickness of source/drain spacers achieve designed thickness, and has a good control for widths of the source/drain spacers. In some embodiments of the instant disclosure, the ALD process 600 for the source/drain spacers may substantially be 20 cycles to 200 cycles, but the present disclosure is not limited thereto. As a result, the thickness of the source/drain spacers can be controlled in cycle times of the ALD process 600. Specifically, the thickness of the source/drain spacers 416' is larger than that of the source/drain spacers 416 shown in FIG. 16B. The first portions 214a of the exposed channel regions 220a are without forming oxide formations thereon, and therefore the first portions 214a of the nanowires 214 can be exposed from the recesses 440' or 440 between the source/drain spacers 416' or 416 and not cover by the oxide. Furthermore, the formation of the source/drain spacers 416' can be conducted in a self-aligned process, but no lithography process is required.

Figure 18A:
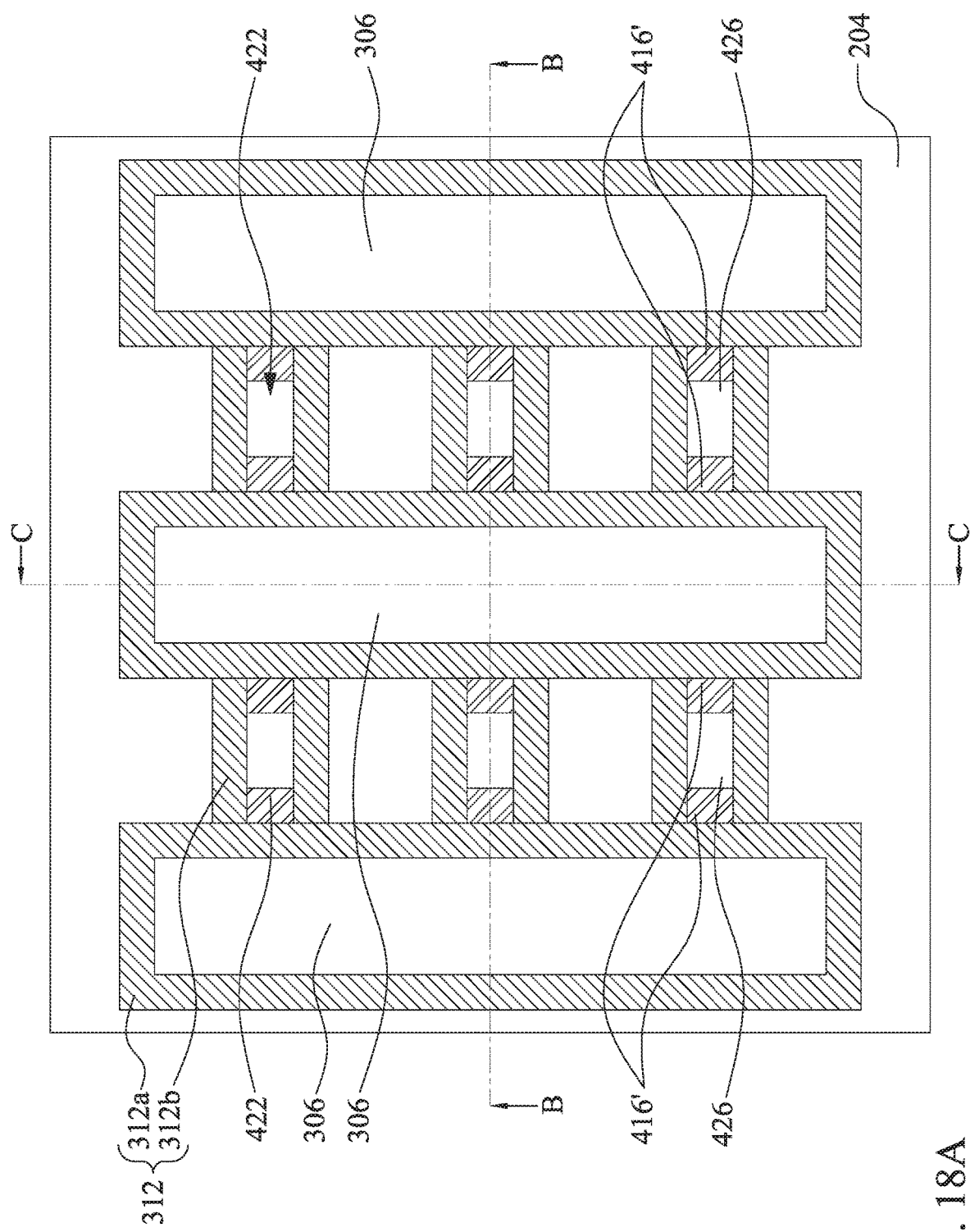
Figure 18B:
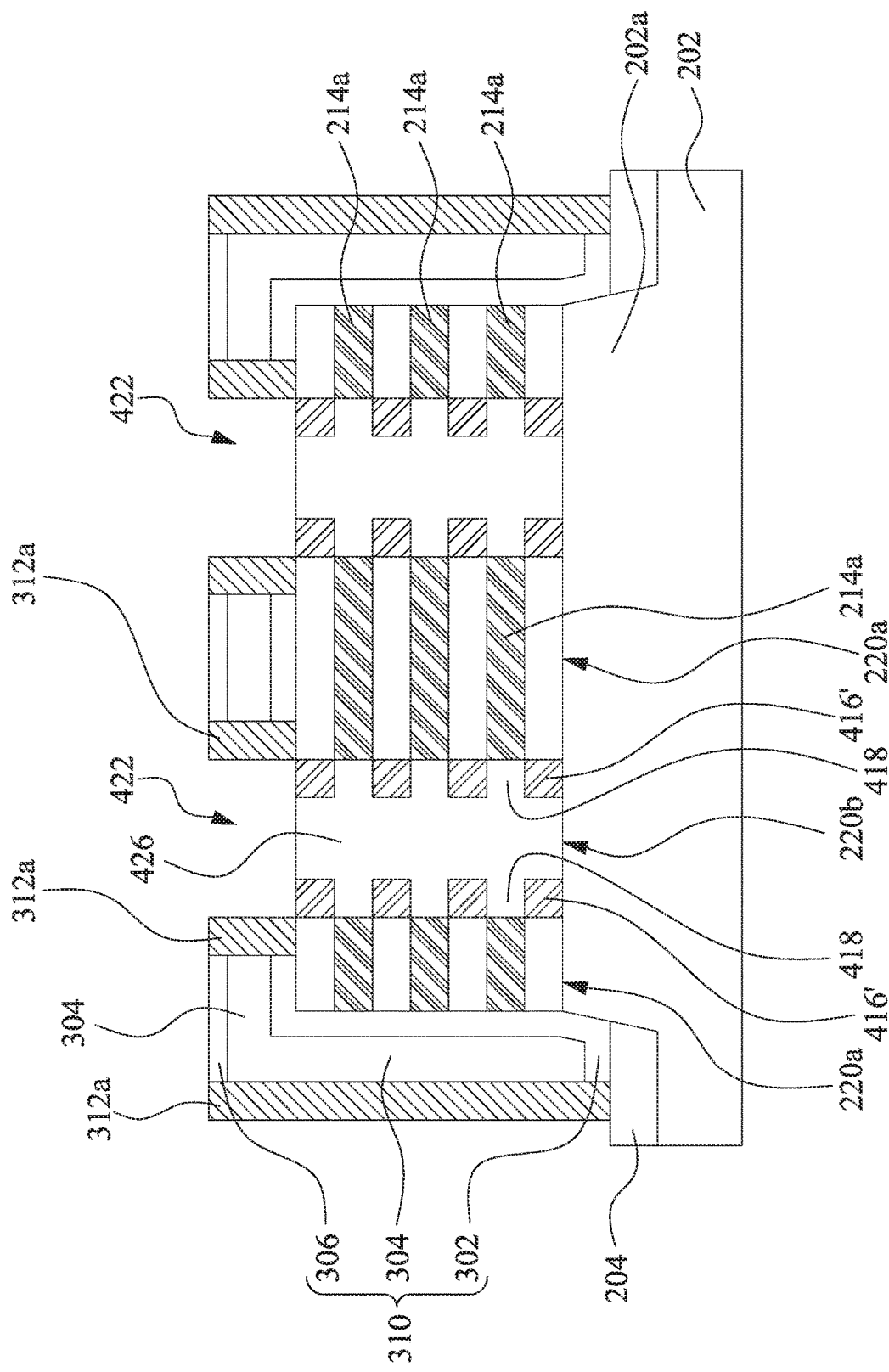
Figure 18C:
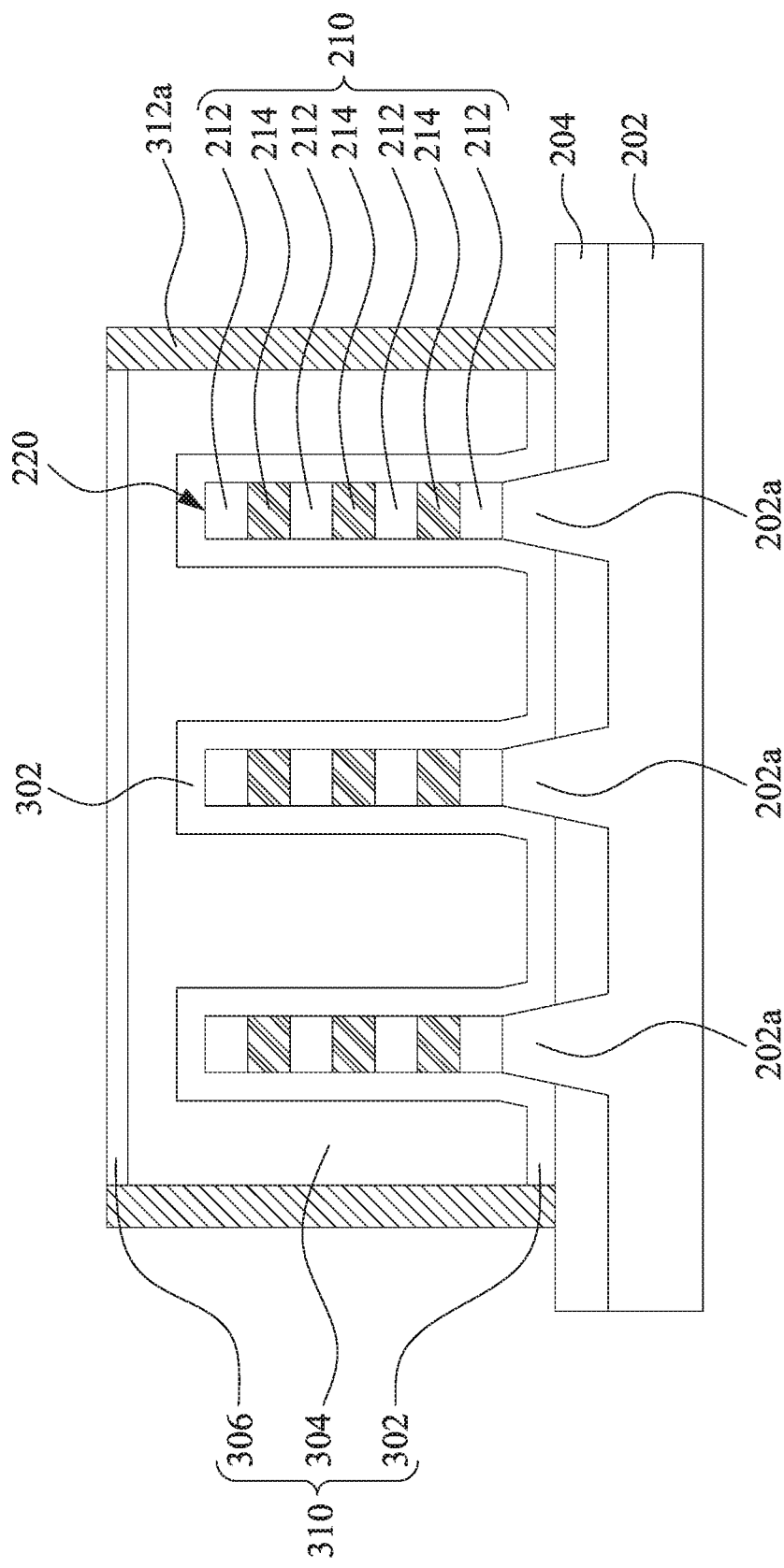

Reference is made to FIGS. 18A-18C. Epitaxy structures 426 are formed in the openings 422 by, for example, an epitaxial growth process as source/drain regions. The epitaxial growth process is performed on exposed parts of the first portions 214a of the nanowires 214, and performed on exposed parts of the protruded portions 202a of the semiconductor substrate 202. Therefore, the epitaxy structures 426 are formed between the channel regions 220a, further formed in the recesses 440' of channel regions 220a, and in contact with the protruded portions 202a. More specifically, the epitaxy structures 316 have protruding portions 418 embedded in (or being protruding into) the recesses 230' of channel regions 220a and disposed between the gate spacer 312a and the source/drain spacers 416'. Furthermore, the protruding portion 418 is disposed between and extends pass two of the source/drain spacers 416' and is in contact with the first portions 214a of the nanowires 214. In other words, the source/drain spacers 416' and the protruding portions 418 are arranged in an alternating manner. On the other hand, the source/drain spacers 416' are disposed between the epitaxy structure 426 and the dummy gate structure 310, are embedded in the epitaxy structure 426, and are in contact with opposite sidewalls of the epitaxy structure 426. Therefore, the source/drain spacers 416' are separated from the first portions 214a of the nanowires 214 by the epitaxy structures 426.

With such configuration, the epitaxy structures 426 are positioned such that subsequent etching processes that remove the first portions 212a of the sacrificial layer 212 during device fabrication do not also damage the epitaxy structures 426. That is, the epitaxy structures 426 are configured to be separated from the first portions 212a of the sacrificial layer 212 at least by the source/drain spacers 416' and the first portions 214a of the nanowires 214, such that parasitic capacitance between the epitaxy structures 426 and gate under such multi-stack nanowire devices will be reduced.

Figure 19A:
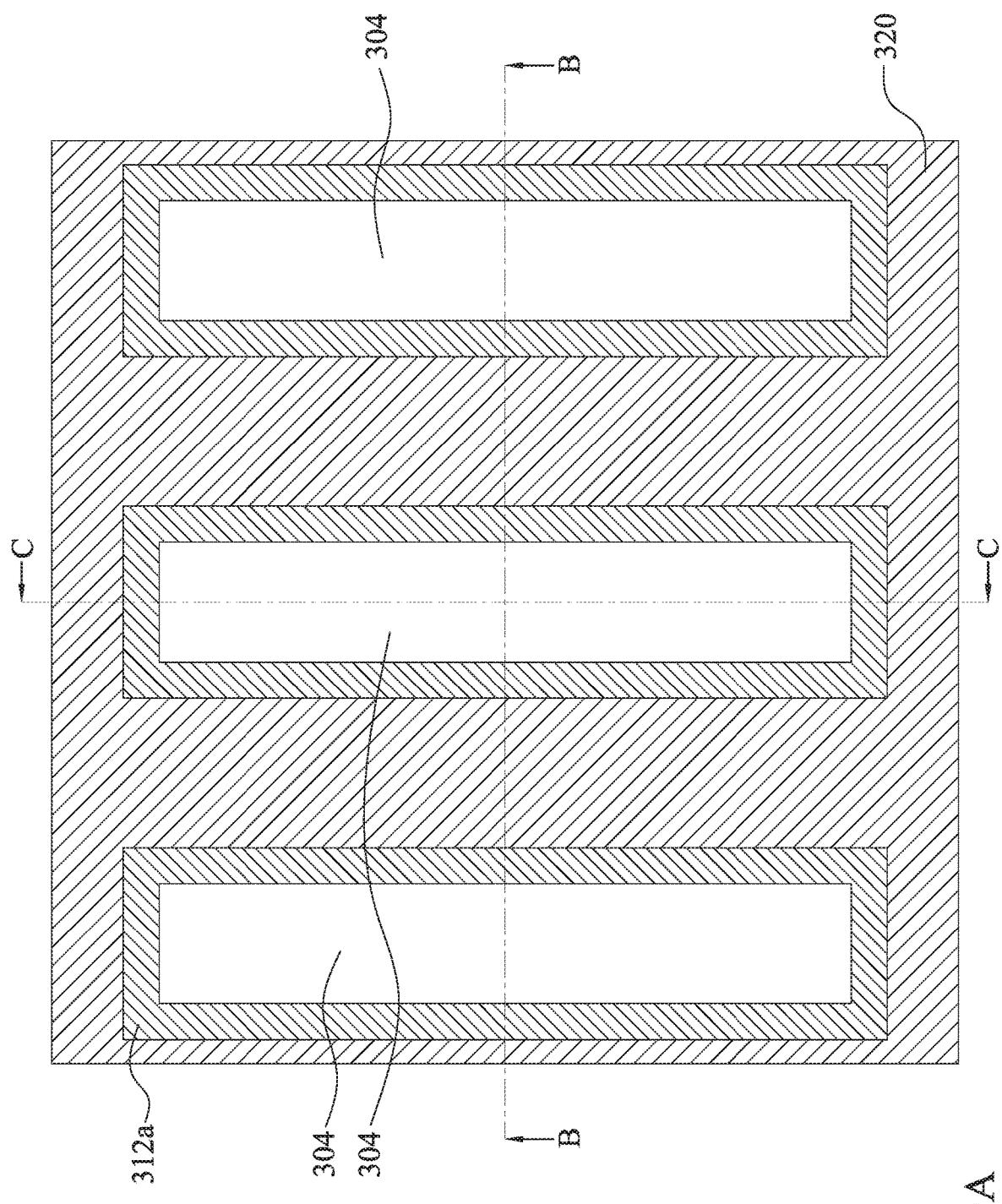
Figure 19B:
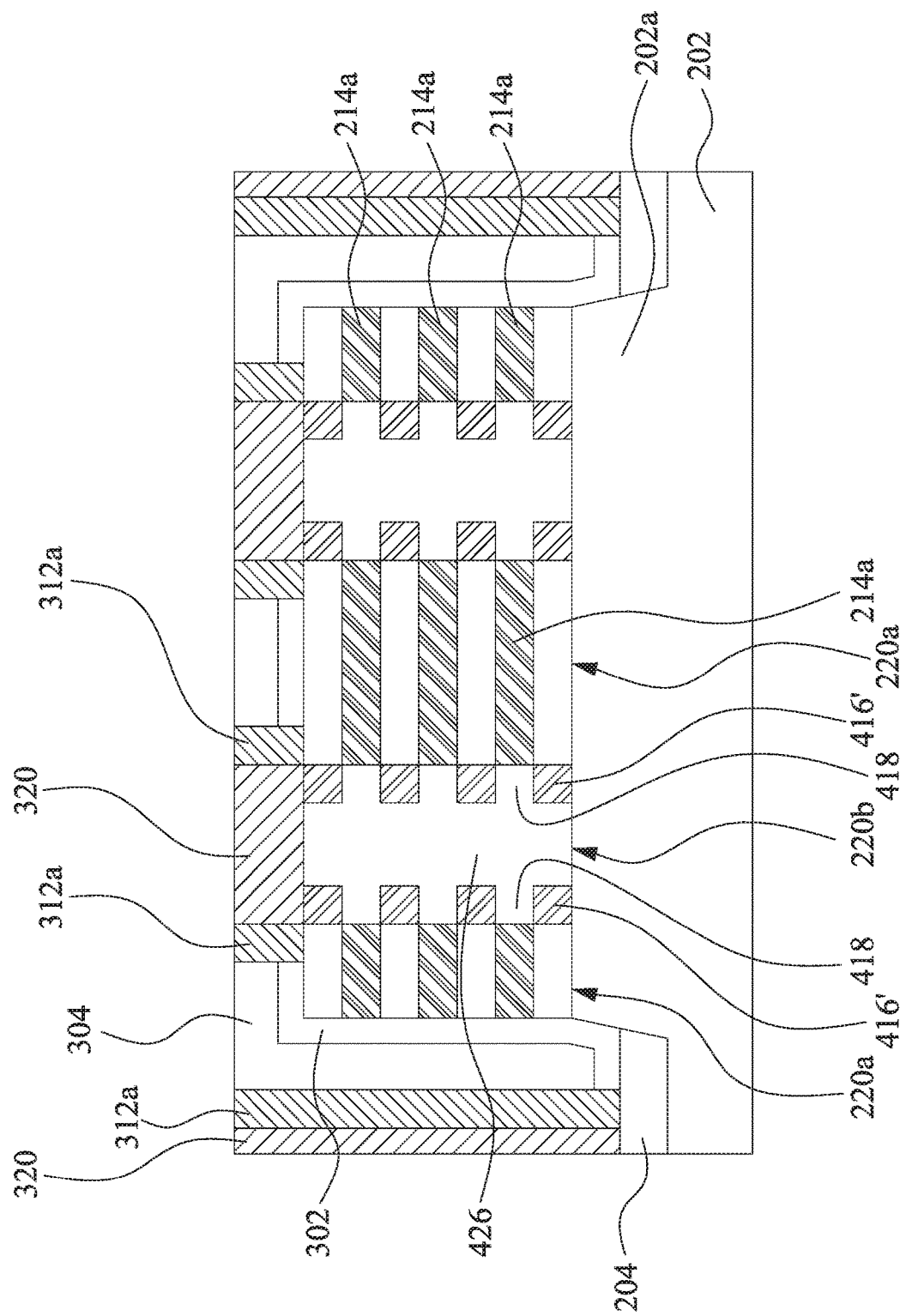
Figure 19C:
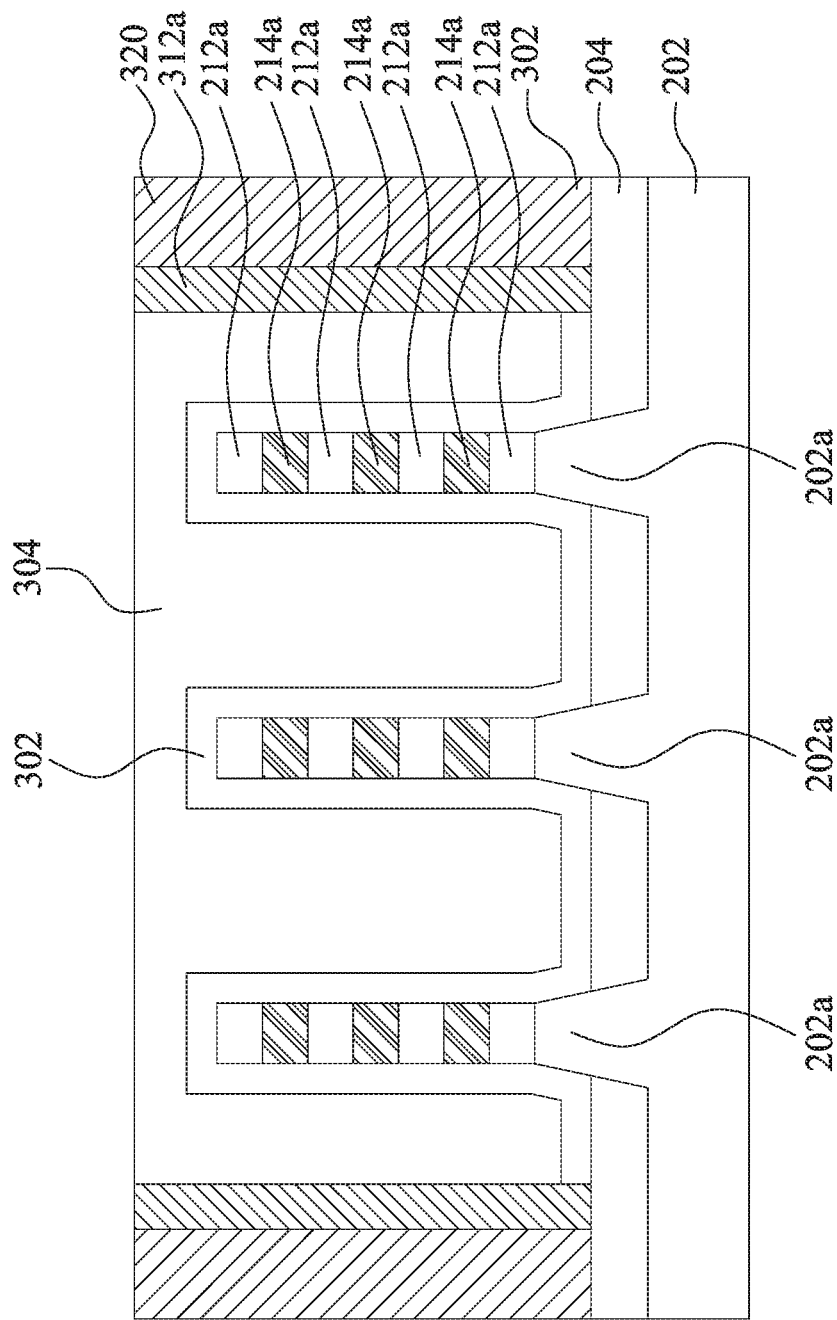

Reference is made to FIGS. 19A-19C. An interlayer dielectric (ILD) layer 320 is blanket deposited on the semiconductor substrate 202, fills in the spaces left between the gate spacers 312a, and between the fin spacers 312b. The epitaxy structures 426 are then covered by the interlayer dielectric layer 320. Further, the interlayer dielectric layer 320 covers up the spacers 312 and the dummy gate structures 310. Then, a planarization process is performed to the interlayer dielectric layer 320. Portions of the interlayer dielectric layer 320 are removed. The interlayer dielectric layer 320 between the gate spacers 312a and between the fin spacers 312b remain. In the planarization process, the hard masks 306 shown in FIGS. 18A-18C of the dummy gate structures 310 and portions of the spacers 312 shown in FIGS. 10A-10C are removed. On top of the epitaxy structures 426, a layer of the interlayer dielectric layer 320 remains.

Figure 20A:
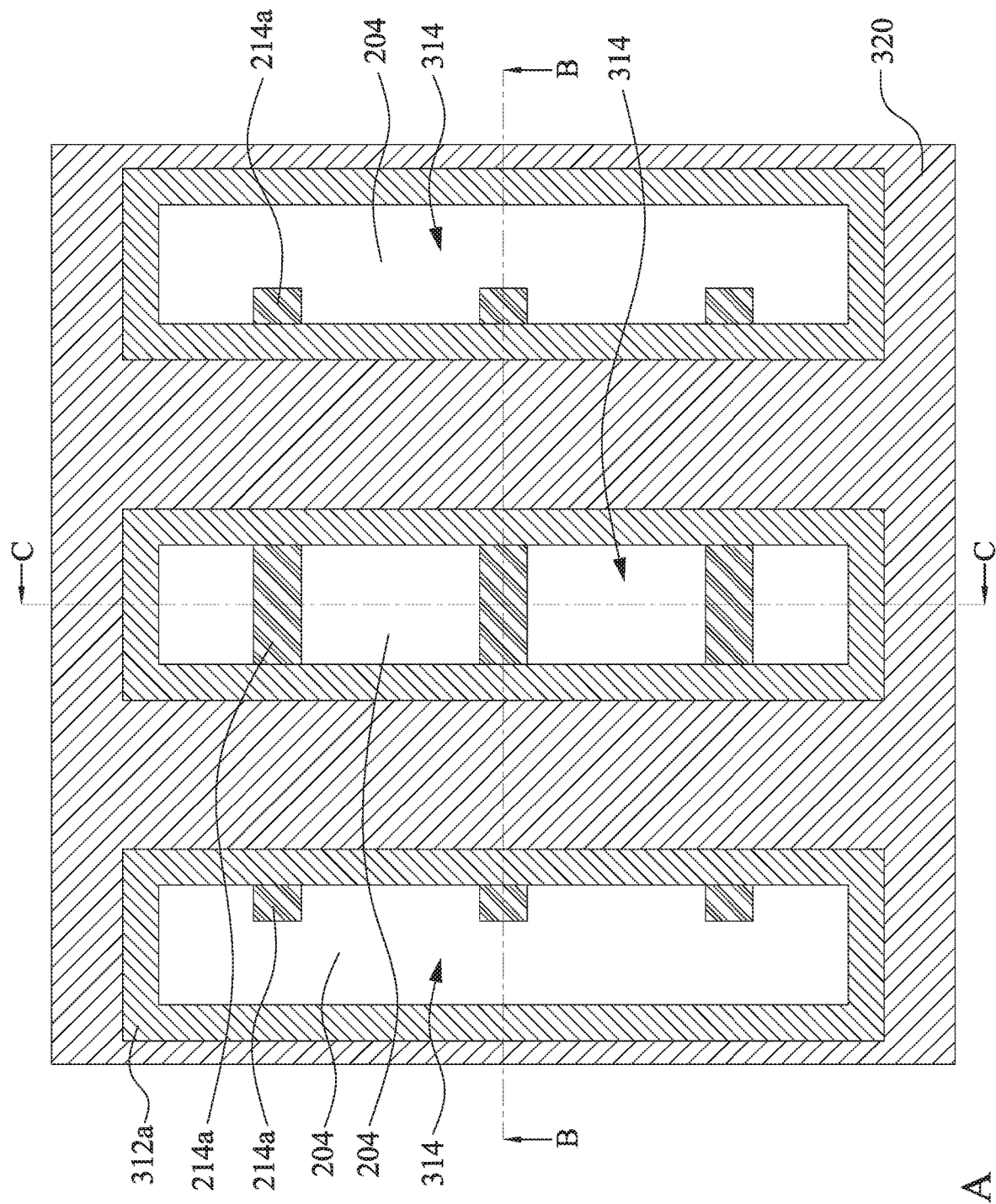
Figure 20B:
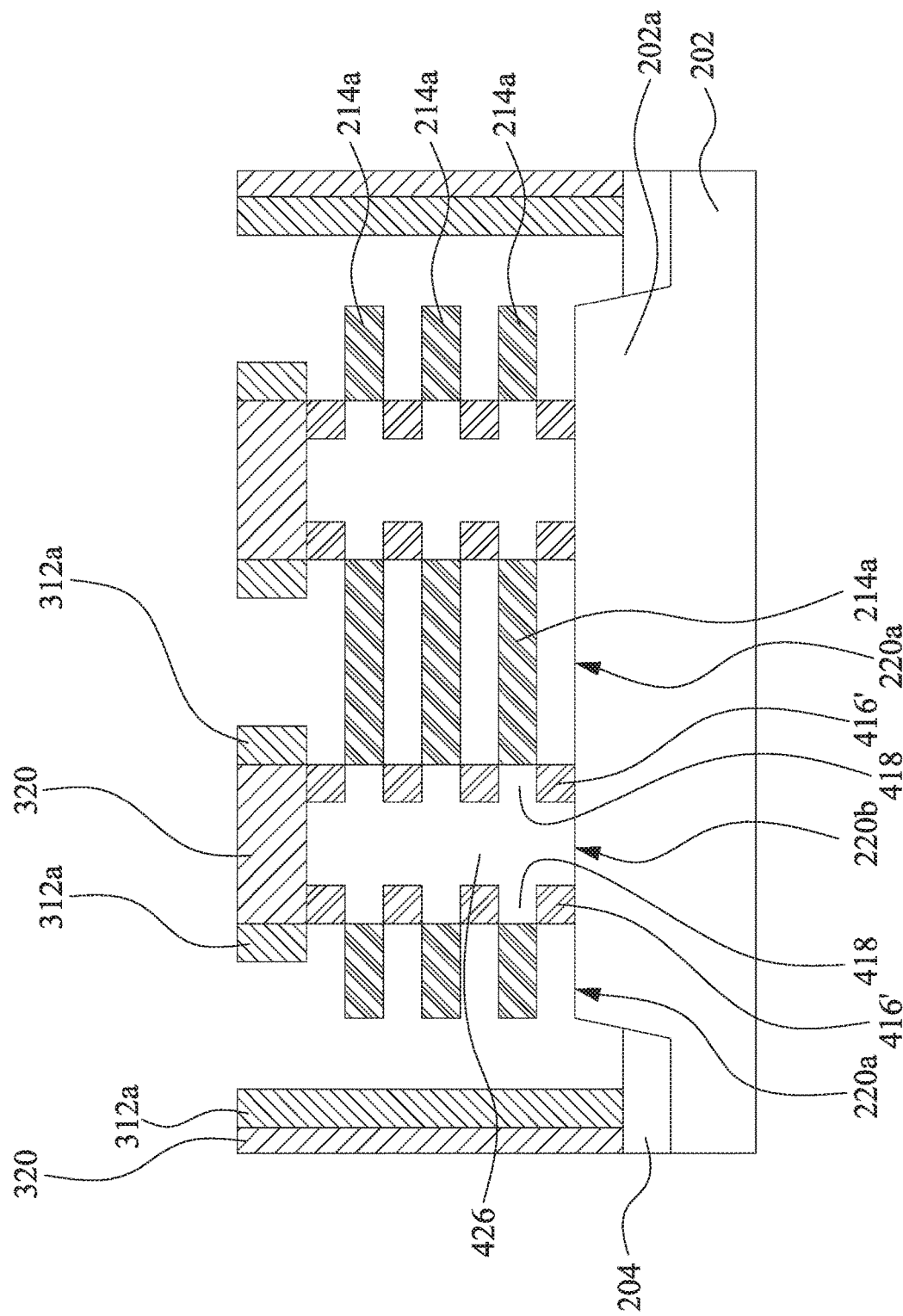
Figure 20C:
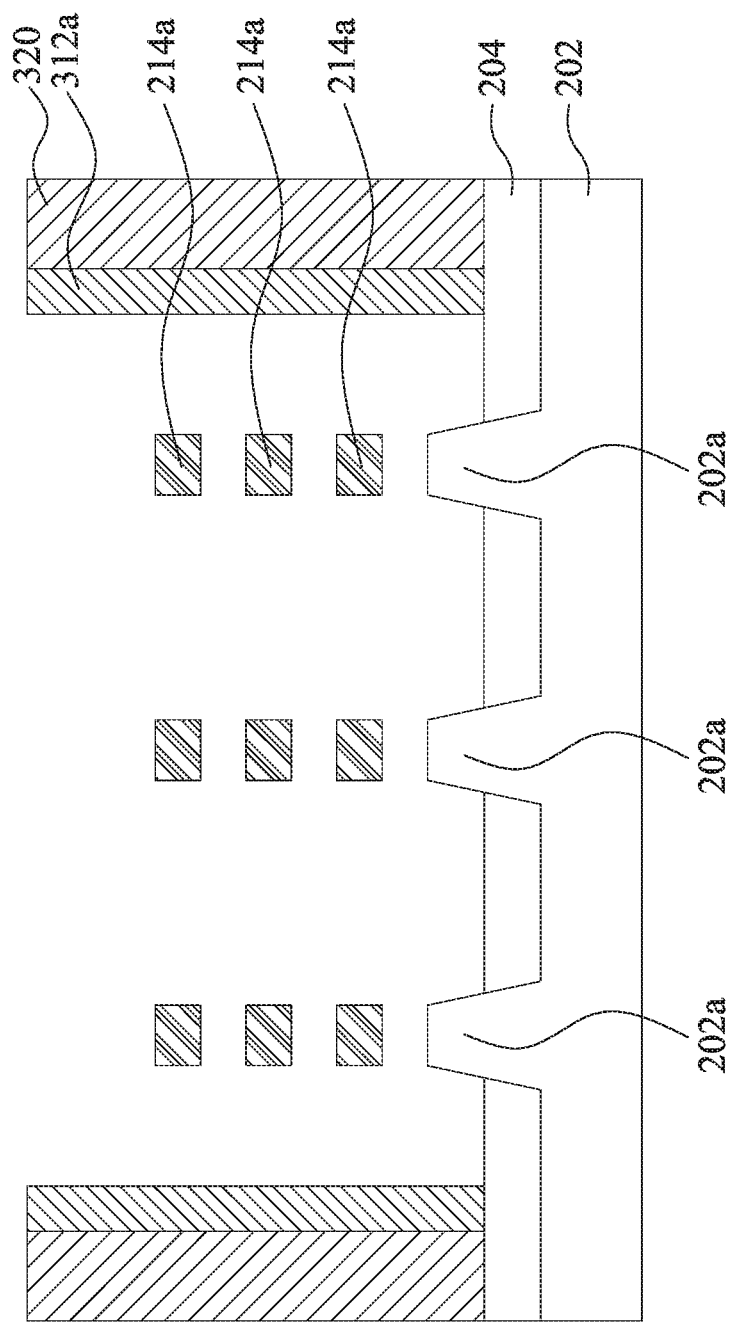

Reference is made to FIGS. 20A-20C. After planarization, the dummy gate structures 310 and the first portions 212a of the sacrificial layers 212 (shown in FIGS. 19B and 19C) are removed to form gate trenches 322, but the spacers 312 and the first portions 214a of the nanowires 214 remain. The dummy gate electrode layer 304 and the gate dielectric layer 302 are removed by suitable process, leaving spaces between the gate spacers 312a. The channel regions 220a of the fins 220 are then exposed from the gate trenches 322, while the epitaxy structures 426 are still under the coverage of the interlayer dielectric layer 320.

Then, after the removal of the dummy gate structures 310, the first portions 212a (shown in FIGS. 19B and 19C) of the sacrificial layers 212 are removed. As shown in FIG. 19A, the first portion 212a of the top sacrificial layer 212 is removed, leaving the underlying nanowire 214 exposed. The first portions 212a of the sacrificial layers 212 between the nanowires 214 are also removed. The first portions 214a of the nanowires 214 are released from the fins 220 and spaced apart from each other. The first portions 214a of the nanowires 214 are not flanked by the sacrificial layer 212 anymore. Furthermore, when the removing the first portions 212a of the sacrificial layers 212, the source/drain spacers 416' avoid unwanted etching on the epitaxy structures 426.

Figure 21A:
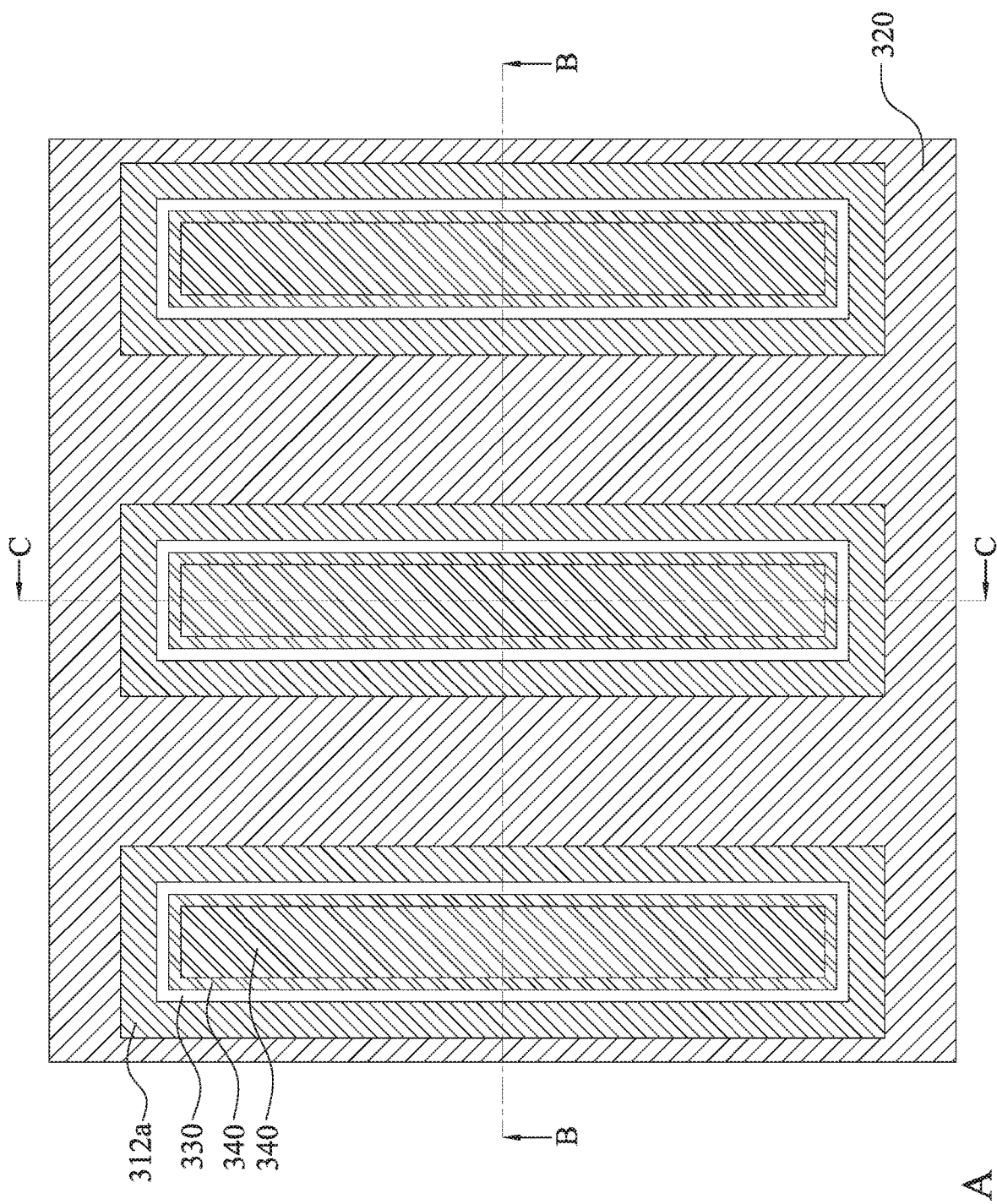
Figure 21B:
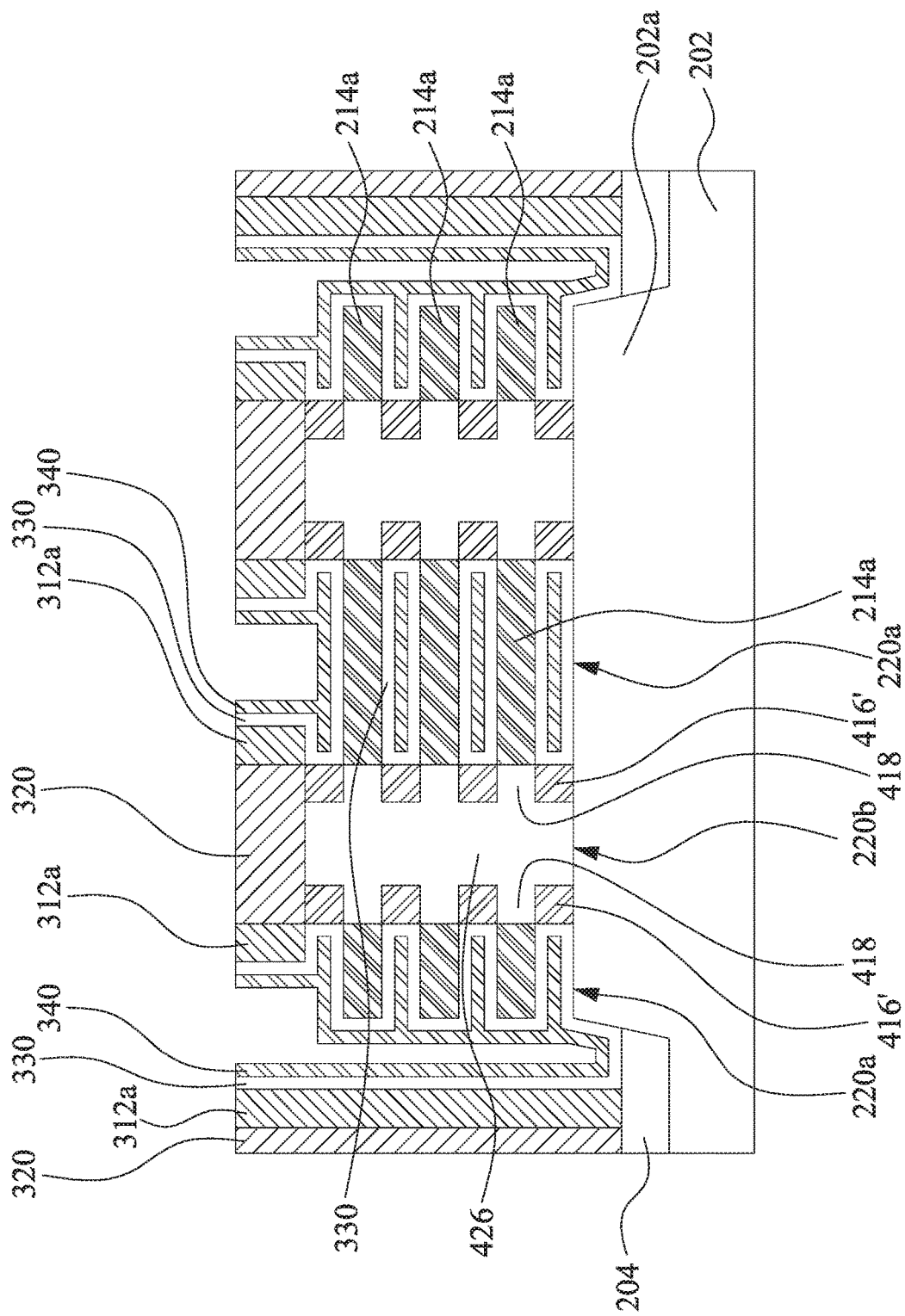
Figure 21C:
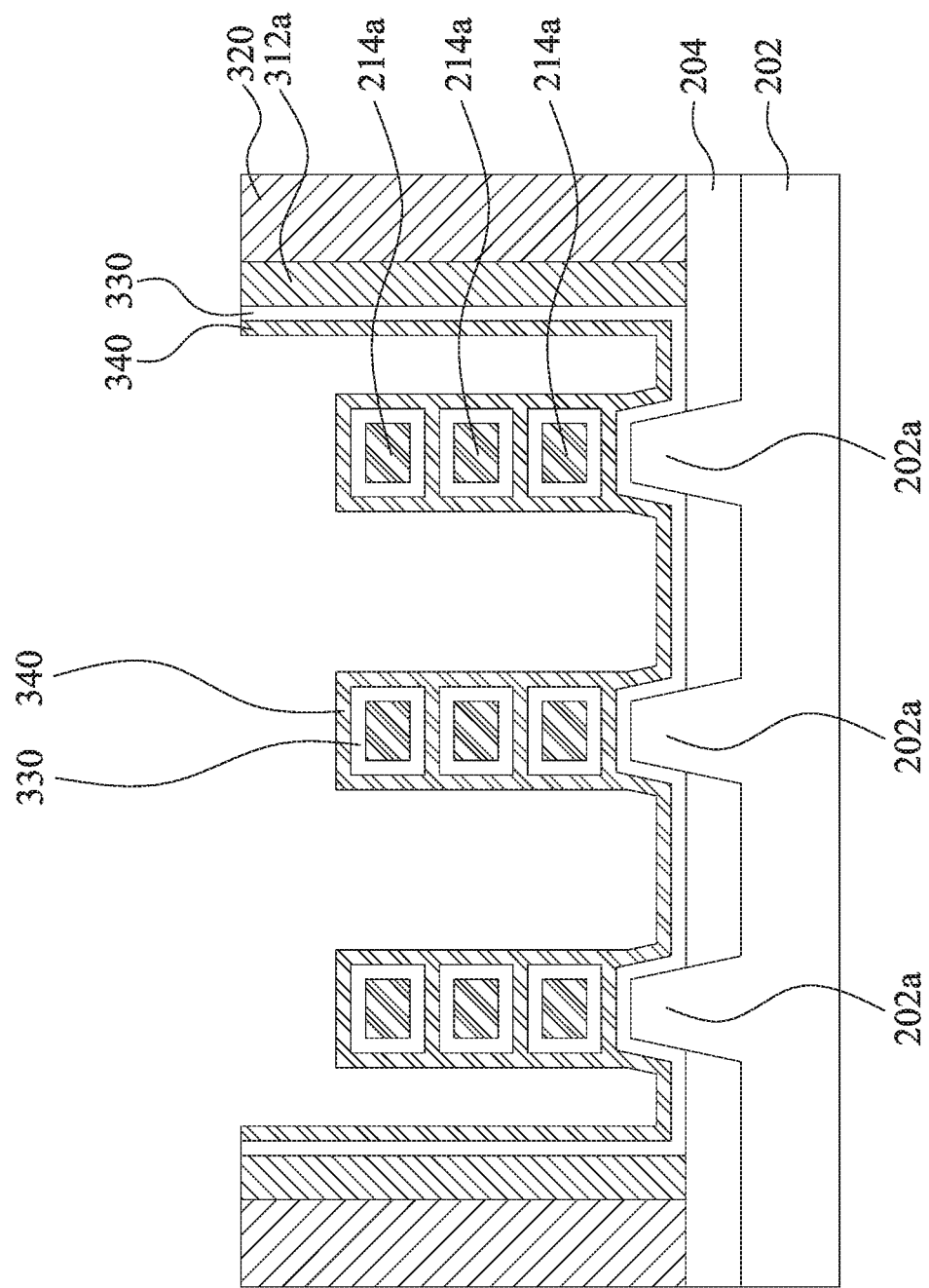

Reference is made to FIGS. 21A-21C. A high-k gate dielectric layer 330 and a work function metal layer 340 are formed on the first portions 214a of the nanowires 214 to fill the gate trench 322. As shown in FIG. 21B, the high-k gate dielectric layer 330 is a thin layer formed on the exposed surfaces including the sidewalls of the gate spacers 312a and first portions 214a of the nanowires 214. Specifically, the high-k gate dielectric layer 330 is in contact with the source/drain spacers 416' and covers the first portions 214a of the nanowires 214. On the other hand, the protruding portions 418 of the epitaxy structures 426 are disposed between the high-k gate dielectric layer 330 and the source/drain spacer 416'. As shown in FIG. 21C, the high-k gate dielectric layer 330 wraps around the first portions 214a of each of the nanowires 214. The surface of the isolation structures 204 and the protruded portions 202a of the semiconductor substrate 202 are also covered by the high-k gate dielectric layer 330. Spaces between the first portions 214a of the nanowires 214 are still left after the deposition of the high-k gate dielectric layer 330. The thickness of the high-k gate dielectric layer 330 may vary depending on the deposition process as well as the composition and number of the high-k gate dielectric layer 330 used. Then, a work function metal layer 340 is formed. The work function metal layer 340 may be disposed over the high-k gate dielectric layer 330, and fill up the spaces between the nanowires 214a replacing the first portions 212a of the sacrificial layers 212.

Figure 22A:
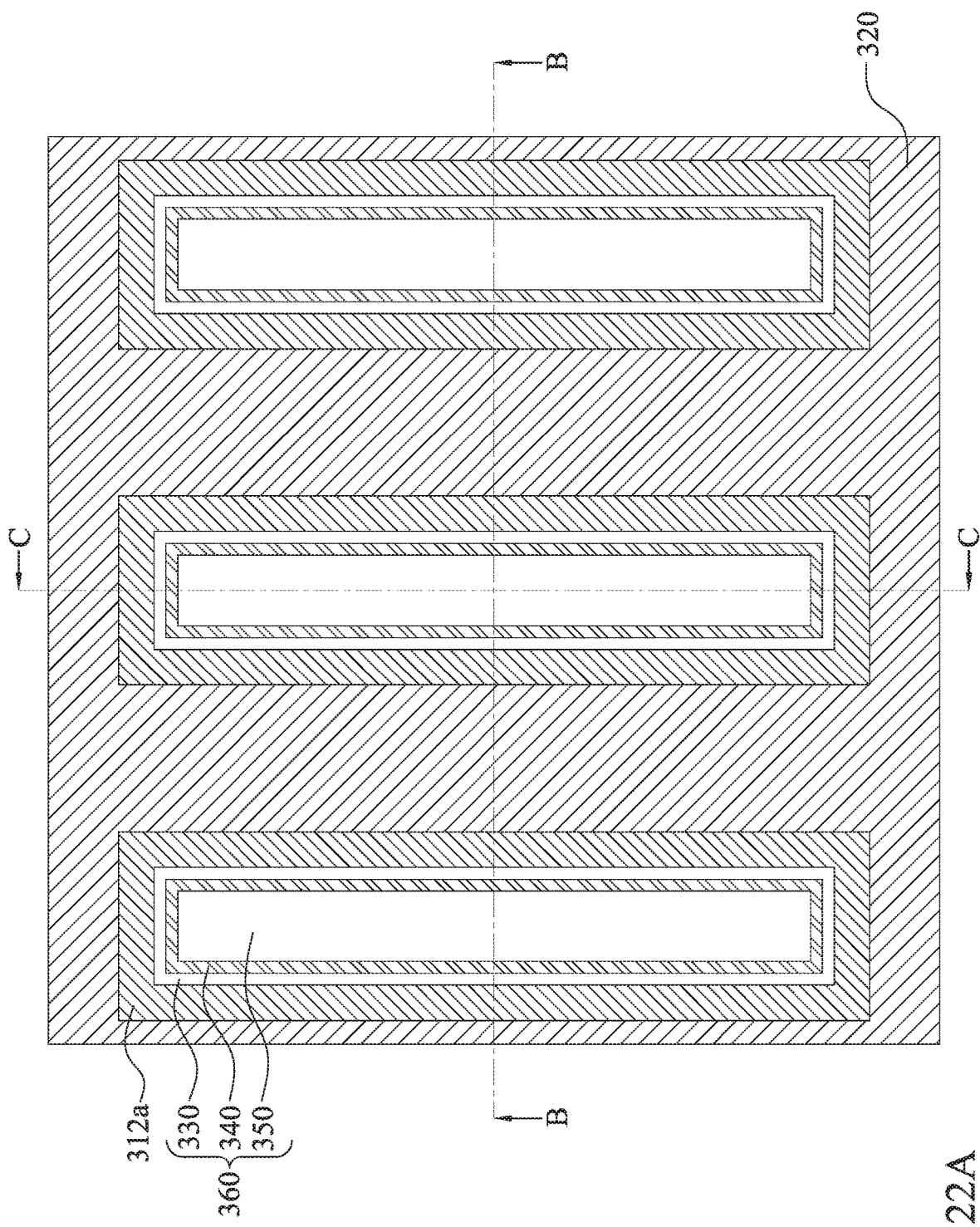
Figure 22B:
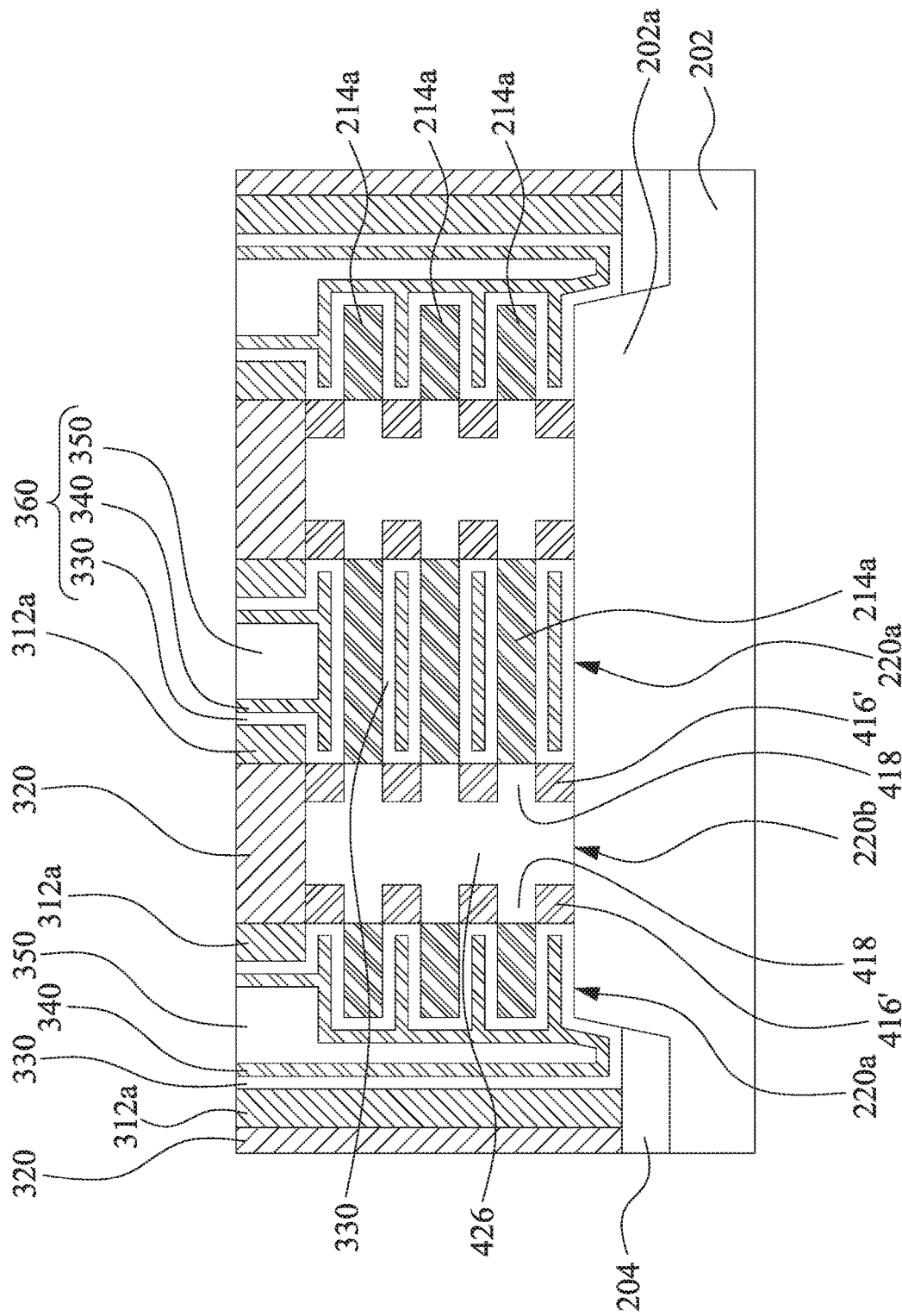

Reference is made to FIGS. 22A-22C. A gate electrode 350 is formed. The gate electrode 350 is deposited over the high-k gate dielectric layer 330 and the work function metal layer 340 to form the gate structures 360. As shown in FIG. 22C, the gate electrode 350 fills up the spaces surrounding the nanowires 214, thereby completely wrapping around the first portions 214a of the nanowires 214. In other words, the nanowires 214 extend through the gate structures 360. The gate stack replaces the dummy gate structures 310. The source/drain spacers 416' are in contact with the gate structures 360, are separated from the first portions 214a of the nanowires 214 by the gate stack, and protrude from the gate structures 360.

Figure 23A:
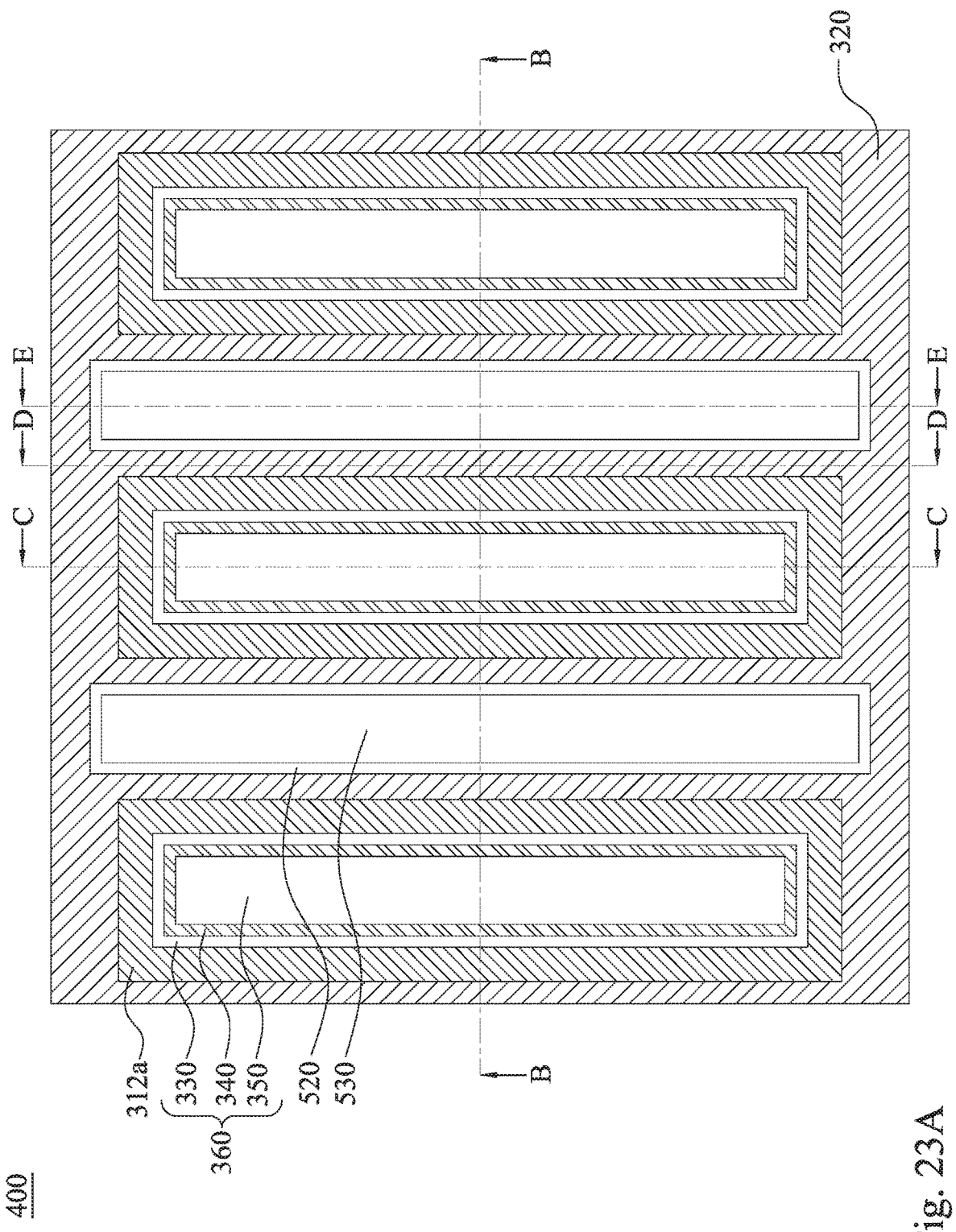
Figure 23B:
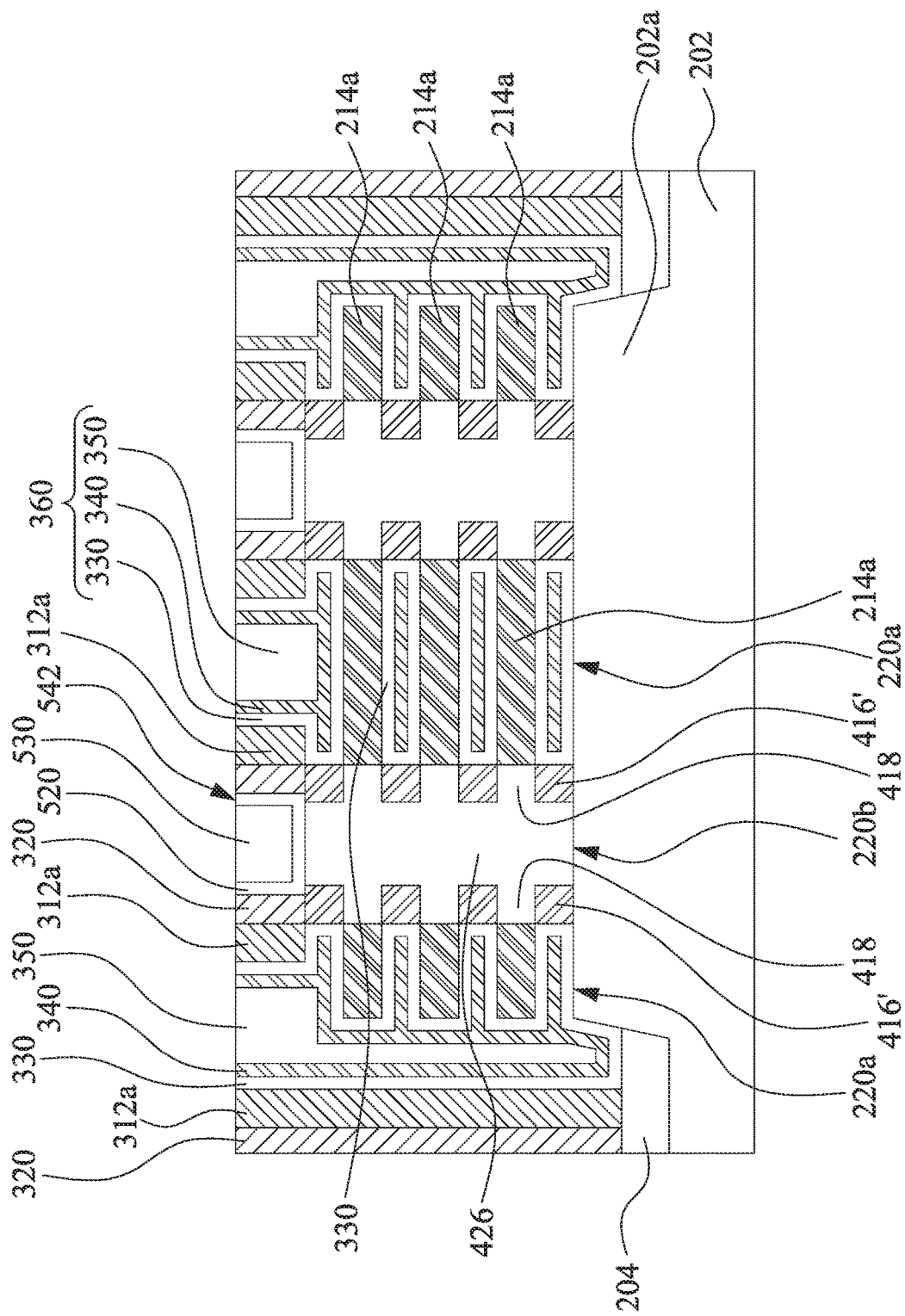
Figure 23C:
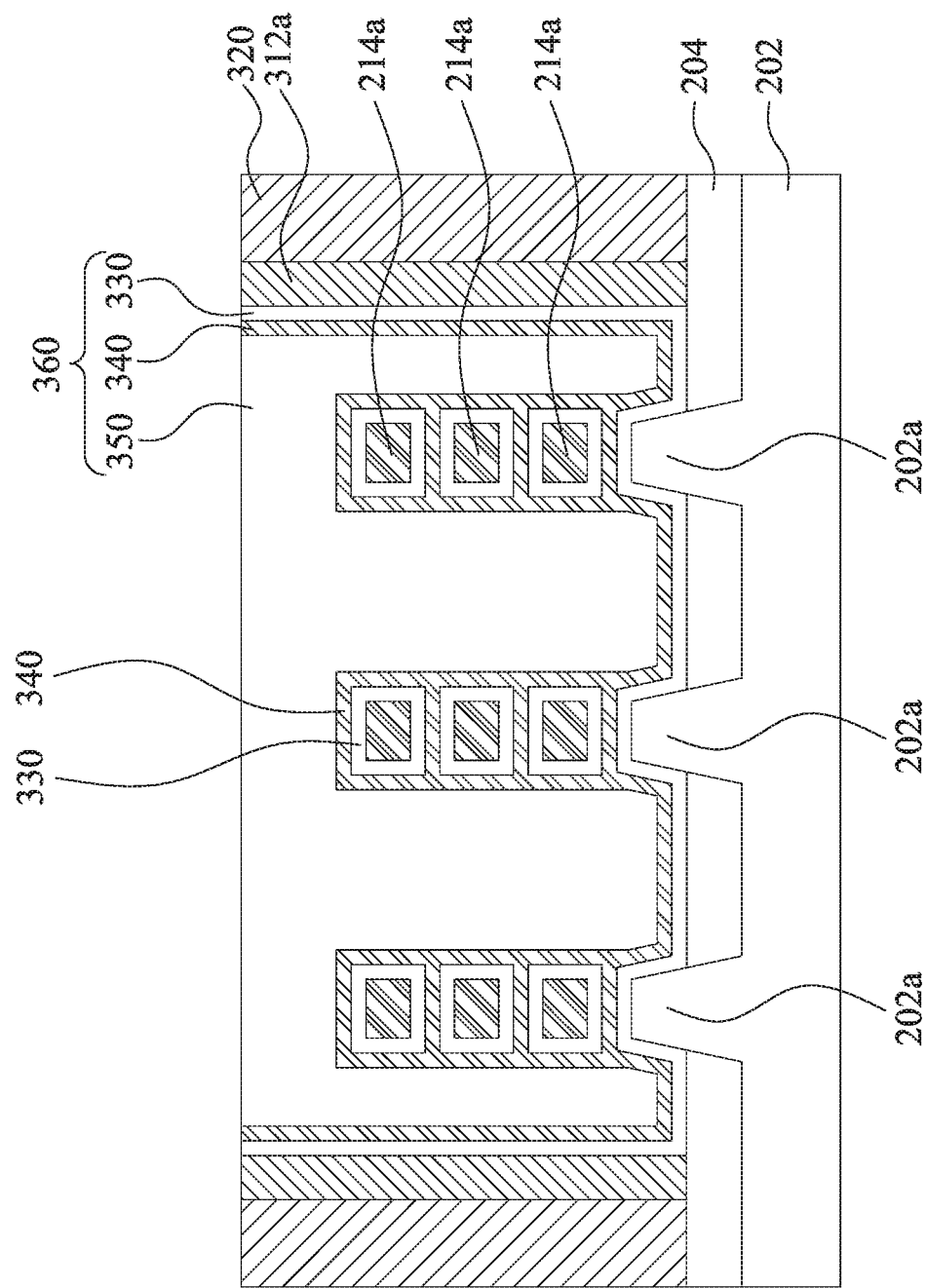
Figure 23D:
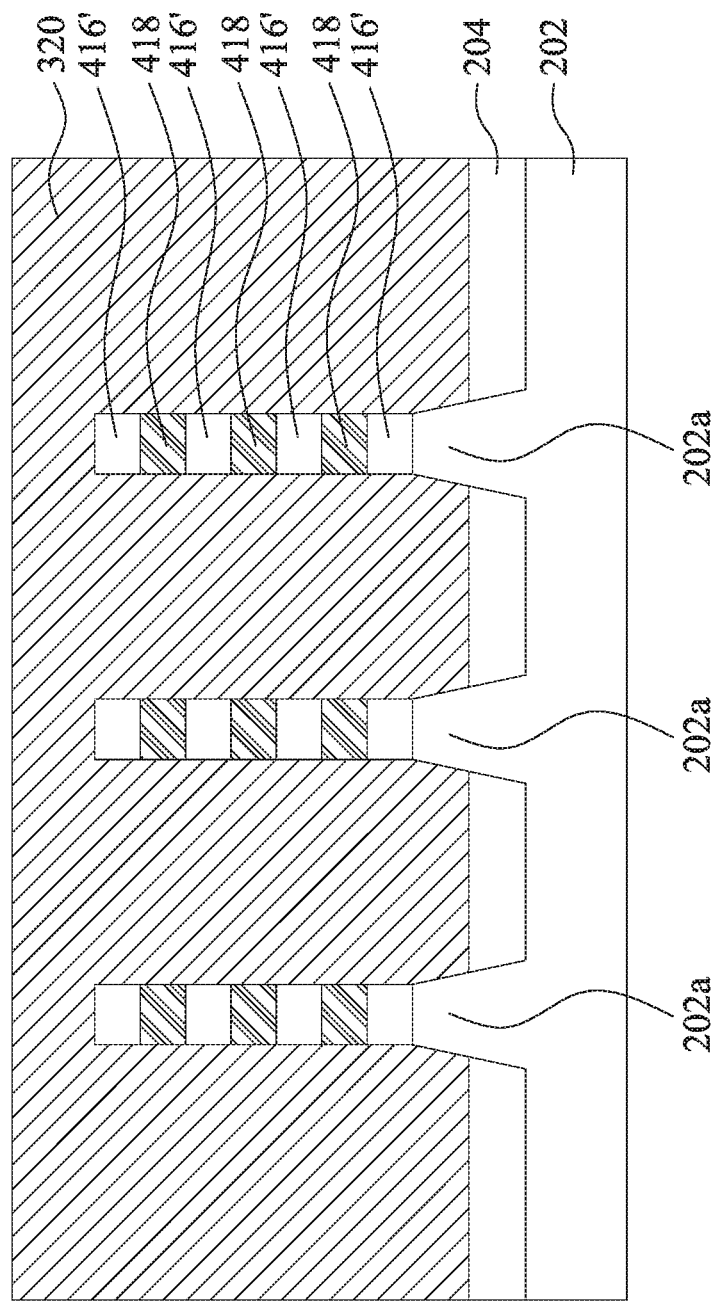
FIGS. 23D and 23E are cross-sectional views along sections D-D and line E-E in FIG. 23A respectively.
Figure 23E:
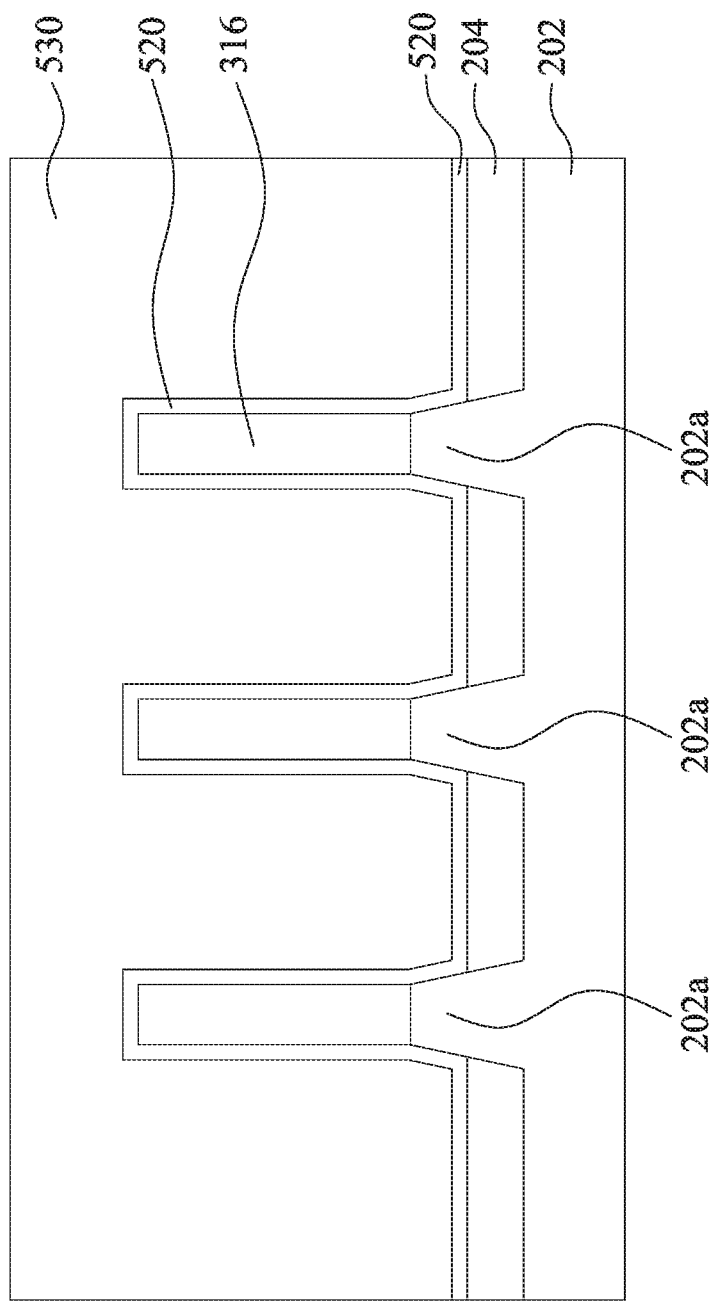

Reference is made to FIGS. 23A-23C. FIG. 23A is a top view of the local semiconductor device 400. FIGS. 23B and 23C are cross-sectional views taken along sections B-B and C-C in FIG. 23A respectively. A plurality of contact openings 542 are formed in the interlayer dielectric layer 320, and the contact openings 542 respectively expose the epitaxy structures 316. A plurality of contacts are respectively formed in the contact openings 542. In some embodiments, the contact includes a work function metal layer 520 and a metal layer 530 formed on the work function metal layer 520. The work function metal layer 520 is deposited in the contact openings 542 and formed on a top surface of the epitaxy structures 426. Subsequently, the metal layer 530 is formed on the work function metal layer 520 and fills in the contact openings 542 shown in FIGS. 23A and 23B.

Reference is made to FIGS. 23D and 23E. FIGS. 23D and 23E are cross-sectional views along sections D-D and line E-E in FIG. 23A respectively. The source/drain spacers 416' are disposed between the protruding portions 418 of the epitaxy structures 426, and surrounded by the gate spacers 312a as shown in FIG. 23D. Furthermore, the epitaxy structures 426 are conformally covered by the work function metal layer 520, and disposed on and in contact with the protruded portions 202a of the semiconductor substrate 202 as shown in FIG. 23E.

According to some embodiments, the epitaxy structures are configured to be separated from the gate structure at least by the source/drain spacers, such that parasitic capacitance between the epitaxy structures and gate under such multi-stack nanowire devices will be reduced.

Embodiments of the semiconductor structures and methods for manufacturing the semiconductor structures are provided. The semiconductor structure may include nanostructures and a gate structure formed around the nanostructures. In addition, a source/drain structure is formed adjacent to the nanostructures and is separated from the gate structure by source/drain spacers. The source/drain spacers may be formed by ALD processes and may help to reduce the parasitic capacitance between the source/drain structure and the gate structure.

In some embodiments, a method for manufacturing a semiconductor structure is provided. The method includes forming a fin structure over a substrate. In addition, the fin structure includes alternately stacked semiconductor material layers and sacrificial layers. The method further includes forming a dummy gate structure across the fin structure and recessing the fin structure not covered by the dummy gate structure to form an opening. The method further includes forming first source/drain spacers on sidewalls of the sacrificial layers exposed by the opening by performing a first atomic layer deposition (ALD) process and forming source/drain structure in the opening. The method further includes removing the dummy gate structure and the sacrificial layers to expose the semiconductor material layers and forming a gate structure wrapping around the semiconductor material layers.

In some embodiments, a method for manufacturing a semiconductor structure is provided. The method includes alternately stacking semiconductor material layers and sacrificial layers over a substrate and patterning the semiconductor material layers and the sacrificial layers to form a fin structure over the substrate. The method further includes forming a dummy gate structure across the fin structure and forming a source/drain opening in the fin structure adjacent to the dummy gate structure. The method further includes forming source/drain spacers on sidewalls of the sacrificial layers exposed by the opening and forming source/drain structure in the opening. In addition, the source/drain structure comprises protruding portions extending between the source/drain spacers. The method further includes removing the dummy gate structure and the sacrificial layers to from nanostructures from the semiconductor material layers and forming a gate structure around the nanostructures.

In some embodiments, a semiconductor structure is provided. The semiconductor structure includes a substrate and nanostructures formed over the substrate. The semiconductor structure further includes a gate structure wrapping around the nanostructures and a gate spacer formed on a sidewall of the gate structure. The semiconductor structure further includes a source/drain structure connected to the nanostructures and source/drain spacers separating the source/drain structure and the gate structure. In addition, the gate structure extends under the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a fin structure over a substrate, wherein the fin structure comprises alternately stacked semiconductor material layers and sacrificial layers;
forming a dummy gate structure across the fin structure;
recessing the fin structure not covered by the dummy gate structure to form an opening;
forming first source/drain spacers on sidewalls of the sacrificial layers exposed by the opening by performing a first atomic layer deposition (ALD) process;
forming source/drain structure in the opening;
forming an inter layer dielectric layer over the source/drain structure, wherein the inter layer dielectric layer is in direct contact with a top surface of the source/drain spacers;
removing the dummy gate structure and the sacrificial layers to expose the semiconductor material layers; and
forming a gate structure wrapping around the semiconductor material layers.

2. The method for manufacturing the semiconductor structure as claimed in claim 1, further comprising:
forming second source/drain spacers on the first source/drain spacers by performing a second ALD process.

3. The method for manufacturing the semiconductor structure as claimed in claim 1, wherein the source/drain structure has protruding portions extending between the first source/drain spacers and in direct contact with sidewalls of the semiconductor material layers.

4. The method for manufacturing the semiconductor structure as claimed in claim 1, further comprising:
forming a gate spacer on a sidewall of the dummy gate structure,
wherein the gate structure comprises extending portions formed under the gate spacer.

5. The method for manufacturing the semiconductor structure as claimed in claim 4, wherein the extending portions of the gate structure are in direct contact with the first source/drain spacers.

6. The method for manufacturing the semiconductor structure as claimed in claim 1, further comprising:
forming a contact through the inter layer dielectric layer to land on the source/drain structure and the first source/drain spacers.

7. The method for manufacturing the semiconductor structure as claimed in claim 4, wherein the extending portions of the gate structure vertically overlaps the gate spacer.

8. A method for manufacturing a semiconductor structure, comprising:
alternately stacking semiconductor material layers and sacrificial layers over a substrate;
patterning the semiconductor material layers and the sacrificial layers to form a fin structure over the substrate;
forming a dummy gate structure across the fin structure;
forming a gate spacer on a sidewall of the dummy gate structure;
forming a source/drain opening in the fin structure adjacent to the dummy gate structure;
forming source/drain spacers on sidewalls of the sacrificial layers exposed by the source/drain opening;
forming source/drain structure in the source/drain opening, wherein the source/drain structure comprises protruding portions vertically sandwiched by the source/drain spacers;
removing the dummy gate structure and the sacrificial layers to form nanostructures with the semiconductor material layers; and
forming a gate structure around the nanostructures, wherein the gate structure comprises an extending portion being directly below the gate spacers and being in direct contact with the source/drain spacers.

9. The method for manufacturing the semiconductor structure as claimed in claim 8, wherein the source/drain spacers are made of multiple oxide layers.

10. The method for manufacturing the semiconductor structure as claimed in claim 9, wherein the multiple oxide layers are formed by performing multiple ALD processes.

11. The method for manufacturing the semiconductor structure as claimed in claim 8, wherein the source/drain spacers are formed by performing 20 cycles to 200 cycles of an ALD process.

12. The method for manufacturing the semiconductor structure as claimed in claim 8, further comprising:
forming an inter layer dielectric layer over the source/drain structure; and
forming a contact through the inter layer dielectric layer, wherein the inter layer dielectric layer is in direct contact with a top surface of the source/drain spacers.

13. The method for manufacturing the semiconductor structure as claimed in claim 8, wherein portions of the source/drain structure extending under the source/drain spacers.

14. The method for manufacturing the semiconductor structure as claimed in claim 8, wherein the extending portions of the gate structure is in direct contact with a bottom surface of the gate spacer.

15. A method for manufacturing a semiconductor structure, comprising:
alternately stacking semiconductor material layers and sacrificial layers over a substrate;
patterning the semiconductor material layers and the sacrificial layers to form a fin structure over the substrate;
removing a portion of the fin structure to form a source/drain opening in the fin structure;
forming source/drain spacers on sidewalls of the sacrificial layers in the source/drain opening;
forming source/drain structure in the source/drain spacers opening;
removing the sacrificial layers of the fin structure to form nanostructures with the semiconductor material layers;
forming a gate structure wrapping around the nanostructures; and
forming a contact over the source/drain structure,
wherein the contact partially overlaps the source/drain spacers and is in direct contact with the source/drain spacers.

16. The method for manufacturing the semiconductor structure as claimed in claim 15, wherein an interface between the source/drain spacers and the gate structure is substantially aligned with an interface between the source/drain structure and the nanostructures.

17. The method for manufacturing the semiconductor structure as claimed in claim 15, further comprising:
forming an interlayer dielectric layer over the source/drain structure,
wherein the interlayer dielectric layer in direct contact with the source/drain spacers.

18. The method for manufacturing the semiconductor structure as claimed in claim 15, wherein the source/drain spacers are made of multiple oxide layers.

19. The method for manufacturing the semiconductor structure as claimed in claim 15, further comprising:

forming gate spacers, wherein the gate structure comprises an extending portion extending below the gate spacers and in direct contact with the source/drain spacers.

20. The method for manufacturing the semiconductor structure as claimed in claim 8, wherein forming the source/drain spacers on the sidewalls of the sacrificial layers exposed by the source/drain opening further comprises:

forming a first oxide layer on the sidewalls of the sacrificial layers exposed by the source/drain opening, wherein the first oxide layer has a first sidewall in direct contact with the sacrificial layers; and forming a second oxide layer covering a second sidewall of the first oxide layer opposite to the first sidewall, wherein the source/drain spacers are formed of the first oxide layer and the second oxide layer.

\* \* \* \* \*